US008252504B2

(12) United States Patent
Harada et al.

(10) Patent No.: US 8,252,504 B2
(45) Date of Patent: Aug. 28, 2012

(54) POLYMER, RESIST COMPOSITION, AND PATTERNING PROCESS

(75) Inventors: Yuji Harada, Joetsu (JP); Jun Hatakeyama, Joetsu (JP); Kazunori Maeda, Joetsu (JP); Tomohiro Kobayashi, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 152 days.

(21) Appl. No.: 12/371,455

(22) Filed: Feb. 13, 2009

(65) Prior Publication Data

US 2009/0208873 A1  Aug. 20, 2009

(30) Foreign Application Priority Data

Feb. 14, 2008  (JP) ................................. 2008-032921

(51) Int. Cl.
*G03F 7/039* (2006.01)
*G03F 7/20* (2006.01)
*G03F 7/30* (2006.01)
*G03F 7/38* (2006.01)
*G03F 7/11* (2006.01)

(52) U.S. Cl. ..................... 430/270.1; 430/907; 430/910; 430/326; 430/330; 430/273.1

(58) Field of Classification Search .................. None
See application file for complete search history.

(56) References Cited

U.S. PATENT DOCUMENTS

| | | | |
|---|---|---|---|
| 3,438,946 A | 4/1969 | Lichstein et al. | |
| 5,541,037 A | 7/1996 | Hatakeyama et al. | |
| 5,714,625 A | 2/1998 | Hada et al. | |
| 6,004,724 A | 12/1999 | Yamato et al. | |
| 6,063,953 A | 5/2000 | Hada et al. | |
| 6,261,738 B1 | 7/2001 | Asakura et al. | |
| 6,312,867 B1 | 11/2001 | Kinsho et al. | |
| 6,512,020 B1 | 1/2003 | Asakura et al. | |
| 6,869,744 B2 | 3/2005 | Hatakeyama | |
| 6,916,591 B2 | 7/2005 | Ohsawa et al. | |
| 7,399,577 B2 | 7/2008 | Yamato et al. | |
| 7,622,242 B2 * | 11/2009 | Hatakeyama et al. | 430/270.1 |
| 2003/0078352 A1 * | 4/2003 | Miyazawa et al. | 526/245 |
| 2003/0224283 A1 | 12/2003 | Allen et al. | |
| 2005/0147920 A1 * | 7/2005 | Lin et al. | 430/311 |
| 2006/0008736 A1 | 1/2006 | Kanda et al. | |
| 2006/0183051 A1 * | 8/2006 | Takeda et al. | 430/270.1 |
| 2007/0179309 A1 | 8/2007 | Hasegawa et al. | |
| 2007/0218401 A1 * | 9/2007 | Ando et al. | 430/270.1 |

FOREIGN PATENT DOCUMENTS

| | | |
|---|---|---|
| JP | 60-38821 A | 2/1985 |
| JP | 62-62520 A | 3/1987 |
| JP | 62-62521 A | 3/1987 |
| JP | 6-273926 A | 9/1994 |
| JP | 9-95479 A | 4/1997 |
| JP | 9-208554 A | 8/1997 |
| JP | 9-230588 A | 9/1997 |
| JP | 9-246173 A | 9/1997 |
| JP | 9-301948 A | 11/1997 |
| JP | 2803549 B2 | 7/1998 |
| JP | 2906999 B2 | 4/1999 |
| JP | 11-194506 A | 7/1999 |
| JP | 2000-314956 | 11/2000 |
| JP | 2000-336121 A | 12/2000 |
| JP | 2002-99090 A | 4/2002 |
| JP | 2006-48029 A | 2/2006 |
| JP | 2006-335916 A | 12/2006 |
| JP | 2007-187887 A | 7/2007 |
| WO | WO-00/08249 A1 | 2/2000 |
| WO | WO-2004/074242 A2 | 9/2004 |

OTHER PUBLICATIONS

B.J. Lin et al., Semiconductor Foundry, Lithography, and Partners, Proceedings of SPIE, vol. 4690, xxix, 2002.
Owa et al., "Immersion lithography; its potential performance and issues" Optical Microlithography XVI, Proceedings of SPIE, vol. 5040, p. 724, 2003.
Hirayama., "Resist and Cover Material Investigation for Immersion Lithography", 2nd Immersion Workshop, Jul. 11, 2003.
Allen et al., "Design of Protective Topcoats for Immersion Lithography", Journal of Photopolymer Science and Technology, vol. 18, No. 5, 2005, pp. 615-619.
Maruse et al., "Neuer Begriff und ein Nano-Hybrid System fur Hydrophobie", XXIV FATIPEC Congress Book, vol. 1 B, pp. 15-38, 1997.
Maruse et al., "Characterization of molecular interfaces in hydrophobic systems", Progress in Organic Coatings, vol. 31, 1997, pp. 97-104.
Shirota et al., "Development of non-topcoat resist polymers for 193-nm immersion lithography", Process of SPIE, vol. 6519, p. 651905-1-11, 2007.
Arimitsu et al., "Sensitivity Enhancement of Chemical-Amplification-Type Photoimaging Materials by Acetoacetic Acid Derivatives", Journal of Photopolymer Science and Technology, vol. 8, No. 1, 1995, pp. 43-44.
Kudo et al., "Enhancement of the Sensitivity of Chemical-Amplification-Type Photoimaging Materials by β-Tosyloxyketone Acetals", Journal of Photopolymer Science and Technology, vol. 8, No. 1, 1995, pp. 45-46.
Arimitsu et al., "Effect of Phenolic Hydroxyl Residues on the Improvement of Acid-Proliferation-Type Photoimaging Materials", Journal of Photopolymer Science and Technology, vol. 9, No. 1, 1996, pp. 29-30.
Japanese Office Action dated Jul. 11, 2012 issued in corresponding Japanese Patent Application No. 2008-032921.

* cited by examiner

*Primary Examiner* — Sin J. Lee
(74) *Attorney, Agent, or Firm* — Birch, Stewart, Kolasch & Birch, LLP

(57) ABSTRACT

A polymer obtained through copolymerization of a monomer having a hexafluoroalcohol pendant whose hydroxyl moiety has been protected and a monomer having an acid labile group is useful as an additive to a photoresist composition for immersion lithography. When processed by immersion lithography, the resist composition exhibits good water repellency and water slip and produces few development defects.

9 Claims, No Drawings

POLYMER, RESIST COMPOSITION, AND PATTERNING PROCESS

CROSS-REFERENCE TO RELATED APPLICATION

This non-provisional application claims priority under 35 U.S.C. §119(a) on Patent Application No. 2008-032921 filed in Japan on Feb. 14, 2008, the entire contents of which are hereby incorporated by reference.

TECHNICAL FIELD

This invention generally relates to a photolithography process for the microfabrication of semiconductor devices, and particularly to an immersion photolithography process involving directing ArF excimer laser radiation having a wavelength of 193 nm from a projection lens toward a substrate, with a liquid (e.g., water) intervening between the lens and the substrate. More particularly, it relates to a resist composition for use in the lithography process, a polymer as an additive to the resist composition, and a process for forming a pattern using the same.

BACKGROUND ART

In the recent drive for higher integration and operating speeds in LSI devices, the pattern rule is made drastically finer. The background supporting such a rapid advance is a reduced wavelength of the light source for exposure. The change-over from i-line (365 nm) of a mercury lamp to shorter wavelength KrF laser (248 nm) enabled mass-scale production of dynamic random access memories (DRAM) with an integration degree of 64 MB (processing feature size $\leqq 0.25$ μm). To establish the micropatterning technology necessary for the fabrication of DRAM with an integration degree of 256 MB and 1 GB or more, the lithography using ArF excimer laser (193 nm) is under active investigation. The ArF excimer laser lithography, combined with a high NA lens (NA$\geqq 0.9$), is considered to comply with 65-nm node devices. For the fabrication of next 45-nm node devices, the $F_2$ lithography of 157 nm wavelength became a candidate. However, because of many problems including a cost and a shortage of resist performance, the employment of $F_2$ lithography was postponed. ArF immersion lithography was proposed as a substitute for the $F_2$ lithography. Efforts have been made for the early introduction of ArF immersion lithography (see Proc. SPIE, Vol. 4690, xxix, 2002).

In the ArF immersion lithography, the space between the projection lens and the wafer is filled with water and ArF excimer laser is irradiated through the water. Since water has a refractive index of 1.44 at 193 nm, pattern formation is possible even using a lens with NA of 1.0 or greater. Theoretically, it is possible to increase the NA to 1.44. The resolution is improved by an increment of NA. A combination of a lens having NA of at least 1.2 with ultra-high resolution technology suggests a way to the 45-nm node (see Proc. SPIE, Vol. 5040, p 724, 2003).

Several problems arise when a resist film is exposed in the presence of water. For example, the acid once generated from a photoacid generator and a basic compound added to the resist can be partially leached in water. As a result, pattern profile changes and pattern collapse can occur. It is also pointed out that water droplets remaining on the resist film, though in a minute volume, can penetrate into the resist film to generate defects.

These drawbacks of the ArF immersion lithography may be overcome by providing a protective coating between the resist film and water to prevent resist components from being leached out and water from penetrating into the resist film (see the 2nd Immersion Workshop, Resist and Cover Material Investigation for Immersion Lithography, 2003).

With respect to the protective coating on the photoresist film, a typical antireflective coating on resist (ARCOR) process is disclosed in JP-A 62-62520, JP-A 62-62521, and JP-A 60-38821. The ARCs are made of fluorinated compounds having a low refractive index, such as perfluoroalkyl polyethers and perfluoroalkyl amines. Since these fluorinated compounds are less compatible with organic substances, fluorocarbon solvents are used in coating and stripping of protective coatings, raising environmental and cost issues.

Other resist protective coating materials under investigation include water-soluble or alkali-soluble materials. See, for example, JP-A 6-273926, Japanese Patent No. 2,803,549, and J. Photopolymer Sci. and Technol., Vol. 18, No. 5, p 615, 2005. Since the alkali-soluble resist protective coating material is strippable with an alkaline developer, it eliminates a need for an extra stripping unit and offers a great cost saving. From this standpoint, great efforts have been devoted to develop water-insoluble, alkali-soluble resist protective coating materials, for example, methacrylate resins having fluorinated alcohol on side chain.

Effective means for preventing resist components from being leached out and water from penetrating into the resist film without a need for a protective coating material is proposed in JP-A 2006-48029 as adding an alkali-soluble, hydrophobic compound to the resist material. This method achieves equivalent effects to the use of resist protective coating material because the hydrophobic compound is segregated at the resist surface during resist film formation. Additionally, this method is economically advantageous over the use of a resist protective film because steps of forming and stripping the protective film are unnecessary.

Required for the resist protective coating materials or hydrophobic resist additives are not only the ability to prevent the generated acid and basic compound in the photoresist film from being leached out in water and to prevent water from penetrating into the resist film, but also such properties as water repellency and water slip. Of these properties, water repellency is improved by introducing fluorine into the resin and water slip is improved by combining water repellent groups of different species to form a micro-domain structure, as reported, for example, in XXIV FATIPEC Congress Book, Vol. B, p 15 (1997) and Progress in Organic Coatings, 31, p 97 (1997).

Although the introduction of fluorine into resins is effective not only for improving water repellency, but also for improving water slip properties as demonstrated by sliding angle, receding contact angle or the like, excessive introduction of fluorine results in resins with a greater surface contact angle following alkaline development, which in turn invites an increased likelihood that development defects so called "blob defects" occur. Use of a more hydrophilic resist protective coating controls blob defects, but provides a smaller receding contact angle, which interferes with high-speed scanning and allows water droplets to remain after scanning, giving rise to defects known as water marks. There exists a demand for a resist protective coating material and a hydrophobic resist additive which have sufficient properties to prevent resist components from being leached out and to become a barrier to water, while maintaining a greater receding contact angle.

One exemplary polymer exhibiting high water slip is a fluorinated ring-closing polymerization polymer having hexafluoroalcohol pendants. It is reported in Proc. SPIE, Vol. 6519, p 651905 (2007) that this polymer is further improved in water slip by protecting hydroxyl groups on its side chains with acid labile groups. Use of the polymer having hydroxyl groups protected as a resist additive provides higher water slip than a topcoat of a similar polymer having hydroxyl groups unprotected.

The materials discussed above are needed not only in the ArF immersion lithography, but also in the electron beam (EB) lithography. The resist undergoes changes in sensitivity during EB lithography for mask image writing or the like. The resist sensitivity changes due to evaporation of the acid generated during image writing, evaporation of vinyl ether produced by deprotection of acetal protective groups, or the like, as discussed in JP-A 2002-99090. It is proposed to suppress resist sensitivity variation by applying a protective coating material or a hydrophobic additive-containing resist material to form a barrier film on top of a resist layer.

SUMMARY OF THE INVENTION

An object of the invention is to provide a resist composition which has improved water repellency and water slip and suffer from few development defects; an additive polymer capable of attaining such functions; and a pattern forming process using the composition.

The inventors have discovered that a polymer obtained through copolymerization of a monomer having a hexafluoroalcohol pendant whose hydroxyl moiety has been protected and a tertiary ester monomer is useful as an additive to a photoresist composition for immersion lithography.

Accordingly, the present invention provides a polymer, resist composition, and pattern forming process, as defined below.

One embodiment of the invention is a polymer (A) comprising repeat units of the general formulae (1), (2) and (3) and having a weight average molecular weight of 1,000 to 500,000.

(A)

(1)

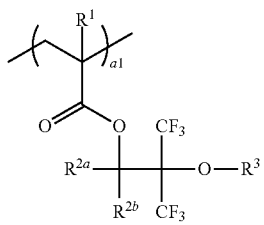

(2)

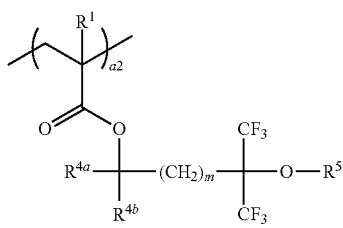

(3)

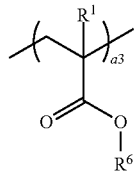

Herein $R^1$ is hydrogen, fluorine, or straight or branched $C_1$-$C_4$ alkyl or fluoroalkyl, $R^{2a}$ and $R^{2b}$ are hydrogen or straight, branched or cyclic $C_1$-$C_{10}$ alkyl, $R^3$ is straight, branched or cyclic $C_1$-$C_{10}$ alkyl or an acid labile group, $R^{4a}$ and $R^{4b}$ are hydrogen or straight, branched or cyclic $C_1$-$C_{10}$ alkyl, $R^5$ is hydrogen, straight, branched or cyclic $C_1$-$C_{10}$ alkyl, or an acid labile group, $R^6$ is an acid labile group, $R^{2a}$ and $R^{2b}$, and $R^{4a}$ and $R^{4b}$ may bond together to form a non-aromatic ring of 1 to 20 carbon atoms with the carbon atom to which they are attached, m is an integer of 1 to 6, a1, a2 and a3 are numbers satisfying $0 \leq a1 \leq 1$, $0 \leq a2 < 1$, $0 \leq a3 < 1$, $0 < a2+a3 \leq 0.9$, and $0 < a1+a2+a3 \leq 1$.

Alternatively, the invention provides a polymer (A1) comprising repeat units of the general formulae (1a), (2) and (3) and having a weight average molecular weight of 1,000 to 500,000.

(A1)

(1a)

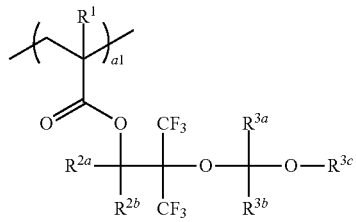

(2)

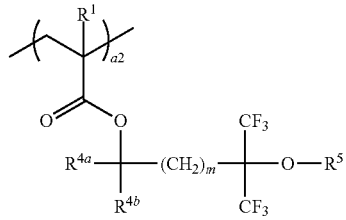

(3)

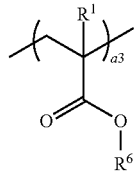

Herein $R^1$ is hydrogen, fluorine, or straight or branched $C_1$-$C_4$ alkyl or fluoroalkyl, $R^{2a}$ and $R^{2b}$ are hydrogen or straight, branched or cyclic $C_1$-$C_{10}$ alkyl, $R^{3a}$ and $R^{3b}$ are hydrogen or straight, branched or cyclic $C_1$-$C_6$ alkyl, $R^{3c}$ is straight, branched or cyclic $C_1$-$C_{10}$ alkyl, $R^{4a}$ and $R^{4b}$ are hydrogen or straight, branched or cyclic $C_1$-$C_{10}$ alkyl, $R^5$ is hydrogen, straight, branched or cyclic $C_1$-$C_{10}$ alkyl, or an acid labile group, $R^6$ is an acid labile group, $R^{2a}$ and $R^{2b}$, and $R^{4a}$ and $R^{4b}$ may bond together to form a non-aromatic ring of 1 to 20 carbon atoms with the carbon atom to which they are attached, m is an integer of 1 to 6, a1, a2 and a3 are numbers satisfying $0 \leq a1 \leq 1$, $0 \leq a2 < 1$, $0 \leq a3 < 1$, $0 < a2+a3 \leq 0.9$, and $0 < a1+a2+a3 \leq 1$.

Another embodiment of the invention is a resist composition comprising (A) a polymer comprising repeat units of the general formulae (1), (2) and (3), (B) a polymer having a lactone ring and/or maleic anhydride-derived structure which becomes soluble in an alkaline developer under the action of an acid, (C) a compound capable of generating an acid upon exposure to high-energy radiation, and (D) an organic solvent.

(A)

(1)

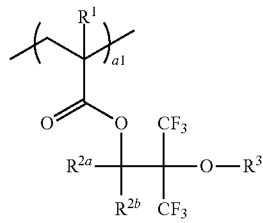

(2)

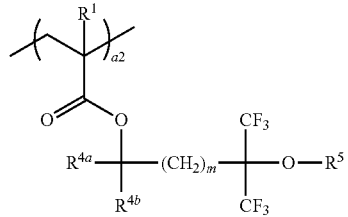

(3)

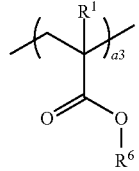

Herein $R^1$, $R^{2a}$, $R^{2b}$, $R^3$, $R^{4a}$, $R^{4b}$, $R^5$, $R^6$, m, a1, a2 and a3 are as defined above.

Also provided is a resist composition comprising (A1) a polymer comprising repeat units of the general formulae (1a), (2) and (3), (B) a polymer having a lactone ring and/or maleic anhydride-derived structure which becomes soluble in an alkaline developer under the action of an acid, (C) a compound capable of generating an acid upon exposure to high-energy radiation, and (D) an organic solvent.

(A1)

(1a)

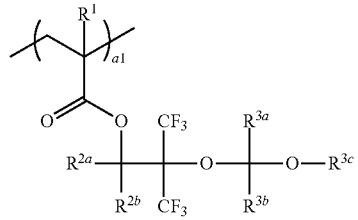

(2)

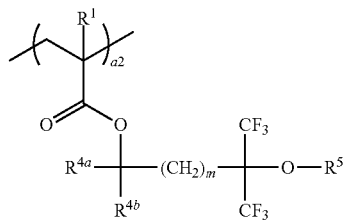

(3)

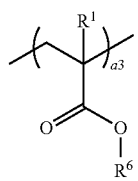

Herein $R^1$, $R^{2a}$, $R^{2b}$, $R^{3a}$, $R^{3b}$, $R^{3c}$, $R^{4a}$, $R^{4b}$, $R^5$, $R^6$, m, a1, a2 and a3 are as defined above.

In both the embodiments, the resist compositions may further comprise (E) a basic compound and/or (F) a dissolution inhibitor.

Further embodiments of the invention are:

a pattern forming process comprising the steps of (1) applying the resist composition defined above onto a substrate to form a resist coating, (2) heat treating the resist coating and exposing it to high-energy radiation through a photomask, and (3) developing the exposed coating with a developer;

a pattern forming process comprising the steps of (1) applying the resist composition defined above onto a substrate to form a resist coating, (2) heat treating the resist coating and exposing it to high-energy radiation from a projection lens through a photomask while holding a liquid between the substrate and the projection lens, and (3) developing the exposed coating with a developer; and a pattern forming process comprising the steps of (1) applying the resist composition defined above onto a substrate to form a resist coating, (2) forming a protective coating onto the resist coating, (3) heat treating and exposing the coated substrate to high-energy radiation from a projection lens through a photomask while holding a liquid between the substrate and the projection lens, and (4) developing with a developer.

The liquid used herein is typically water, and the high-energy radiation typically has a wavelength in the range of 180 to 250 nm.

In a still further embodiment, the pattern forming process comprises the steps of (1) applying the resist composition defined above onto a mask blank to form a resist coating, (2) heat treating and exposing the resist coating in vacuum to electron beam, and (3) developing with a developer.

BENEFITS OF THE INVENTION

Since the resist composition of the invention exhibits excellent water repellency and water slip, immersion lithography can be conducted in a satisfactory manner without substantial development defects.

DESCRIPTION OF THE PREFERRED EMBODIMENTS

The present invention may be understood more readily by reference to the following detailed description of preferred embodiments of the invention and the examples included herein. In this specification and in the claims which follow, reference will be made to a number of terms which shall be defined to have the following meanings.

The singular forms "a", "an" and "the" include plural referents unless the context clearly dictates otherwise.

The notation (Cn-Cm) means a group containing from n to m carbon atoms per group.

Polymer

The polymer (A) or (A1) of the invention for use in resist compositions is defined as comprising repeat units of the general formulae (1), (2) and (3) or repeat units of the general formulae (1a), (2) and (3).

(A)

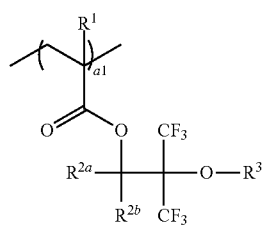
(1)

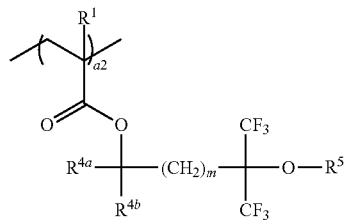
(2)

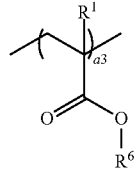
(3)

(A1)

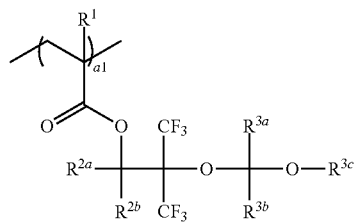
(1a)

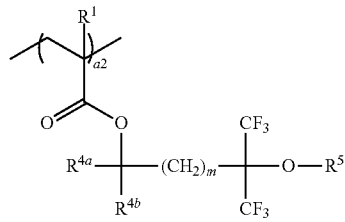
(2)

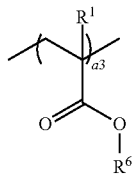
(3)

Herein $R^1$ is a hydrogen atom, fluorine atom, or straight or branched $C_1$-$C_4$ alkyl or fluoroalkyl group, $R^{2a}$ and $R^{2b}$ are each independently a hydrogen atom or straight, branched or cyclic $C_1$-$C_{10}$ alkyl group, $R^3$ is a straight, branched or cyclic $C_1$-$C_{10}$ alkyl group or an acid labile group, $R^{3a}$ and $R^{3b}$ are each independently a hydrogen atom or straight, branched or cyclic $C_1$-$C_6$ alkyl group, $R^{3c}$ is a straight, branched or cyclic $C_1$-$C_{10}$ alkyl group, $R^{4a}$ and $R^{4b}$ are each independently a hydrogen atom or straight, branched or cyclic $C_1$-$C_{10}$ alkyl group, $R^5$ is a hydrogen atom, a straight, branched or cyclic $C_1$-$C_{10}$ alkyl group, or an acid labile group, $R^6$ is an acid labile group, $R^{2a}$ and $R^{2b}$, and $R^{4a}$ and $R^{4b}$ may bond together to form a non-aromatic ring of 1 to 20 carbon atoms with the carbon atom to which they are attached, the subscript m is an integer of 1 to 6, a1, a2 and a3 are numbers satisfying $0 \leq a1 \leq 1$, $0 \leq a2 < 1$, $0 \leq a3 < 1$, $0 < a2+a3 \leq 0.9$, and $0 < a1+a2+a3 \leq 1$.

It is noted that the meaning of a1+a2+a3=1 is that in a polymer comprising repeat units (1) to (3) or repeat units (1a) to (3), the total of repeat units (1) to (3) or (1a) to (3) is 100 mol % based on the total amount of entire repeat units. In this regard, a proportion of repeat units (1) or (1a) is preferably from 0.4 to 0.9, and more preferably from 0.5 to 0.8, a proportion of repeat units (2) is preferably from 0 to 0.6, and more preferably from 0 to 0.5, and a proportion of repeat units (3) is preferably from 0 to 0.6, and more preferably from 0 to 0.5.

The meaning of a1+a2+a3<1 is that the total of repeat units (1) to (3) or (1a) to (3) is less than 100 mol % based on the total amount of entire repeat units, indicating the inclusion of other repeat units. In this regard, the sum of a1+a2+a3 is preferably at least 0.5, and more preferably at least 0.7. The remaining repeat units are preferably repeat units of at least one type having formulae (4a) to (4d), shown later.

In formulae (1)-(3) and (1a), suitable straight or branched $C_1$-$C_4$ alkyl groups represented by $R^1$ include, but are not limited to, methyl, ethyl, n-propyl, isopropyl, n-butyl, sec-butyl, and tert-butyl; and suitable fluoroalkyl groups include trifluoromethyl, 2,2,2-trifluoroethyl, 3,3,3-trifluoropropyl, 2,2,3,3,3-pentafluoropropyl, and 1,1,2,2,3,3,3-heptafluoropropyl.

In formulae (1)-(3) and (1a), suitable straight, branched or cyclic $C_1$-$C_{10}$ alkyl groups represented by $R^{2a}$, $R^{2b}$, $R^3$, $R^{3c}$, $R^{4a}$, $R^{4b}$ and $R^5$ include, but are not limited to, methyl, ethyl, n-propyl, isopropyl, n-butyl, sec-butyl, tert-butyl, tert-amyl, n-pentyl, n-hexyl, n-heptyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl, cyclohexylbutyl, and adamantyl. Suitable straight, branched or cyclic $C_1$-$C_6$ alkyl groups represented by $R^{3a}$ and $R^{3b}$ include, but are not limited to, methyl, ethyl, n-propyl, isopropyl, n-butyl, sec-butyl, tert-butyl, tert-amyl, n-pentyl, n-hexyl, cyclopentyl, cyclohexyl, and cyclopentylmethyl. $R^{2a}$ and $R^{2b}$, $R^{3a}$ and $R^{3b}$, and $R^{4a}$ and $R^{4b}$ may bond together to form a ring, wherein each is an alkylene group, examples of which include the above-exemplified alkyl groups with one hydrogen atom eliminated.

The acid labile group represented by $R^3$ in formula (1), $R^5$ in formula (2) or $R^6$ in formula (3) may be selected from a variety of such groups. Examples of the acid labile group are groups of the following general formulae (L1) to (L4), tertiary alkyl groups of 4 to 20 carbon atoms, preferably 4 to 15 carbon atoms, trialkylsilyl groups in which each alkyl moiety has 1 to 6 carbon atoms, and oxoalkyl groups of 4 to 20 carbon atoms.

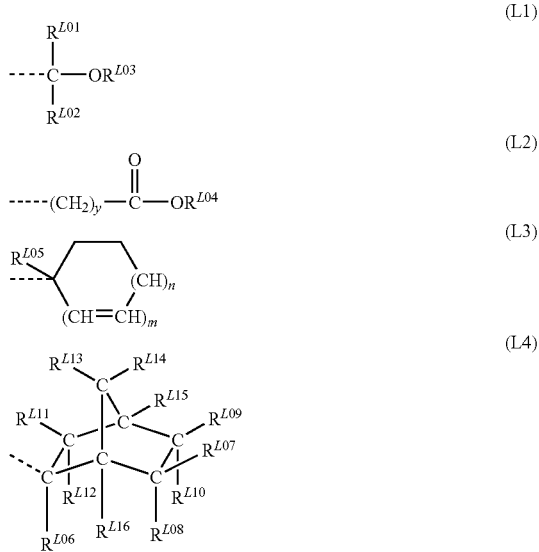

Herein, the broken line denotes a valence bond. In formula (L1), $R^{L01}$ and $R^{L02}$ are hydrogen or straight, branched or cyclic alkyl groups of 1 to 18 carbon atoms, preferably 1 to 10 carbon atoms. Exemplary alkyl groups include methyl, ethyl, propyl, isopropyl, n-butyl, sec-butyl, tert-butyl, cyclopentyl, cyclohexyl, 2-ethylhexyl, n-octyl, and adamantyl. $R^{L03}$ is a monovalent hydrocarbon group of 1 to 18 carbon atoms, preferably 1 to 10 carbon atoms, which may contain a heteroatom such as oxygen, examples of which include unsubstituted straight, branched or cyclic alkyl groups and substituted forms of such alkyl groups in which some hydrogen atoms are replaced by hydroxyl, alkoxy, oxo, amino, alkylamino or the like. Illustrative examples of the straight, branched or cyclic alkyl groups are as exemplified above for $R^{L01}$ and $R^{L02}$, and examples of the substituted alkyl groups are as shown below.

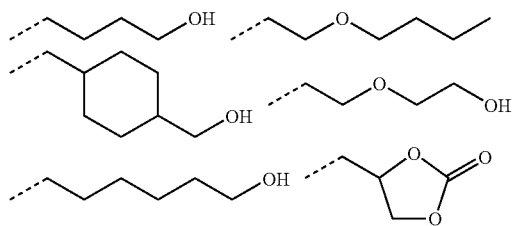

A pair of $R^{L01}$ and $R^{L02}$, $R^{L01}$ and $R^{L03}$, or $R^{L02}$ and $R^{L03}$ may bond together to form a ring with carbon and oxygen atoms to which they are attached. Each of ring-forming $R^{L01}$, $R^{L02}$ and $R^{L03}$ is a straight or branched alkylene group of 1 to 18 carbon atoms, preferably 1 to 10 carbon atoms when they form a ring.

In formula (L2), $R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (L1). Exemplary tertiary alkyl groups are tert-butyl, tert-amyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, 2-ethyl-2-adamantyl, and the like. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. Letter y is an integer of 0 to 6.

In formula (L3), $R^{L05}$ is an optionally substituted, straight, branched or cyclic $C_1$-$C_{10}$ alkyl group or an optionally substituted $C_6$-$C_{20}$ aryl group. Examples of the optionally substituted alkyl groups include straight, branched or cyclic alkyl groups such as methyl, ethyl, propyl, isopropyl, n-butyl, sec-butyl, tert-butyl, tert-amyl, n-pentyl, n-hexyl, cyclopentyl, cyclohexyl, and bicyclo[2.2.1]heptyl, and substituted forms of such groups in which some hydrogen atoms are replaced by hydroxyl, alkoxy, carboxy, alkoxycarbonyl, oxo, amino, alkylamino, cyano, mercapto, alkylthio, sulfo or other groups or in which some methylene groups are replaced by oxygen or sulfur atoms. Examples of optionally substituted aryl groups include phenyl, methylphenyl, naphthyl, anthryl, phenanthryl, and pyrenyl. Letter m is equal to 0 or 1, n is equal to 0, 1, 2 or 3, and 2m+n is equal to 2 or 3.

In formula (L4), $R^{L06}$ is an optionally substituted, straight, branched or cyclic $C_1$-$C_{10}$ alkyl group or an optionally substituted $C_6$-$C_{20}$ aryl group. Examples of these groups are the same as exemplified for $R^{L05}$. $R^{L07}$ to $R^{L16}$ independently represent hydrogen or monovalent hydrocarbon groups of 1 to 15 carbon atoms. Exemplary hydrocarbon groups are straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted forms of these groups in which some hydrogen atoms are replaced by hydroxyl, alkoxy, carboxy, alkoxycarbonyl, oxo, amino, alkylamino, cyano, mercapto, alkylthio, sulfo or other groups. Alternatively, two of $R^{L07}$ to $R^{L16}$ may bond together to form a ring with the carbon atom(s) to which they are attached (for example, a pair of $R^{L07}$ and $R^{L08}$, $R^{L07}$ and $R^{L09}$, $R^{L08}$ and $R^{L10}$, $R^{L09}$ and $R^{L10}$, $R^{L11}$ and $R^{L12}$, $R^{L13}$ and $R^{L14}$, or a similar pair form a ring). Each of $R^{L07}$ to $R^{L16}$ represents a divalent $C_1$-$C_{15}$ hydrocarbon group when they form a ring, examples of which are those exemplified above for the monovalent hydrocarbon groups, with one hydrogen atom being eliminated. Two of $R^{L07}$ to $R^{L16}$ which are attached to vicinal carbon atoms may bond together directly to form a double bond (for example, a pair of $R^{L07}$ and $R^{L09}$ $R^{L09}$ and $R^{L15}$, $R^{L13}$ and $R^{L15}$, or a similar pair).

Of the acid labile groups of formula (L1), the straight and branched ones are exemplified by the following groups.

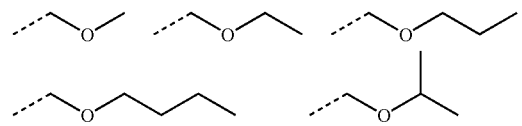

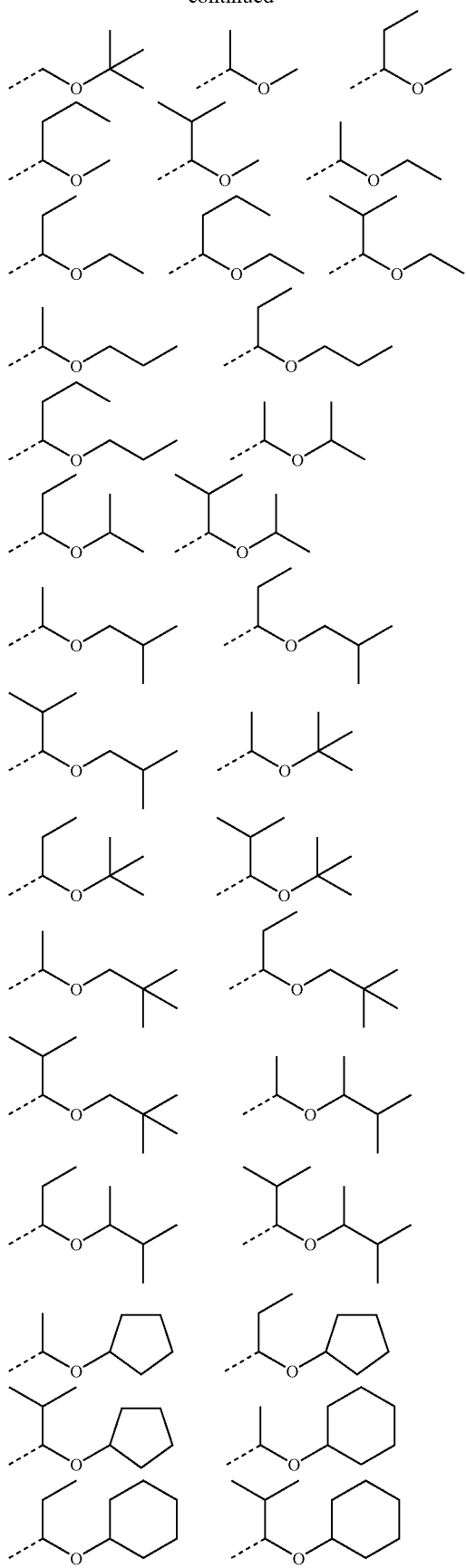
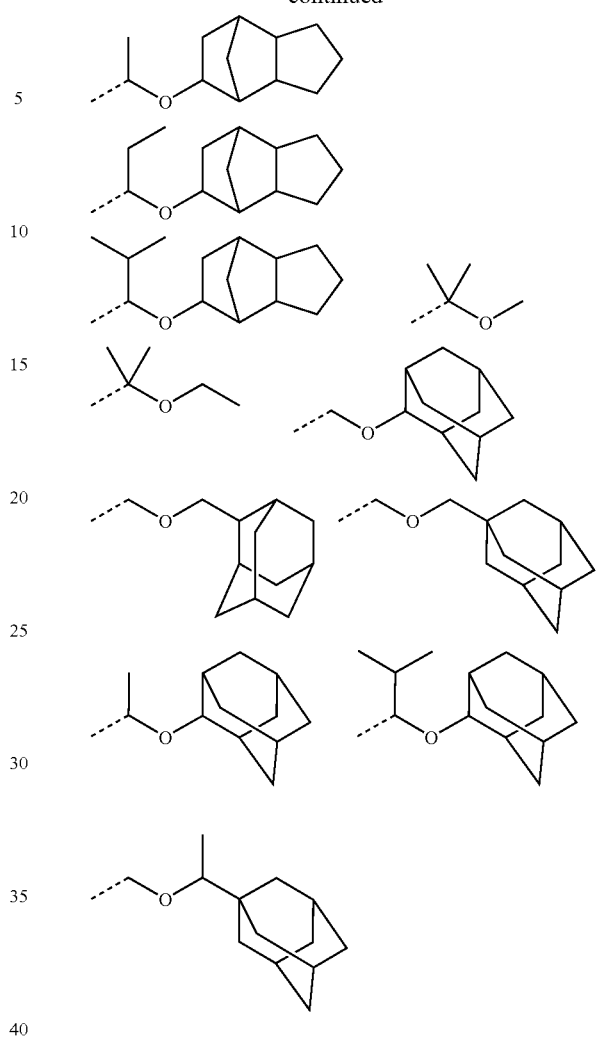

Of the acid labile groups of formula (L1), the cyclic ones are, for example, tetrahydrofuran-2-yl, 2-methyltetrahydrofuran-2-yl, tetrahydropyran-2-yl, and 2-methyltetrahydropyran-2-yl.

Examples of the acid labile groups of formula (L2) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentanyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl.

Examples of the acid labile groups of formula (L3) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-cyclohexylcyclopentyl, 1-(4-methoxybutyl)cyclopentyl, 1-(bicyclo[2.2.1]heptan-2-yl)cyclopentyl, 1-(7-oxabicyclo[2.2.1]heptan-2-yl)cyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, and 3-ethyl-1-cyclohexen-3-yl.

Of the acid labile groups of formula (L4), those groups of the following formulae (L4-1) to (L4-4) are preferred.

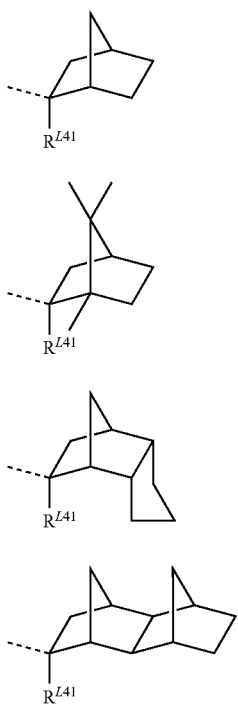

(L4-1)

(L4-2)

(L4-3)

(L4-4)

In formulas (L4-1) to (L4-4), the broken line denotes a bonding site and direction. $R^{L41}$ is each independently a monovalent hydrocarbon group, typically a straight, branched or cyclic $C_1$-$C_{10}$ alkyl group, such as methyl, ethyl, propyl, isopropyl, n-butyl, sec-butyl, tert-butyl, tert-amyl, n-pentyl, n-hexyl, cyclopentyl and cyclohexyl.

For formulas (L4-1) to (L4-4), there can exist enantiomers and diastereomers. Each of formulae (L4-1) to a (L4-4) collectively represents all such stereoisomers. Such stereoisomers may be used alone or in admixture.

For example, the general formula (L4-3) represents one or a mixture of two selected from groups having the following general formulas (L4-3-1) and (L4-3-2).

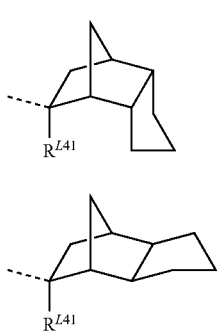

(L4-3-1)

(L4-3-2)

Note that $R^{L41}$ is as defined above.

Similarly, the general formula (L4-4) represents one or a mixture of two or more selected from groups having the following general formulas (L4-4-1) to (L4-4-4).

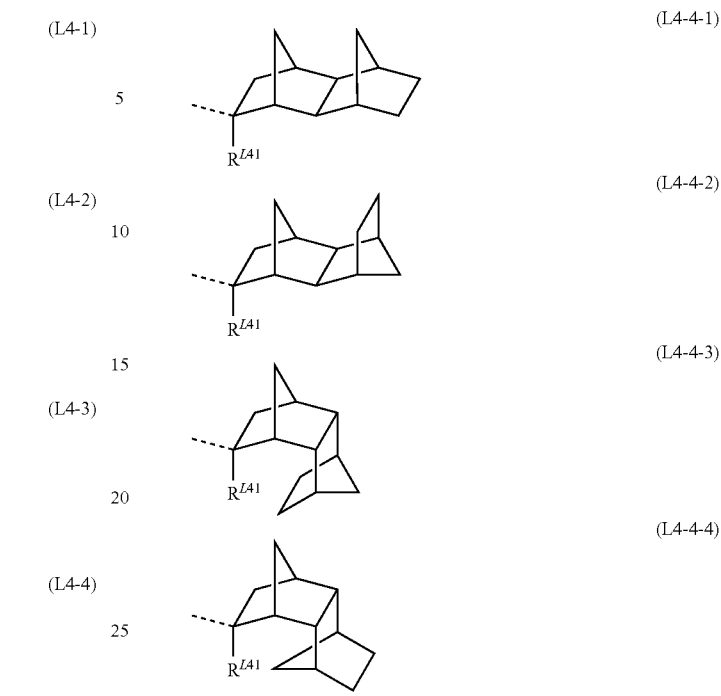

(L4-4-1)

(L4-4-2)

(L4-4-3)

(L4-4-4)

Note that $R^{L41}$ is as defined above.

Each of formulas (L4-1) to (L4-4), (L4-3-1) and (L4-3-2), and (L4-4-1) to (L4-4-4) collectively represents an enantiomer thereof and a mixture of enantiomers.

It is noted that in the above formulas (L4-1) to (L4-4), (L4-3-1) and (L4-3-2), and (L4-4-1) to (L4-4-4), the bond direction is on the exo side relative to the bicyclo[2.2.1] heptane ring, which ensures high reactivity for acid catalyzed elimination reaction (see JP-A 2000-336121). In preparing these monomers having a tertiary exo-alkyl group of bicyclo [2.2.1]heptane structure as a substituent group, there may be contained monomers substituted with an endo-alkyl group as represented by the following formulas (L4-1-endo) to (L4-4-endo). For good reactivity, an exo proportion of at least 50 mol % is preferred, with an exo proportion of at least 80 mol % being more preferred.

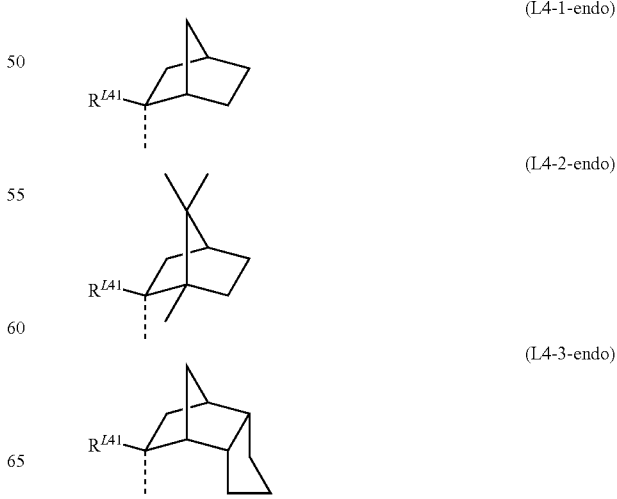

(L4-1-endo)

(L4-2-endo)

(L4-3-endo)

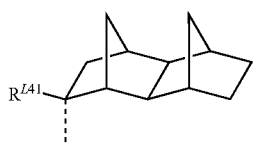
(L4-4-endo)

Note that $R^{L41}$ is as defined above.

Illustrative examples of the acid labile group of formula (L4) are given below.

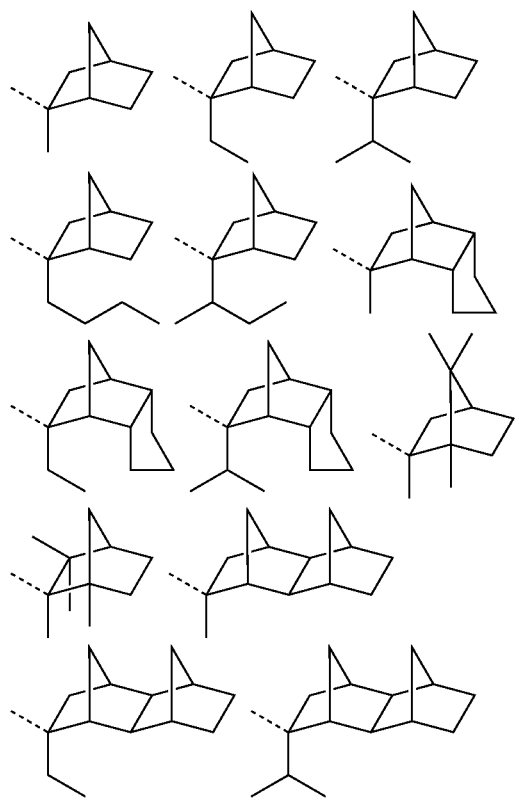

Examples of the tertiary $C_4$-$C_{20}$ alkyl groups, trialkylsilyl groups in which each alkyl moiety has 1 to 6 carbon atoms, and $C_4$-$C_{20}$ oxoalkyl groups, represented by $R^3$, $R^5$ and $R^6$, are as exemplified for $R^{L04}$ and the like.

Illustrative, non-limiting examples of the repeat units of formulae (1) and (1a) are given below.

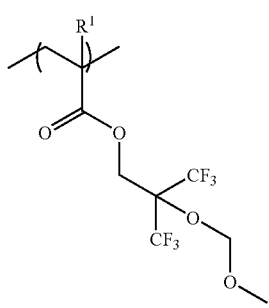

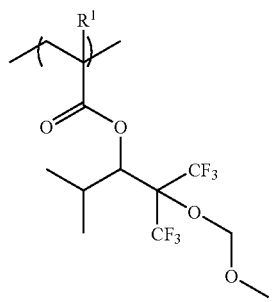

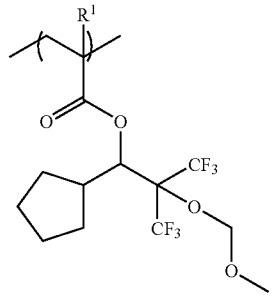

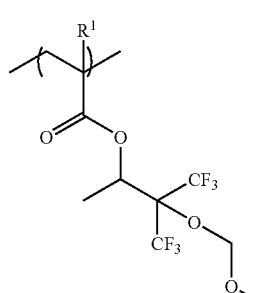

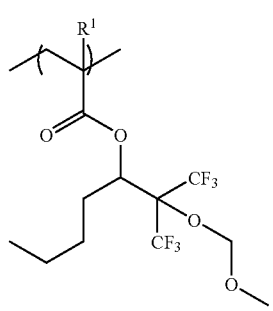

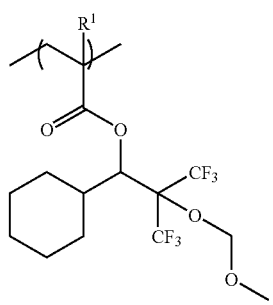

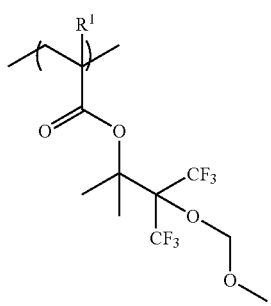
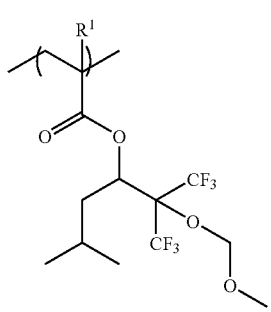
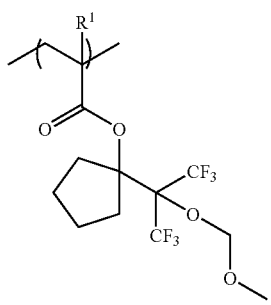
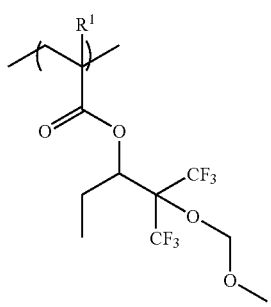
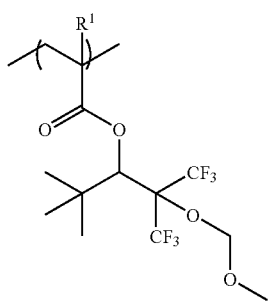
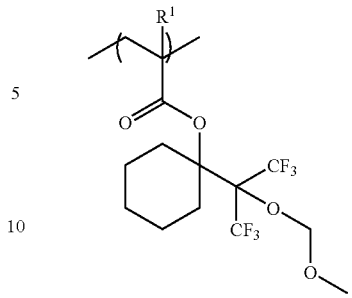
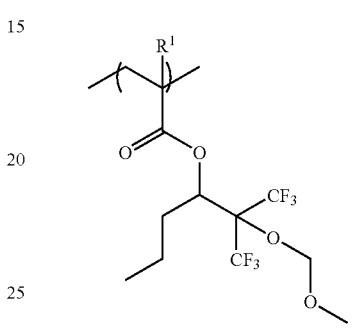
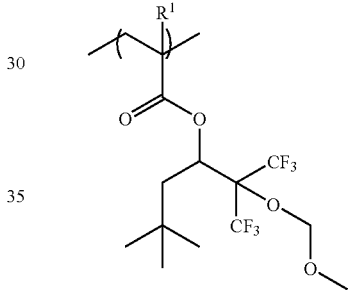
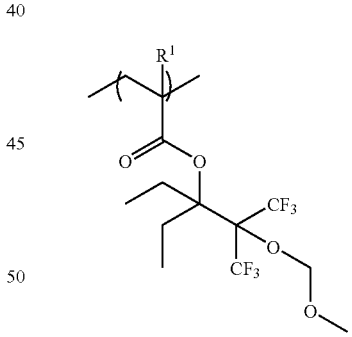
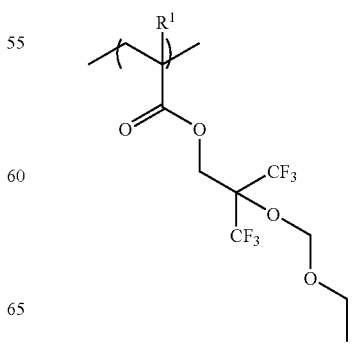

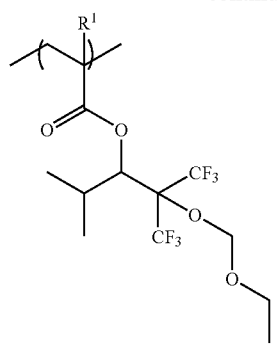
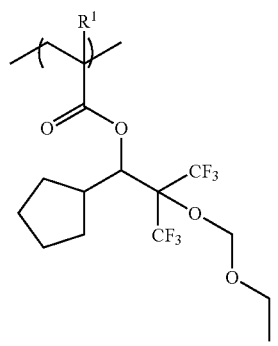
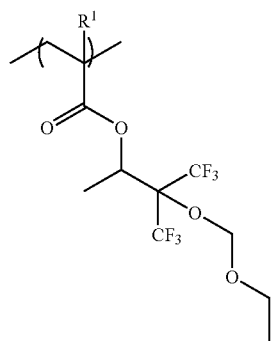
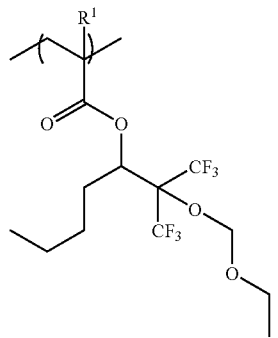
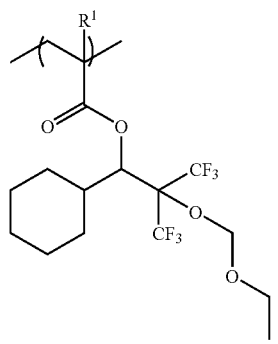
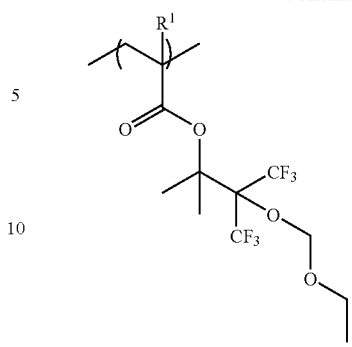
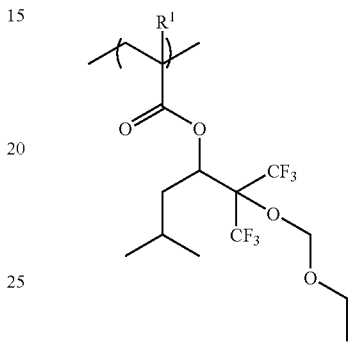
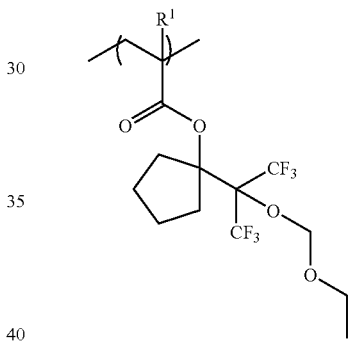
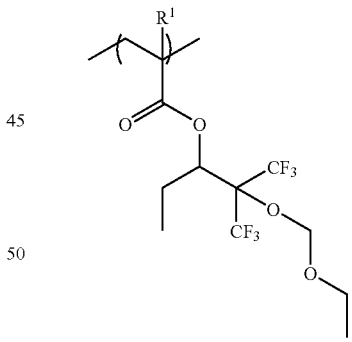
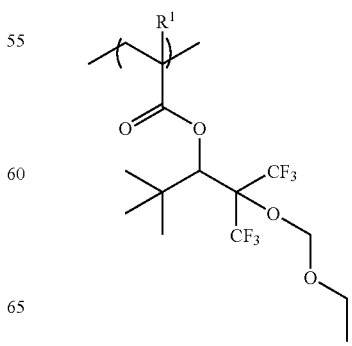

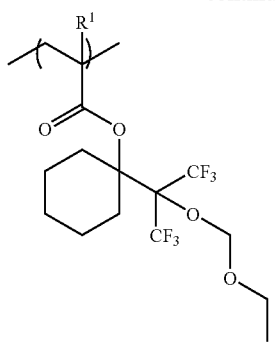
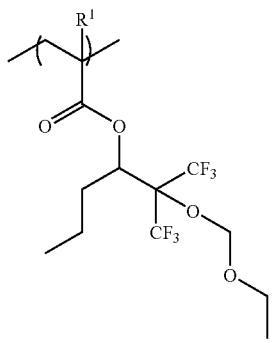
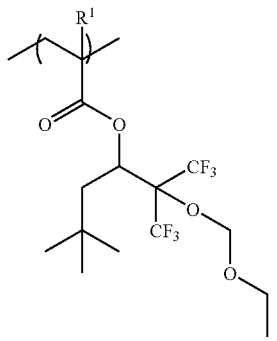
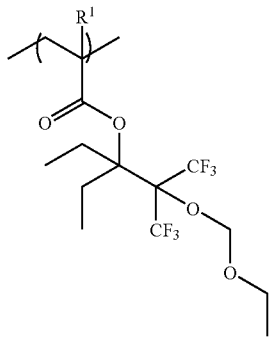
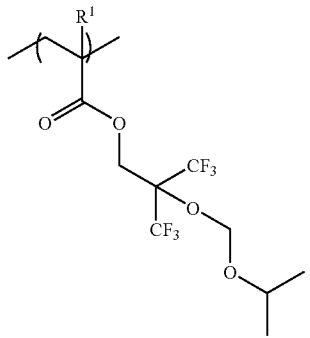
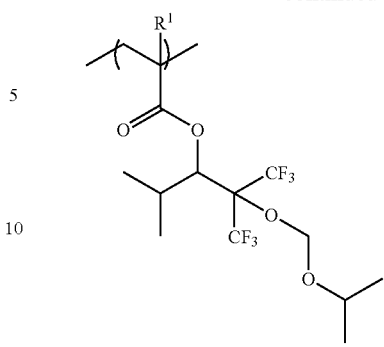
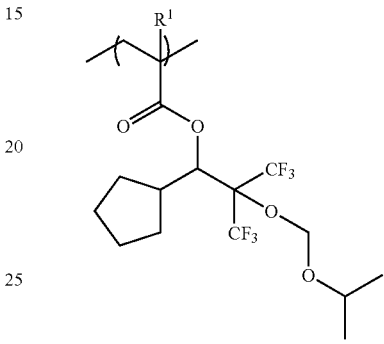
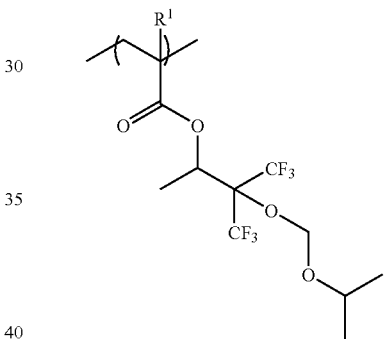
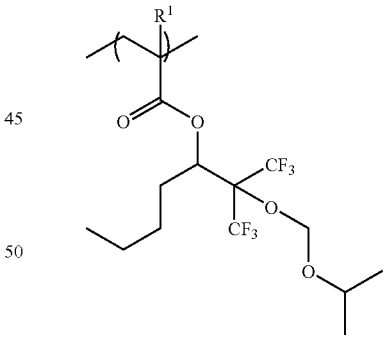
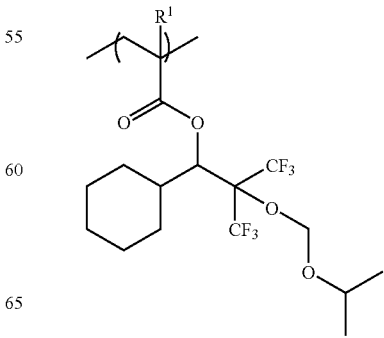

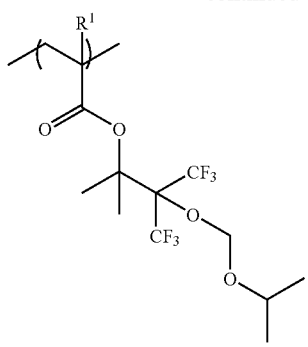
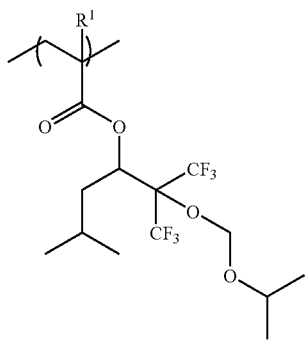
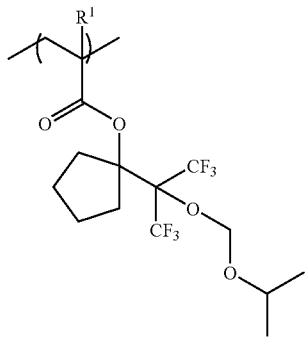
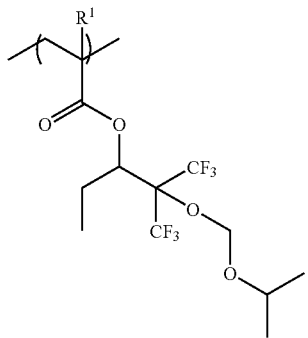
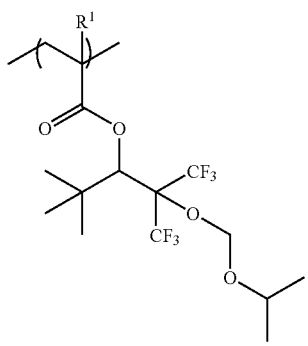
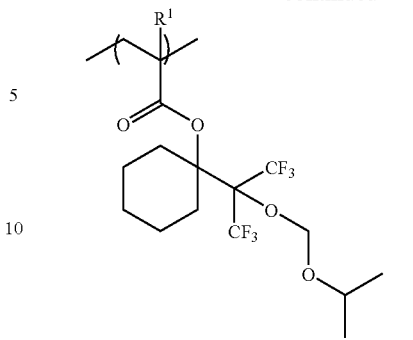
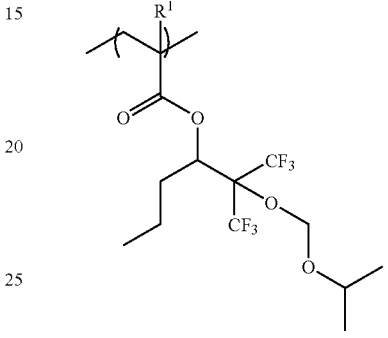
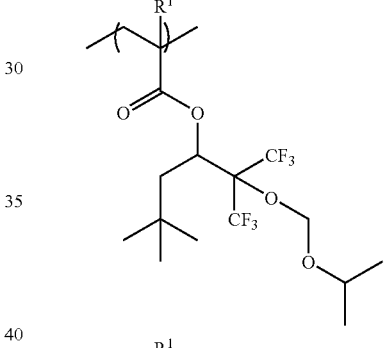
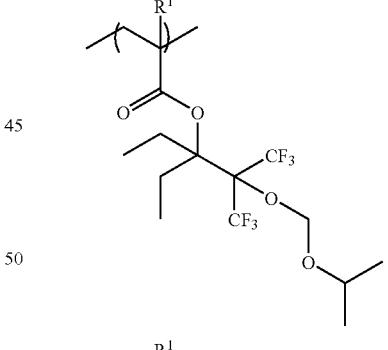
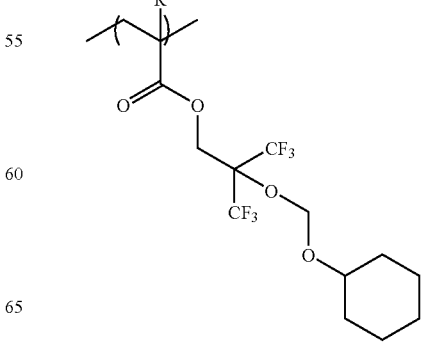

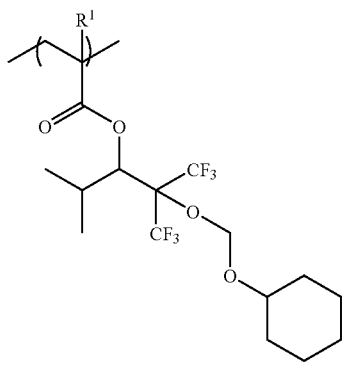
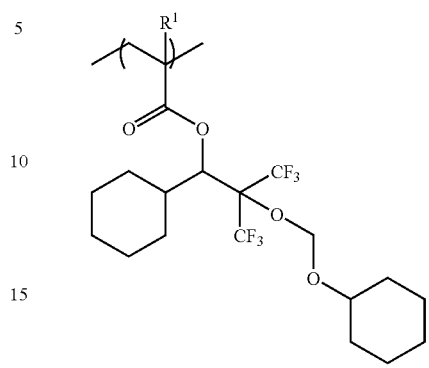
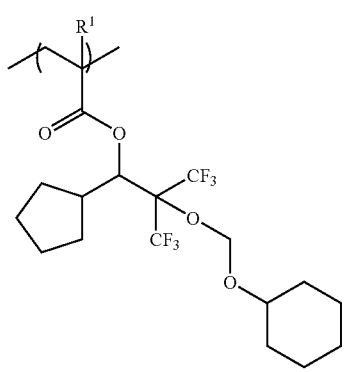
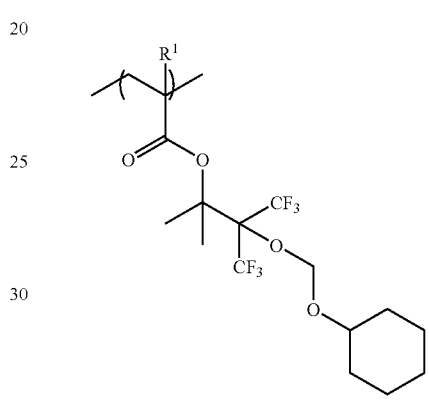
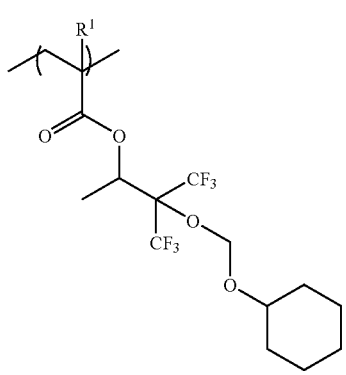
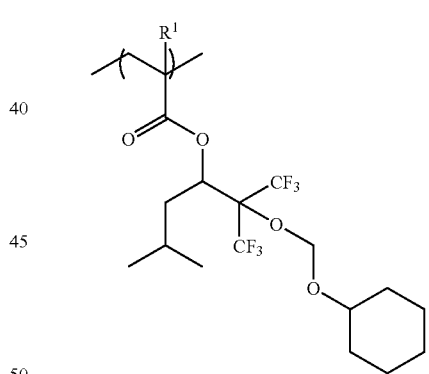
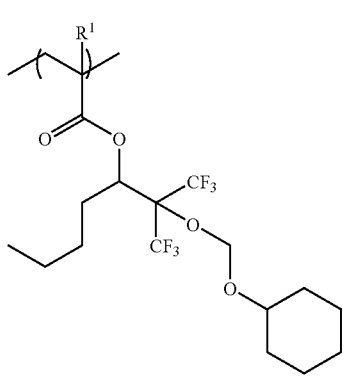
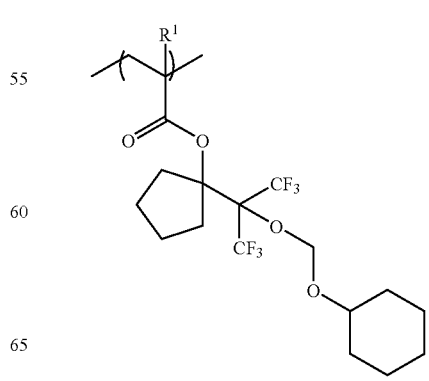

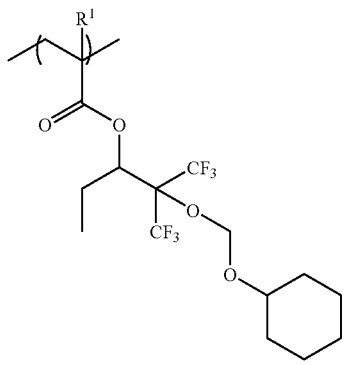
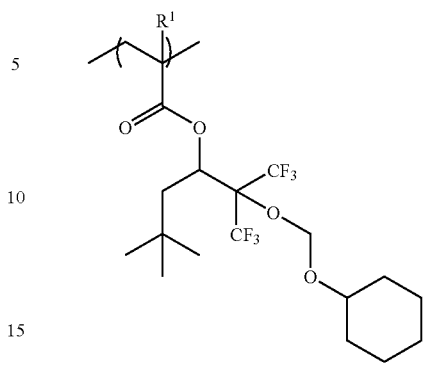
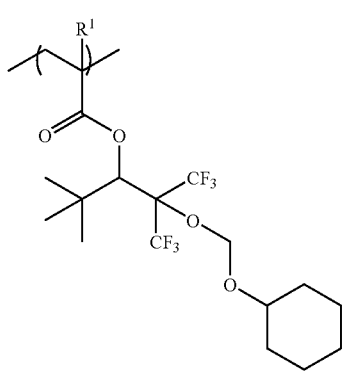
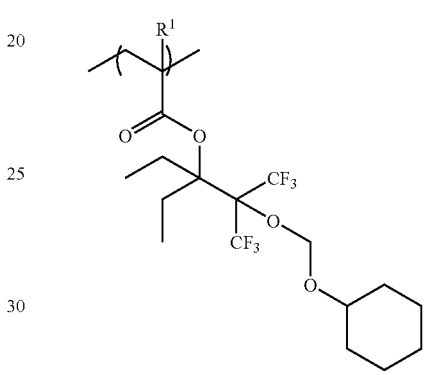
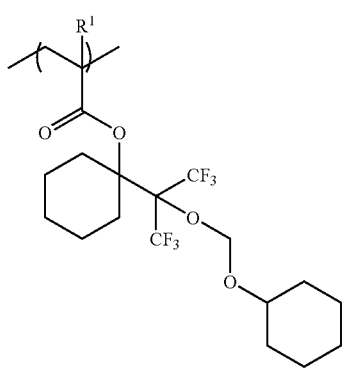
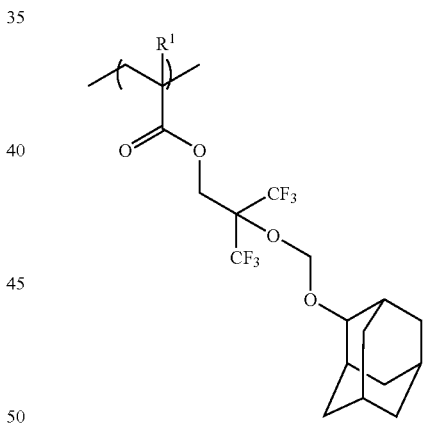
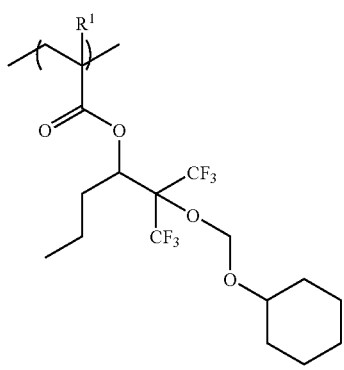
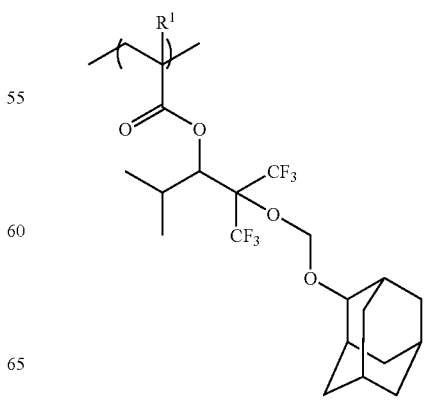

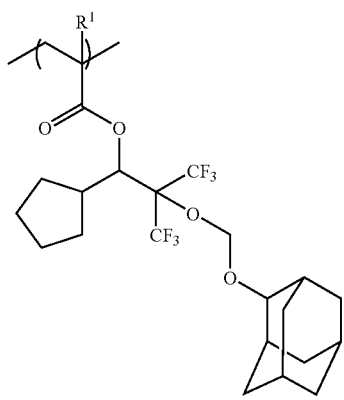
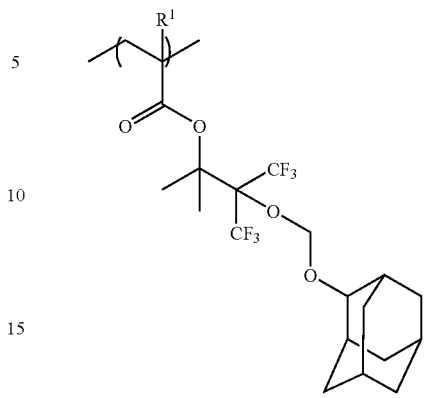
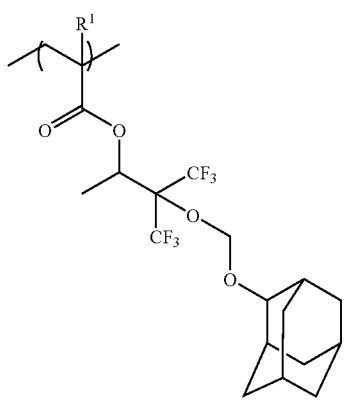
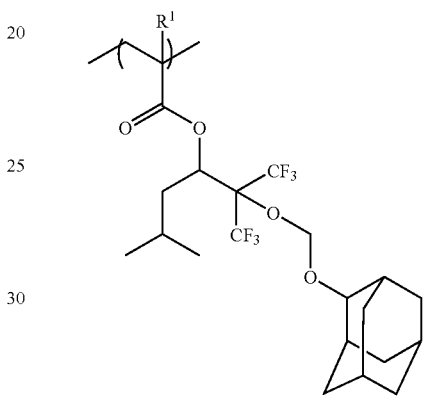
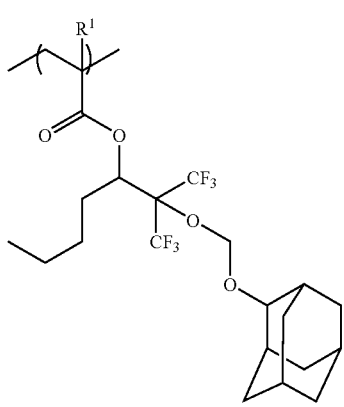
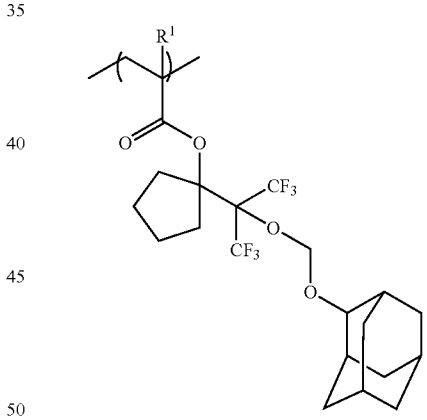
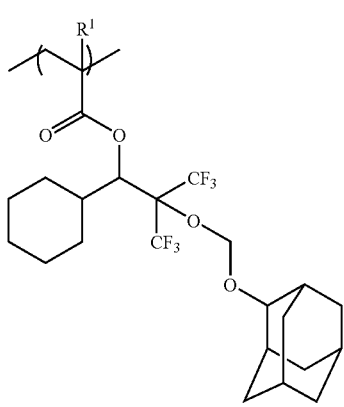
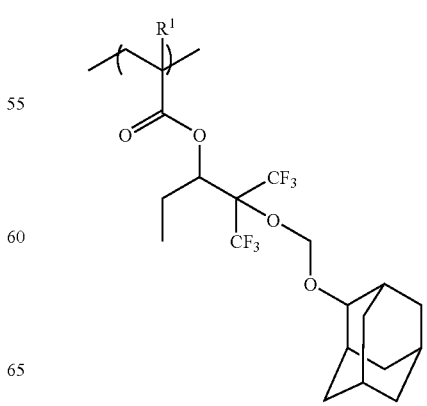

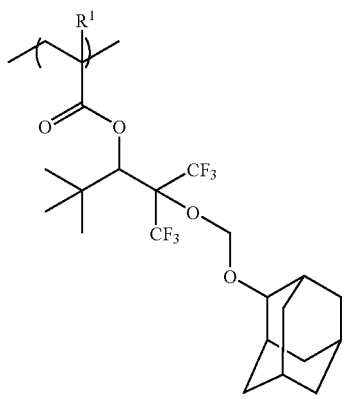
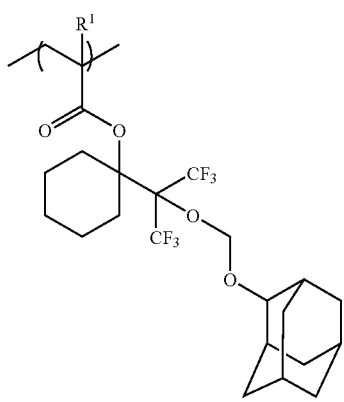
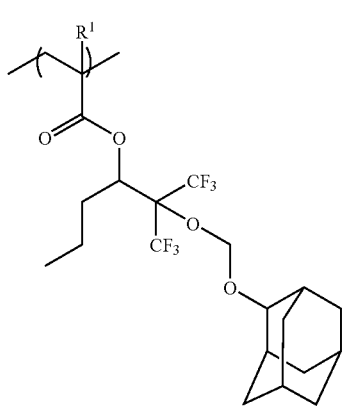
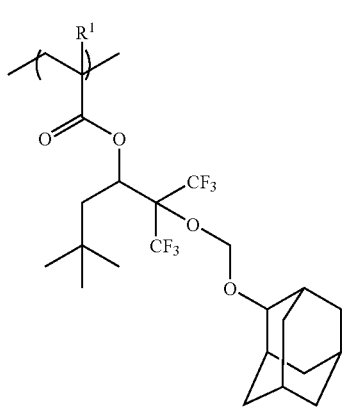
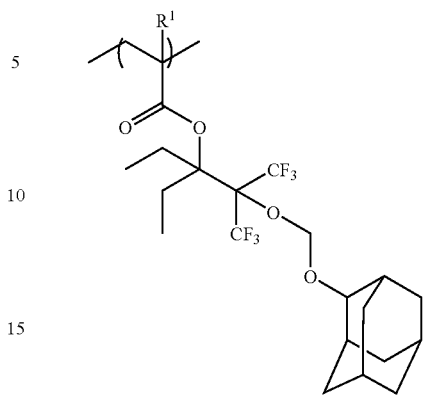
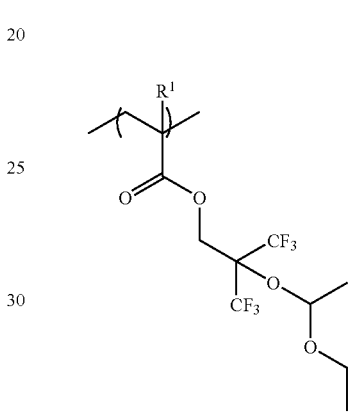
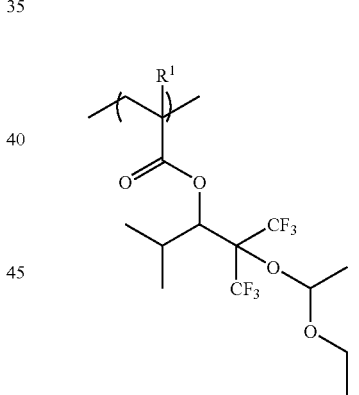
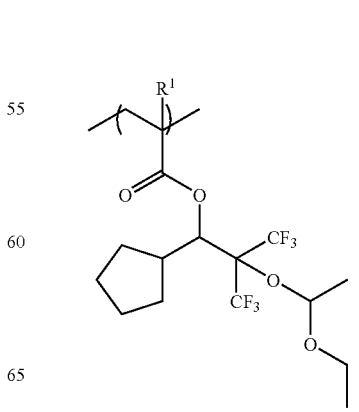

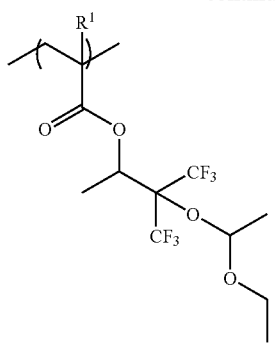
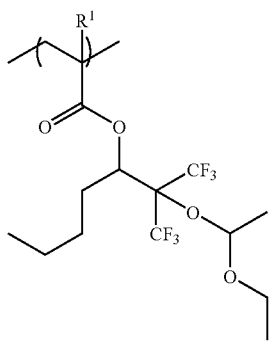
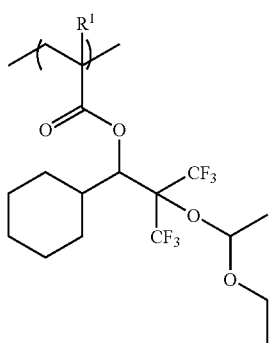
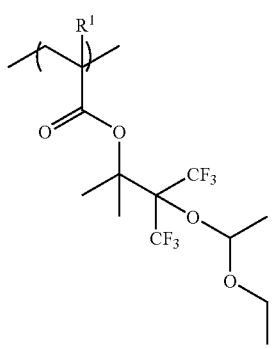
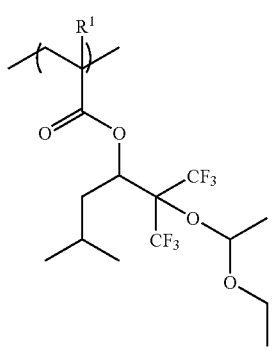
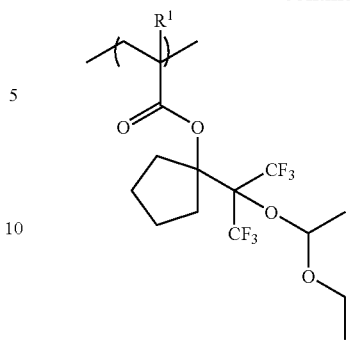
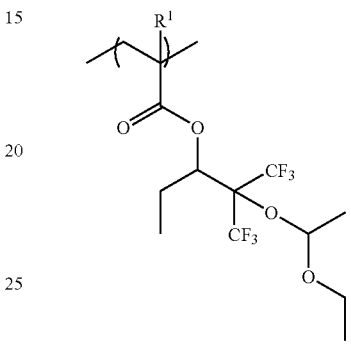
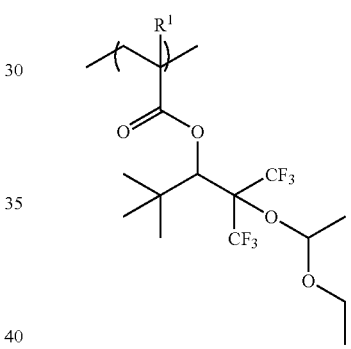
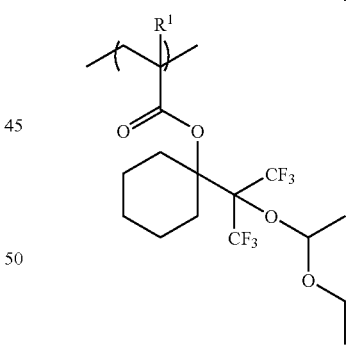
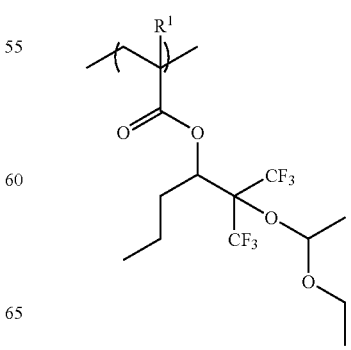

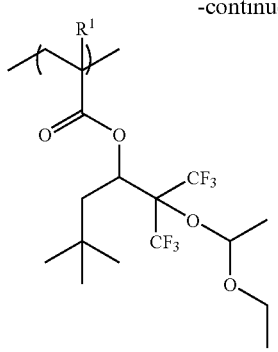
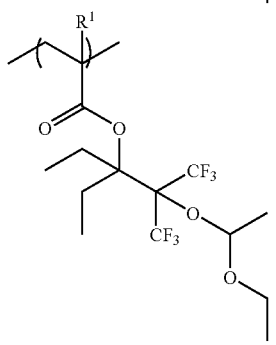
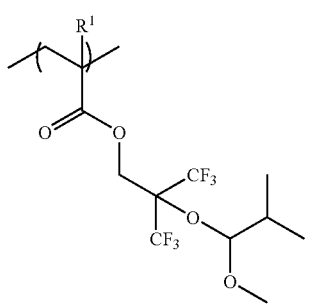
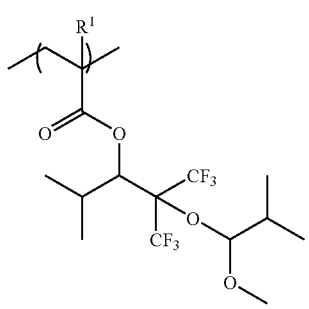
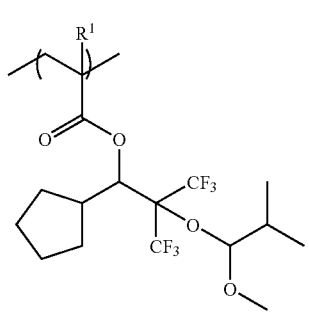
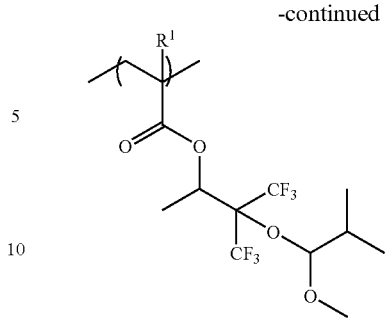
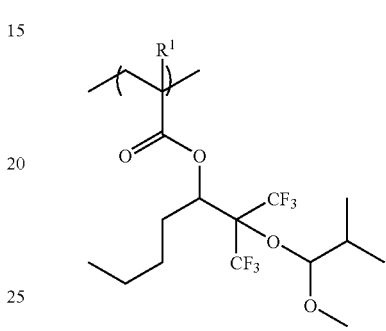
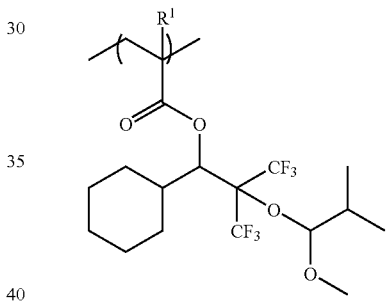
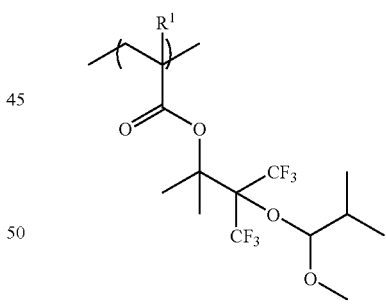
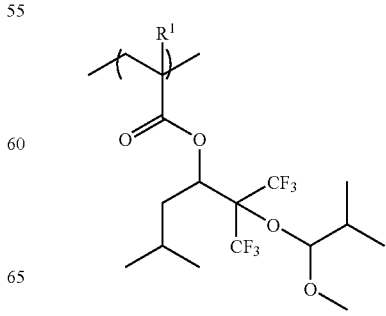

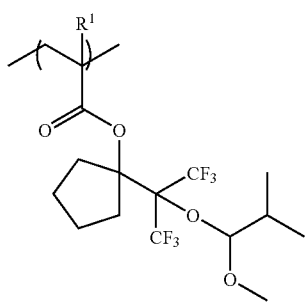
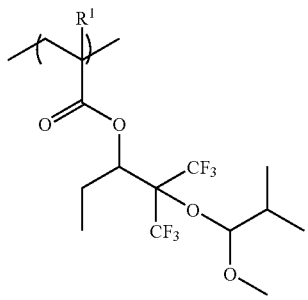
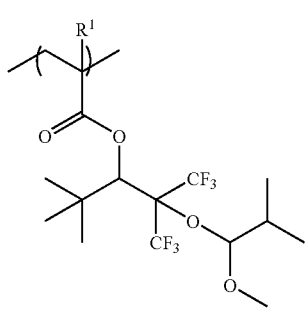
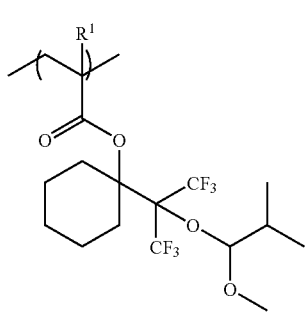
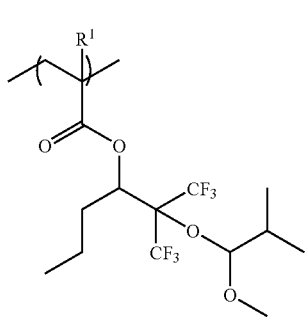
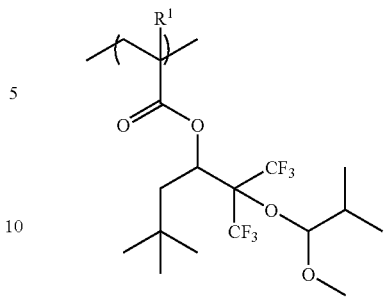
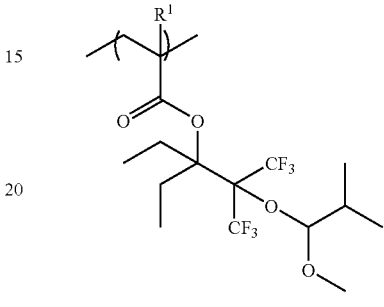
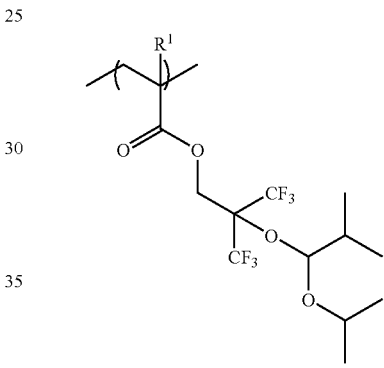
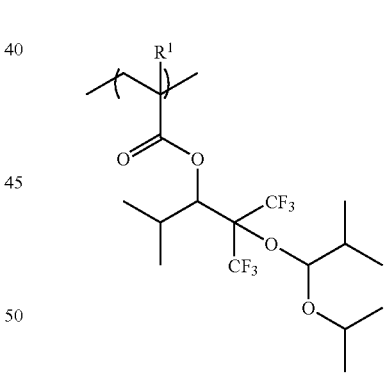
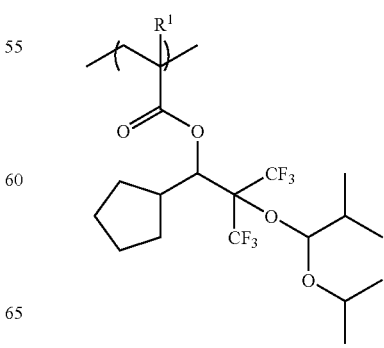

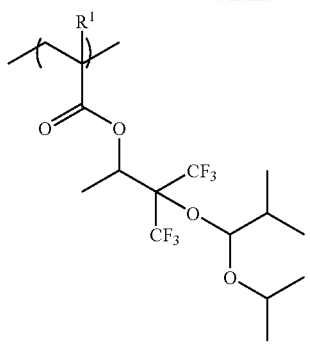
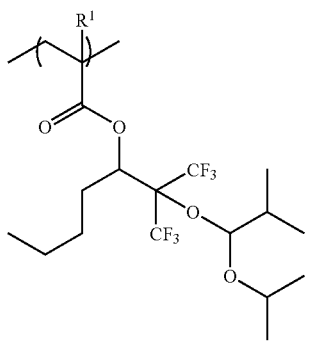
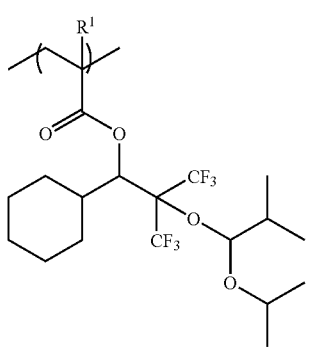
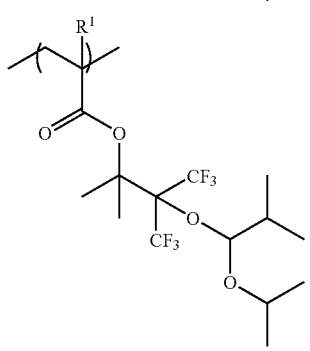
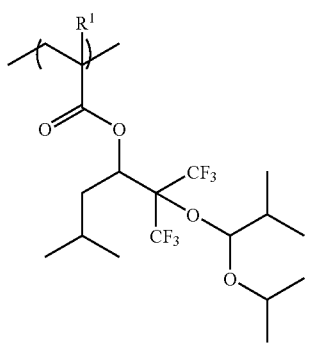
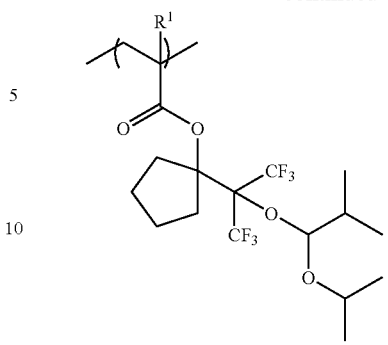
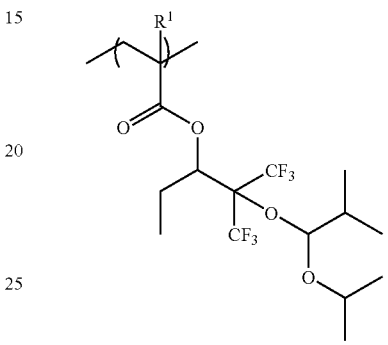
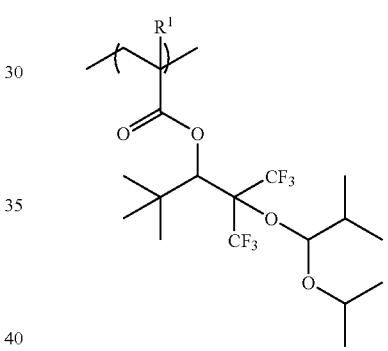
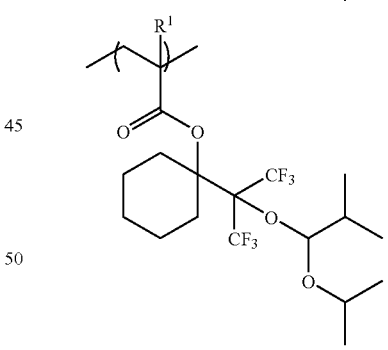
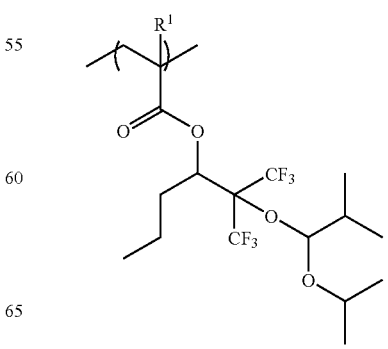

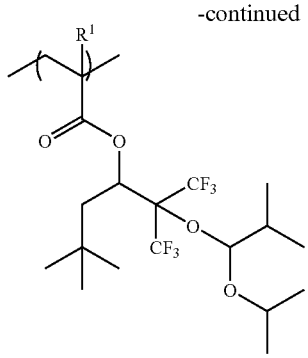
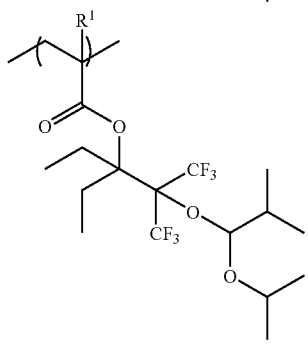
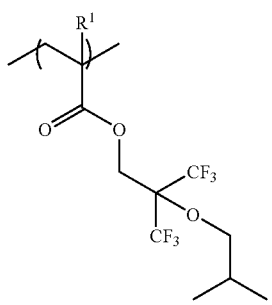
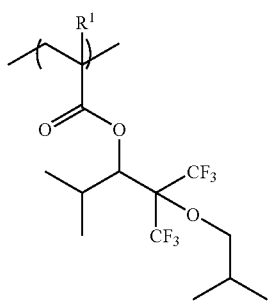
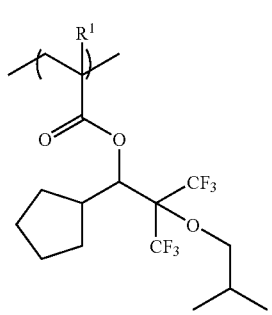
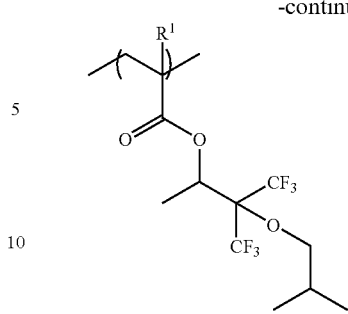
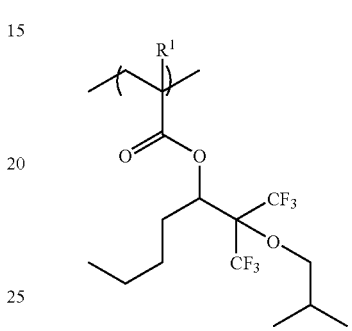
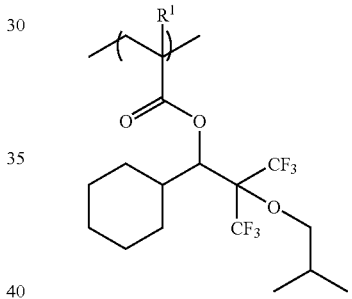
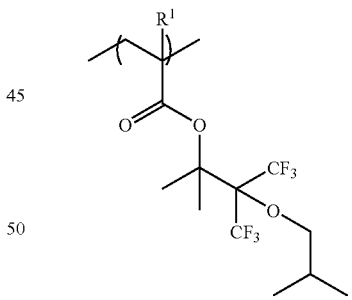
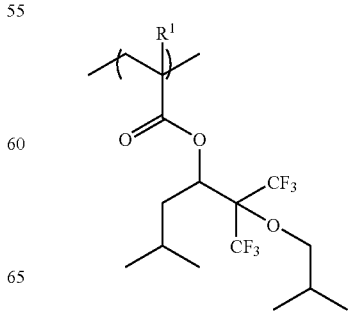

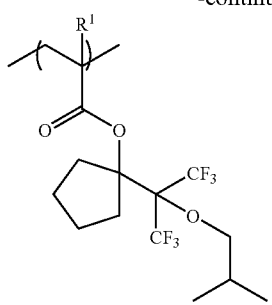
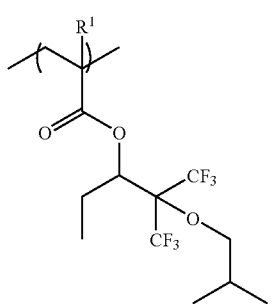
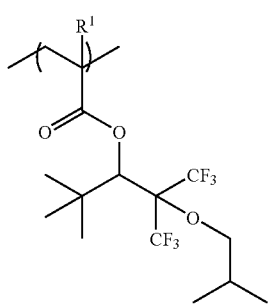
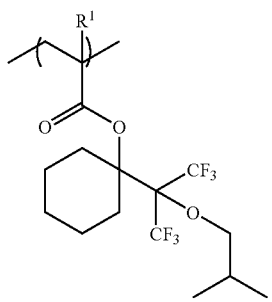
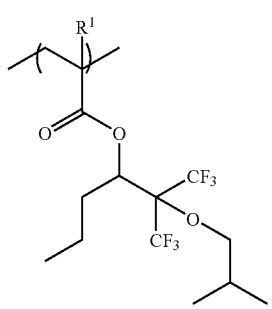
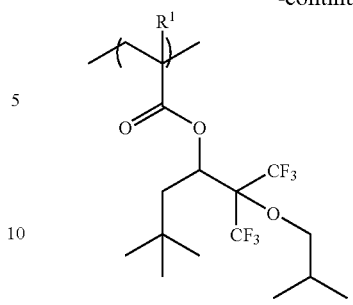
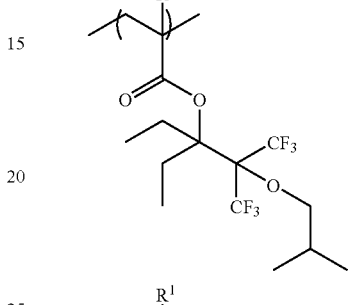
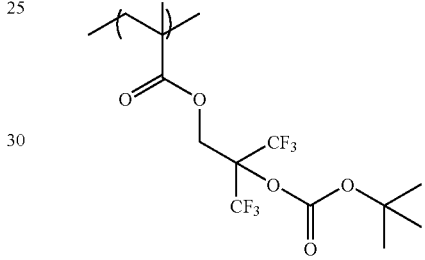
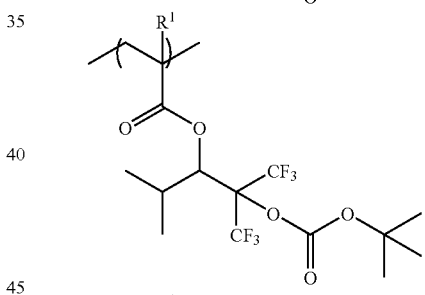
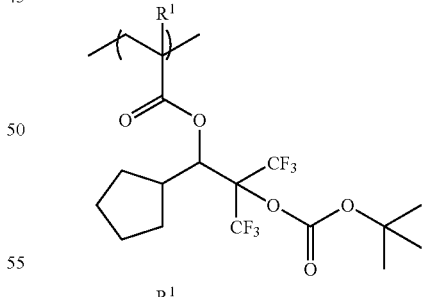
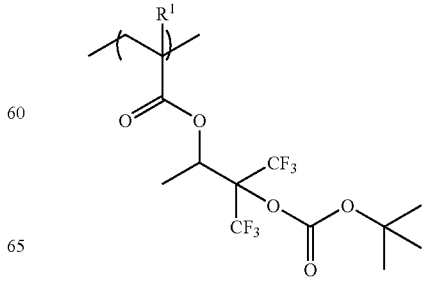

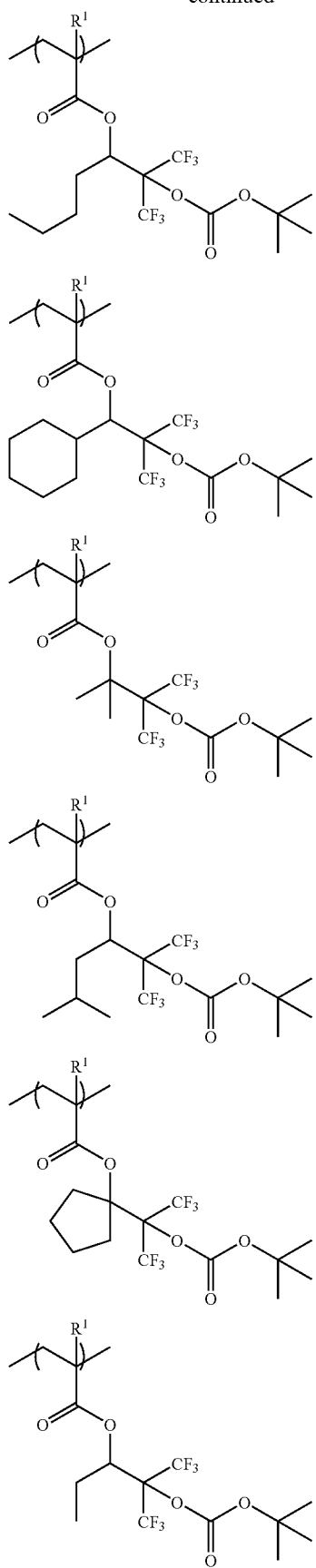
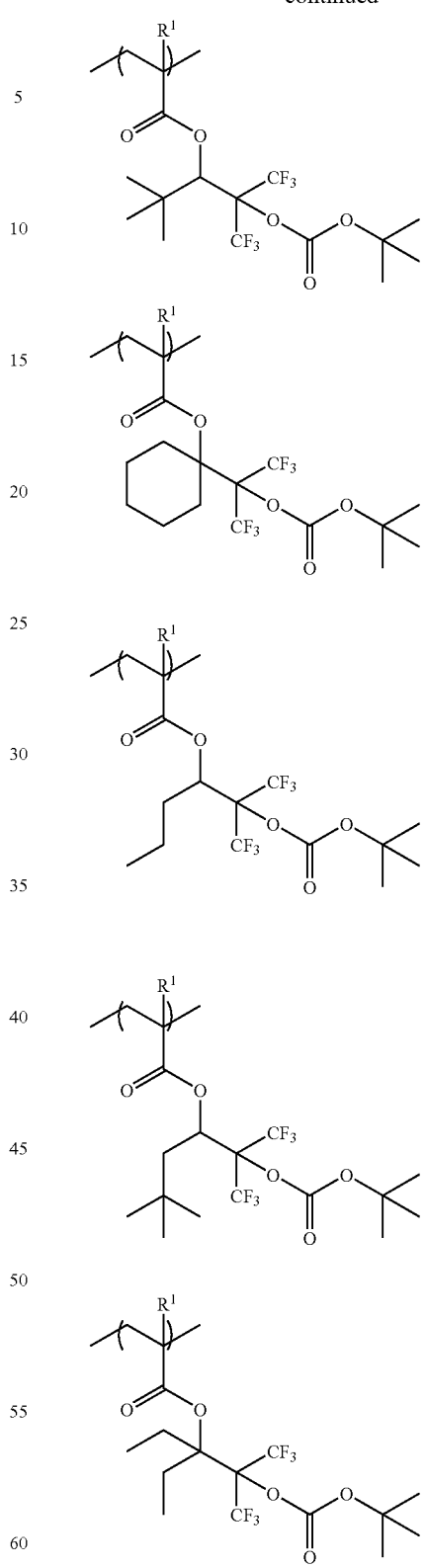
Herein $R^1$ is hydrogen, fluorine or straight or branched $C_1$-$C_4$ alkyl or fluoroalkyl.
Illustrative, non-limiting examples of the repeat units of formula (2) are given below.

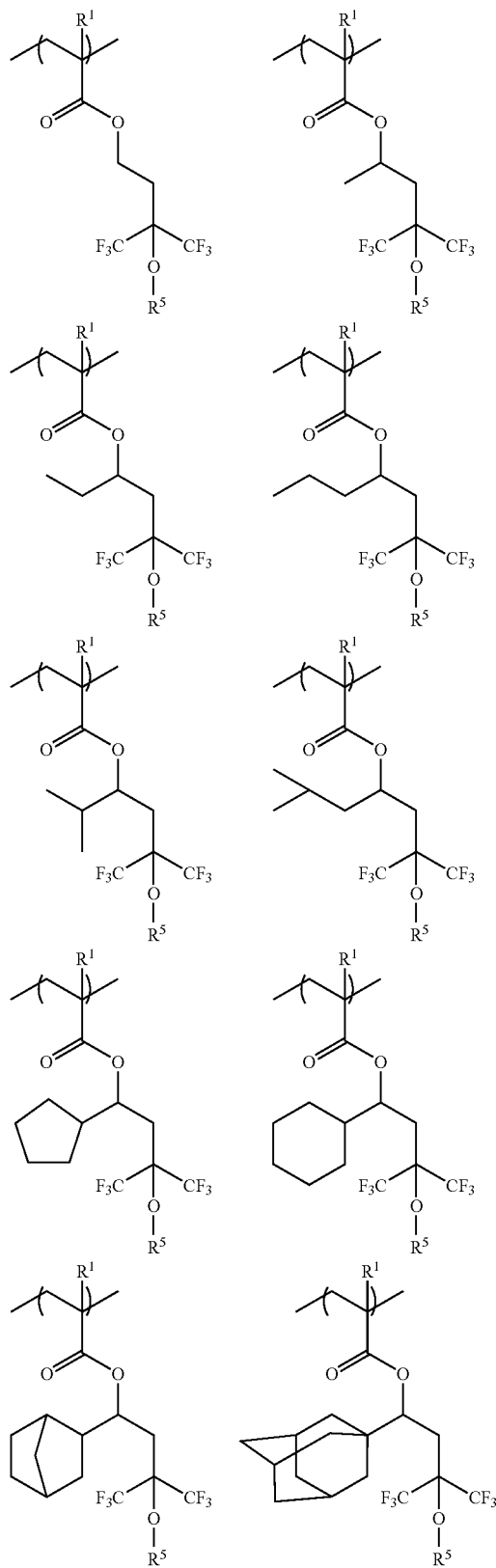
Herein $R^1$ is hydrogen, fluorine or straight or branched $C_1$-$C_4$ alkyl or fluoroalkyl, and $R^5$ is hydrogen, straight, branched or cyclic $C_1$-$C_{10}$ alkyl, or an acid labile group.
Illustrative, non-limiting examples of the repeat units of formula (3) are given below.
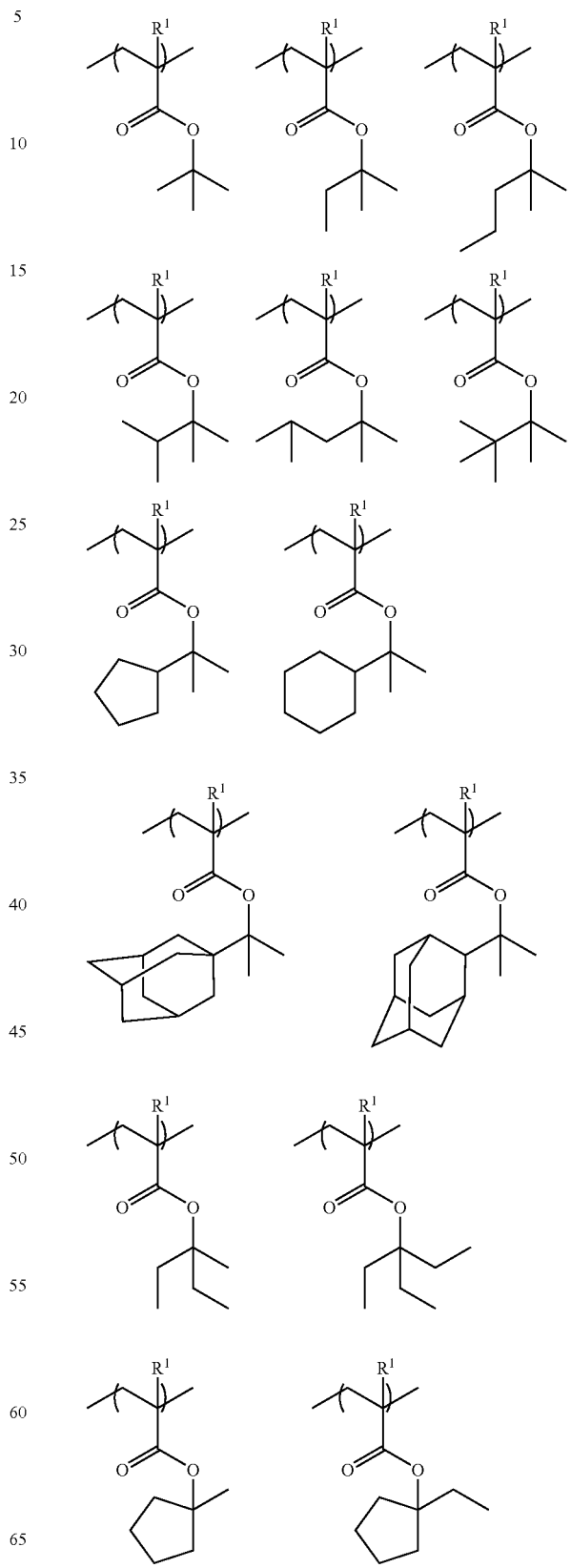

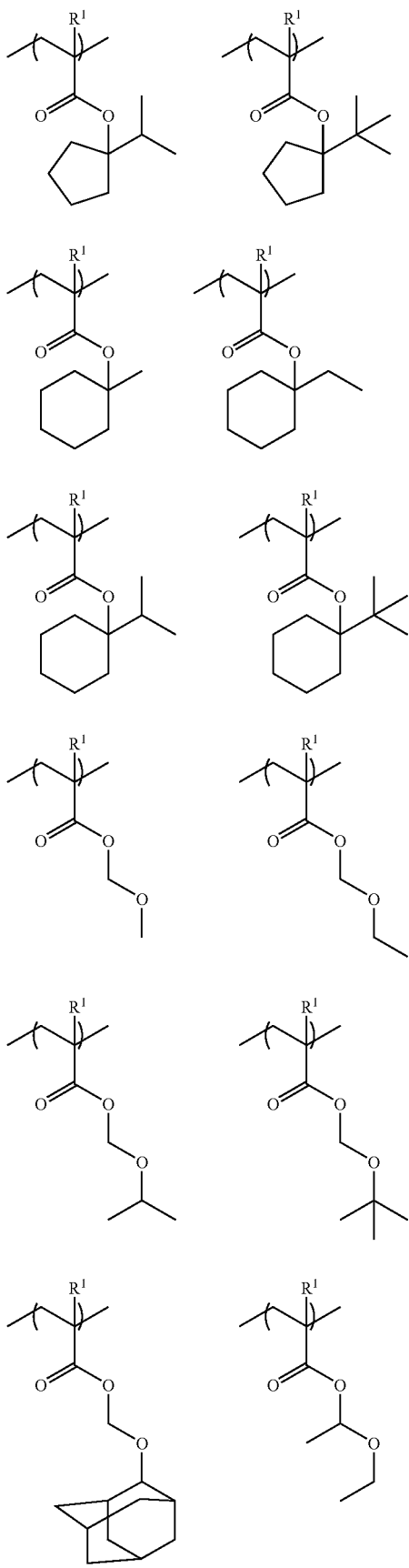

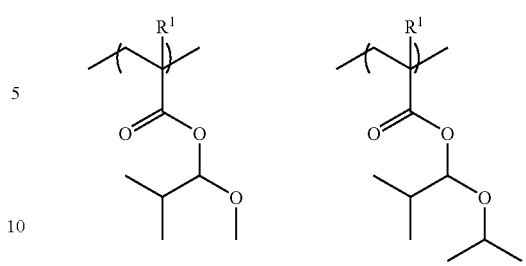

Herein $R^1$ is hydrogen, fluorine or straight or branched $C_1$-$C_4$ alkyl or fluoroalkyl.

In one embodiment, polymer (A) or (A1) is used as an additive to resist material. Specifically, polymer (A) or (A1) is combined with (B) a base polymer having a lactone ring and/or maleic anhydride-derived structure, which will be described later. In this embodiment, polymer (A) or (A1) need not always have sufficient alkaline solubility. In exposed areas, the acid generated within the system drives deprotection reaction on acid labile groups in formulae (1) and (2), acetal groups in formula (1a), and acid labile groups in formula (3) whereby the polymer turns to be soluble in an alkaline developer. Due to its high fluorine content, polymer (A) or (A1) undergoes phase separation from polymer (B) during film formation so that it is segregated in a sub-surface layer of the resist film. As a result, the resist surface becomes more water repellent and more water slippery, inhibiting the acid generator from being leached out.

Although polymer (A) or (A1) used in the resist composition of the invention exerts its performance to a full extent by merely combining repeat units of formulae (1) to (3) or (1a) to (3), it may be further combined with repeat units of one or more types selected from the general formulae (4a) to (4d) shown below, for the purpose of imparting further water repellency or water slip or controlling developer affinity.

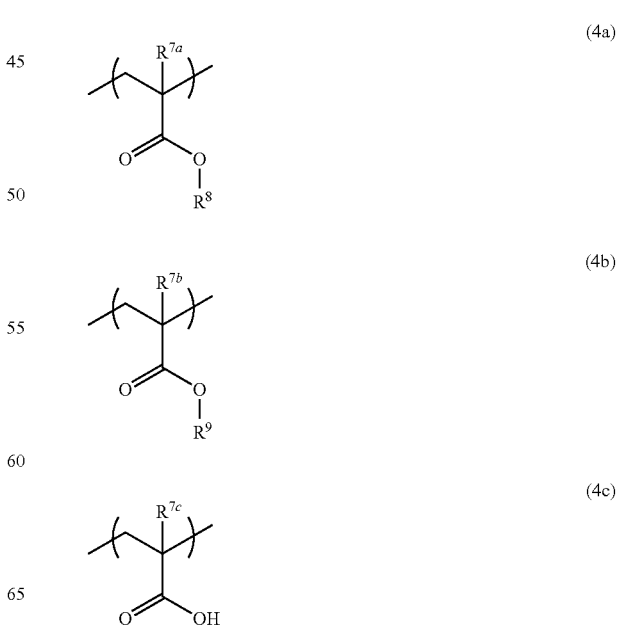

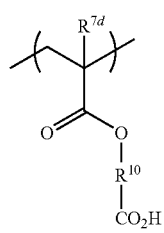

(4d)

Herein $R^{7a}$ to $R^{7d}$ are each independently a hydrogen atom, a fluorine atom or a straight or branched $C_1$-$C_4$ alkyl or fluoroalkyl group. $R^8$ is a $C_2$-$C_{10}$ fluoroalkyl group. $R^9$ is an adhesive group. $R^{10}$ is a divalent organic group of 1 to 20 carbon atoms.

In formulae (4a) to (4d), suitable straight or branched $C_1$-$C_4$ alkyl groups represented by $R^{7a}$ to $R^{7d}$ include, but are not limited to, methyl, ethyl, n-propyl, isopropyl, n-butyl, sec-butyl, and tert-butyl; and suitable fluoroalkyl groups include, but are not limited to, trifluoromethyl, 2,2,2-trifluoroethyl, 3,3,3-trifluoropropyl, 2,2,3,3,3-pentafluoropropyl, and 1,1,2,2,3,3,3-heptafluoropropyl.

Suitable $C_2$-$C_{10}$ fluoroalkyl groups represented by $R^8$ include, but are not limited to, 2,2,2-trifluoroethyl, 3,3,3-trifluoropropyl, 1,1,2,2,3,3,3-heptafluoropropyl, 1H,1H,3H-tetrafluoropropyl, 1H,1H,5H-octafluoropentyl, 1H,1H,7H-dodecafluoroheptyl, 2-(perfluorobutyl)ethyl, 2-(perfluorohexyl)ethyl, 2-(perfluorooctyl)ethyl, and 2-(perfluorodecyl)ethyl.

The adhesive group represented by $R^9$ is selected from a variety of such groups, with those groups of the formulae shown below being preferred.

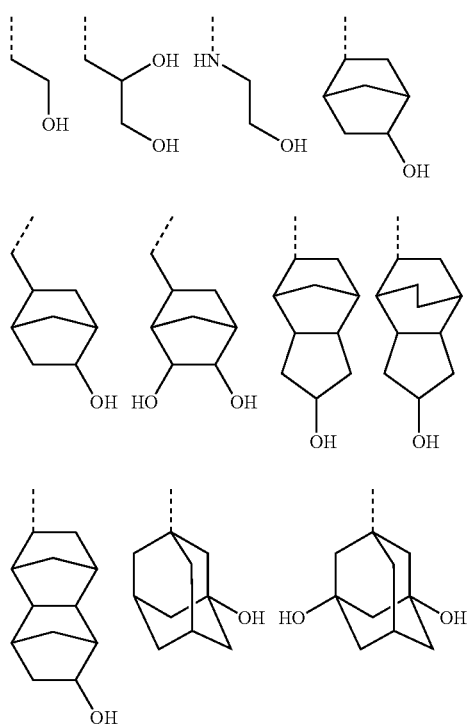

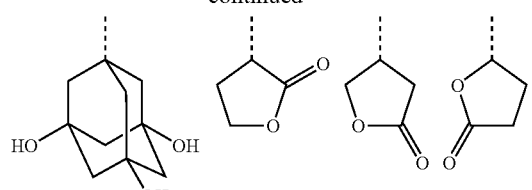

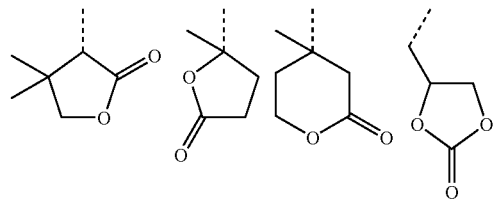

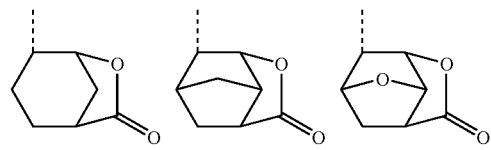

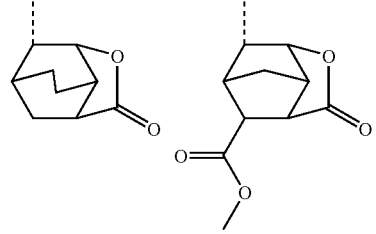

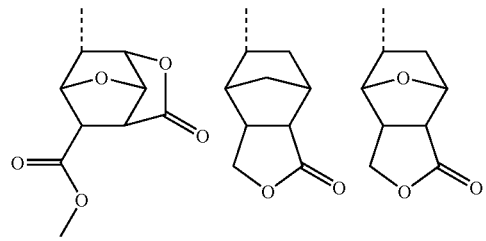

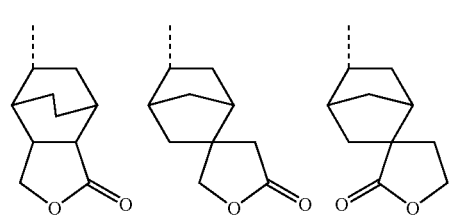

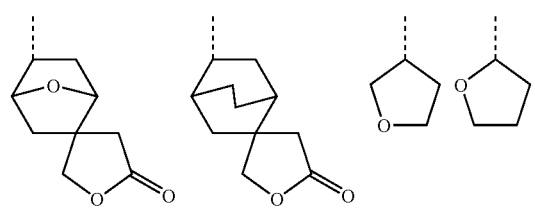

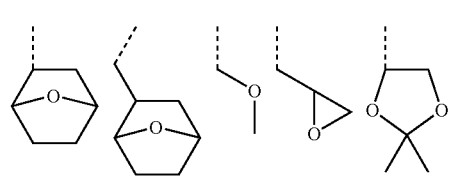

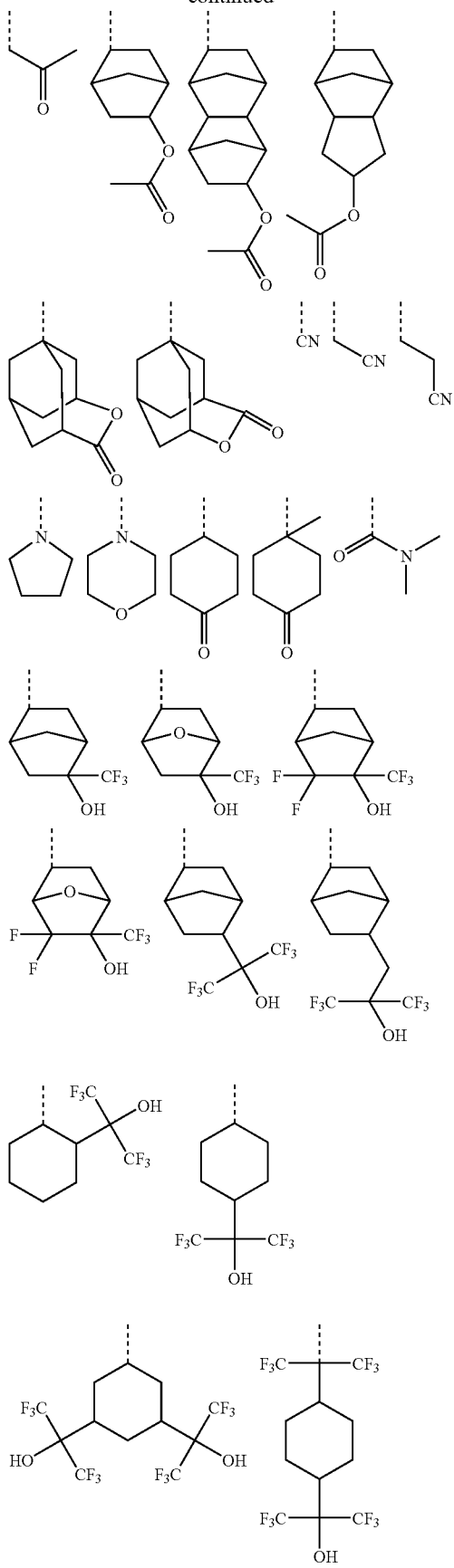

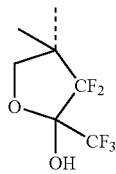

In these formulae and throughout the specification, a broken line denotes a valence bond.

Suitable divalent organic groups represented by $R^{10}$ include $C_1$-$C_{20}$ alkylene groups such as methylene as well as groups of the following formulae.

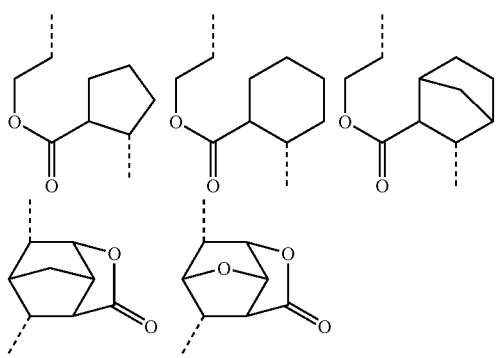

The polymers (A) or (A1) disclosed herein may be synthesized by general polymerization processes including radical copolymerization using initiators such as 2,2'-azobisisobutyronitrile (AIBN), ionic (or anionic) polymerization using alkyllithium, and the like. The polymerization may be carried out by its standard technique. Preferably the polymers are prepared by radical polymerization while the polymerization conditions may be determined in accordance with the type of initiator, temperature, pressure, concentration, solvent, additives, and the like.

Examples of the radical initiator used herein include azo compounds such as 2,2'-azobisisobutyronitrile (AIBN), 2,2'-azobis(4-methoxy-2,4-dimethylvaleronitrile), 2,2'-azobis(2,4-dimethylvaleronitrile), 2,2'-azobis(2,4,4-trimethylpentane), dimethyl 2,2'-azobis(isobutyrate); peroxides such as tert-butylperoxypivalate, lauroyl peroxide, benzoyl peroxide, tert-butylperoxylaurate; water-soluble polymerization initiators such as potassium persulfate; and redox initiators comprising a peroxide (e.g., potassium persulfate or hydrogen peroxide) combined with a reducing agent (e.g., sodium sulfite). Although the amount of polymerization initiator used may vary with its type and other polymerization conditions, it is generally used in an amount of 0.001 to 10 mol %, and preferably 0.01 to 5 mol % based on the total moles of monomers to be polymerized.

During the synthesis of the polymer (A) or (A1), any known chain transfer agent such as dodecyl mercaptan or 2-mercaptoethanol may be added for molecular weight control purpose. The amount of chain transfer agent added is preferably 0.01 to 10 mol % based on the total moles of monomers to be polymerized.

If necessary, a solvent may be used during the synthesis of the polymer (A) or (A1). Any solvent may be used as long as it does not interfere with the desired polymerization reaction. Examples of suitable organic solvents used herein include esters such as ethyl acetate, n-butyl acetate, and γ-butyrolactone; ketones such as acetone, methyl ethyl ketone, and methyl isobutyl ketone; aliphatic or aromatic hydrocarbons such as toluene, xylene and cyclohexane; alcohols such as isopropyl alcohol and ethylene glycol monomethyl ether; and ether solvents such as diethyl ether, dioxane, and tetrahydrofuran, which may be used alone or in admixture. Although the amount of solvent used may vary with the desired degree of polymerization (or molecular weight), the amount of initiator added, and other polymerization conditions such as polymerization temperature, it is generally used in such an amount as to provide a concentration of 0.1 to 95% by weight, preferably 5 to 90% by weight of monomers to be polymerized.

Although the temperature of the polymerization reaction may vary with the identity of polymerization initiator or the boiling point of solvent, it is preferably 20 to 200° C., and more preferably 50 to 140° C. Any desired reactor or vessel may be used for the polymerization reaction.

From the solution or dispersion of the polymer thus synthesized, the organic solvent or water serving as the reaction medium is removed by any of well-known techniques. Suitable techniques include, for example, re-precipitation followed by filtration, and heat distillation under vacuum.

Desirably the polymer (A) or (A1) has a weight average molecular weight (Mw) of 1,000 to 500,000, and especially 2,000 to 30,000, as determined by gel permeation chromatography (GPC) using polystyrene standards. This is because a polymer with too low a Mw may be more miscible with the resist material or more dissolvable in water whereas too high a Mw may interfere with film formation after spin coating and lead to a decline of alkali solubility.

In the polymer (A) or (A1), the acid labile groups presented by $R^3$ in formula (1), $R^5$ in formula (2) and $R^6$ in formula (3) may be introduced into a polymer by post-protection reaction according to the reaction scheme shown below. Specifically, once a polymer wherein $R^3$, $R^5$ and $R^6$ are hydrogen is prepared, it is reacted with 1 to 2 equivalents (based on a molar number of hydroxyl groups) of a base, and then with 1 to 2 equivalents (based on the base) of R—X. This results in a compound corresponding to polymer (A) or (A1).

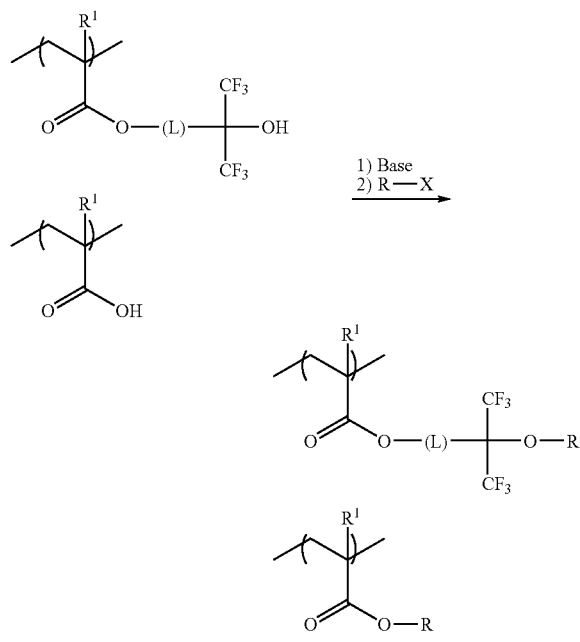

Herein $R^1$ is as defined above, R is $R^3$, $R^5$ or $R^6$, and X is chlorine, bromine or iodine. Any desired solvent may be used in the reaction. Typically the solvent may be selected from hydrocarbons such as benzene and toluene, and ethers such as dibutyl ether, diethylene glycol diethyl ether, diethylene glycol dimethyl ether, tetrahydrofuran, 1,4-dioxane, and mixtures thereof. Suitable bases include, but are not limited to, sodium hydride, n-butyllithium, lithium diisopropylamide, triethylamine, and pyridine.

In the polymers (A) or (A1) wherein U1 stands for a total molar number of a monomer corresponding to units of formula (1) or (1a), U2 stands for a total molar number of a monomer corresponding to units of formula (2), and U3 stands is for a total molar number of a monomer corresponding to units of formula (3), with the proviso that U1+U2+U3=U, a proportion of U1, U2 and U3 is preferably determined so as to meet:

$0 \leq U1/U < 1.0$, more preferably $0.4 \leq U1/U \leq 0.9$, even more preferably $0.5 \leq U1/U \leq 0.8$, $0 \leq U2/U < 1.0$, more preferably $0 \leq U2/U \leq 0.6$, even more preferably $0 \leq U2/U \leq 0.5$, and $0 \leq U3/U < 1.0$, more preferably $0 \leq U3/U \leq 0.6$, even more preferably $0 \leq U3/U \leq 0.5$.

In the embodiment wherein repeat units of formulae (4a) to (4d) are incorporated into the polymers for the purpose of improving their function, provided that U4 stands for a total molar number of monomers corresponding to units of formulae (4a) to (4d) and U1+U2+U3+U4=U', a ratio of U to U' is preferably determined so as to meet $0 < U/U' \leq 1.0$, more preferably $0.5 \leq U/U' \leq 1.0$, and even more preferably $0.7 \leq U/U1 \leq 1.0$.

In the embodiment wherein polymer (A) or (A1) is used as an additive to resist material, it is combined with base polymer (B) preferably in such amounts that the amount of polymer (A) or (A1) is 0.1 to 50 parts, more preferably 0.5 to 10 parts by weight per 100 parts by weight of base polymer (B). At least 0.1 phr of the additive polymer is effective in forming a photoresist film having an increased receding contact angle with water on its surface. Up to 50 phr of the additive polymer ensures to form a photoresist film having a low dissolution rate in an alkaline developer, maintaining the height of a fine pattern formed therefrom.

The resist composition is typically a chemically amplified positive resist composition. Base polymer (B) to be combined with polymer (A) or (A1) is a polymer having a lactone ring and/or maleic anhydride-derived structure which becomes soluble in an alkaline developer under the action of an acid. Suitable polymers or base resins (B) include polymers of (meth)acrylic acid esters, copolymers of (α-trifluoromethyl) acrylate and maleic anhydride, alternating copolymers of cycloolefins and maleic anhydride, polynorbornen, cycloolefin metathesis ring-opening polymers, hydrogenated products of cycloolefin metathesis ring-opening polymers, and the like. Specifically the base polymer (B) used herein includes, but is not limited to, those polymers comprising units of the following formula (R1) and/or (R2) and having a weight average molecular weight (Mw) of 1,000 to 100,000, and especially 3,000 to 30,000, as measured by GPC versus polystyrene standards.

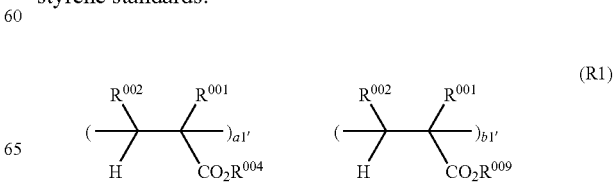
(R1)

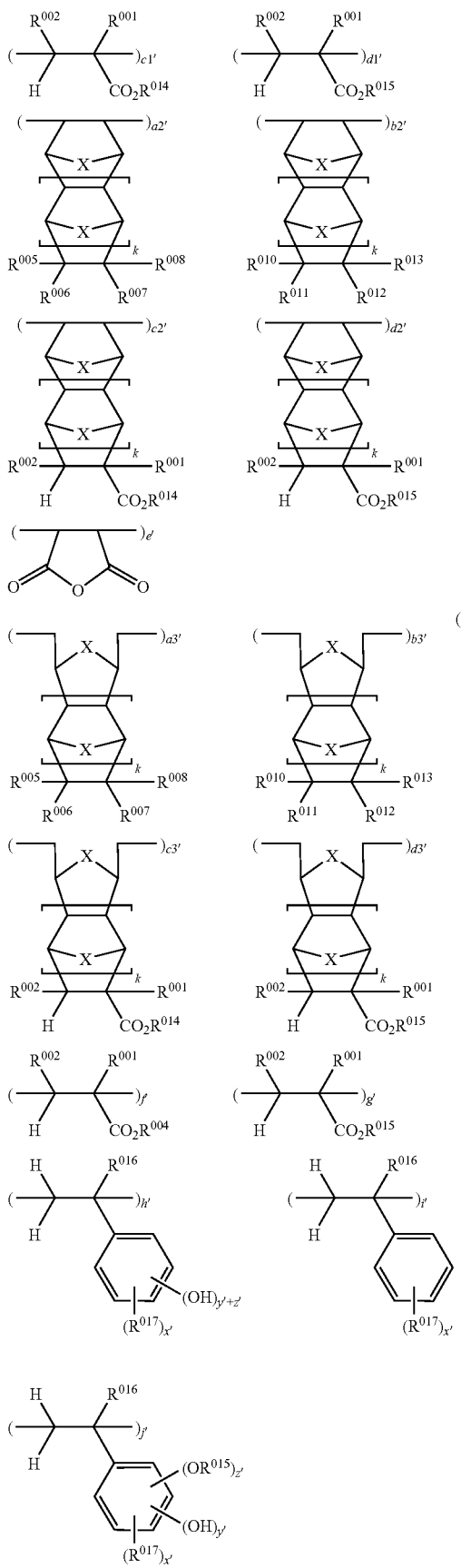
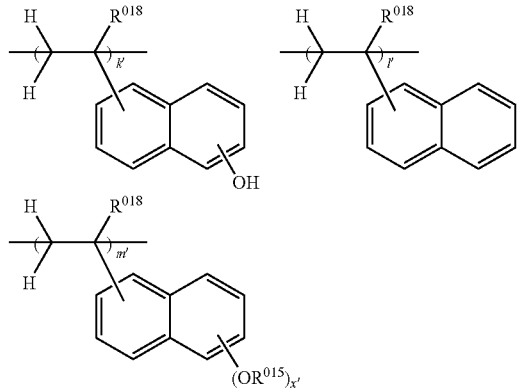

Herein, $R^{001}$ is hydrogen, methyl, trifluoromethyl or —$CH_2CO_2R^{003}$.

$R^{002}$ is hydrogen, methyl or —$CO_2R^{003}$.

$R^{003}$ is a straight, branched or cyclic $C_1$-$C_{10}$ alkyl group, for example, methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl, and butyladamantyl.

$R^{004}$ is hydrogen or a monovalent $C_1$-$C_{15}$ hydrocarbon group having at least one of fluorinated substituent groups, carboxyl groups and hydroxyl groups, for example, hydrogen, carboxyethyl, carboxybutyl, carboxycyclopentyl, carboxycyclohexyl, carboxynorbornyl, carboxyadamantyl, hydroxyethyl, hydroxybutyl, hydroxycyclopentyl, hydroxycyclohexyl, hydroxynorbornyl, hydroxyadamantyl, hydroxyhexafluoroisopropylcyclohexyl, and di(hydroxyhexafluoroisopropyl)cyclohexyl.

At least one of $R^{005}$ to $R^{008}$ represents a monovalent $C_1$-$C_{15}$ hydrocarbon group having at least one of fluorinated substituent groups, carboxyl groups and hydroxyl groups while the remaining R's independently represent hydrogen or straight, branched or cyclic $C_1$-$C_{15}$ alkyl groups. Examples of the monovalent $C_1$-$C_{15}$ hydrocarbon group having at least one of fluorinated substituent groups, carboxyl groups and hydroxyl groups include carboxy, carboxymethyl, carboxyethyl, carboxybutyl, hydroxymethyl, hydroxyethyl, hydroxybutyl, 2-carboxyethoxycarbonyl, 4-carboxybutoxycarbonyl, 2-hydroxyethoxycarbonyl, 4-hydroxybutoxycarbonyl, carboxycyclopentyloxycarbonyl, carboxycyclohexyloxycarbonyl, carboxynorbornyloxycarbonyl, carboxyadamantyloxycarbonyl, hydroxycyclopentyloxycarbonyl, hydroxycyclohexyloxycarbonyl, hydroxynorbornyloxycarbonyl, hydroxyadamantyloxycarbonyl, hydroxyhexafluoroisopropylcyclohexyloxycarbonyl, and di(hydroxyhexafluoroisopropyl)cyclohexyloxycarbonyl.

Examples of the straight, branched or cyclic $C_1$-$C_{15}$ alkyl group are the same as exemplified for $R^{003}$.

Alternatively, two of $R^{005}$ to $R^{008}$ (e.g., $R^{005}$ and $R^{006}$, $R^{006}$ and $R^{007}$) may bond together to form a ring with the carbon atom(s) to which they are attached. In that event, at least one of ring-forming $R^{005}$ to $R^{008}$ is a divalent $C_1$-$C_{15}$ hydrocarbon group having at least one of fluorinated substituent groups, carboxyl groups and hydroxyl groups, while the remaining are independently a single bond or a straight, branched or cyclic $C_1$-$C_{15}$ alkylene group. Examples of the divalent $C_1$-$C_{15}$ hydrocarbon group having at least one of fluorinated substituent groups, carboxyl groups and hydroxyl groups include the groups exemplified as the monovalent hydrocarbon group having at least one of fluorinated substituent groups, carboxyl groups and hydroxyl groups, with one hydrogen atom eliminated therefrom. Examples of the straight, branched or cyclic $C_1$-$C_{15}$ alkylene groups include the groups exemplified for $R^{003}$, with one hydrogen atom eliminated therefrom.

$R^{009}$ is a monovalent $C_1$-$C_{15}$ hydrocarbon group containing a —$CO_2$— partial structure, for example, 2-oxooxolan-3-yl, 4,4-dimethyl-2-oxooxolan-3-yl, 4-methyl-2-oxooxan-4-yl, 2-oxo-1,3-dioxolan-4-ylmethyl, and 5-methyl-2-oxooxolan-5-yl.

At least one of $R^{010}$ to $R^{013}$ is a monovalent $C_2$-$C_{15}$ hydrocarbon group containing a —$CO_2$— partial structure, while the remaining R's are independently hydrogen or straight, branched or cyclic $C_1$-$C_{15}$ alkyl groups. Examples of the monovalent $C_2$-$C_{15}$ hydrocarbon group containing a —$CO_2$— partial structure include 2-oxooxolan-3-yloxycarbonyl, 4,4-dimethyl-2-oxooxolan-3-yloxycarbonyl, 4-methyl-2-oxooxan-4-yloxycarbonyl, 2-oxo-1,3-dioxolan-4-ylmethyloxycarbonyl, and 5-methyl-2-oxooxolan-5-yloxycarbonyl. Examples of the straight, branched or cyclic $C_1$-$C_{15}$ alkyl groups are the same as exemplified for $R^{003}$.

Alternatively, two of $R^{010}$ to $R^{013}$ (e.g., $R^{010}$ and $R^{011}$, $R^{011}$ and $R^{012}$) may bond together to form a ring with the carbon atom(s) to which they are attached. In that event, at least one of ring-forming $R^{010}$ to $R^{013}$ is a divalent $C_2$-$C_{15}$ hydrocarbon group containing a —$CO_2$— partial structure, while the remaining are independently a single bond or a straight, branched or cyclic $C_1$-$C_{15}$ alkylene group. Examples of the divalent $C_2$-$C_{15}$ hydrocarbon group containing a —$CO_2$— partial structure include 1-oxo-2-oxapropane-1,3-diyl, 1,3-dioxo-2-oxapropane-1,3-diyl, 1-oxo-2-oxabutane-1,4-diyl, and 1,3-dioxo-2-oxabutane-1,4-diyl, as well as the groups exemplified as the monovalent hydrocarbon group containing a —$CO_2$— partial structure, with one hydrogen atom eliminated therefrom. Examples of the straight, branched or cyclic $C_1$-$C_{15}$ alkylene groups include the groups exemplified for $R^{003}$, with one hydrogen atom eliminated therefrom.

$R^{014}$ is a polycyclic $C_7$-$C_{15}$ hydrocarbon group or an alkyl group containing such a polycyclic hydrocarbon group, for example, norbornyl, bicyclo[3.3.1]nonyl, tricyclo[5.2.1.0$^{2,6}$]decyl, adamantyl, ethyladamantyl, butyladamantyl, norbornylmethyl, and adamantylmethyl.

$R^{015}$ is an acid labile group.

X is —$CH_2$ or an oxygen atom.

The subscript k is 0 or 1.

The acid labile groups represented by $R^{015}$ may be selected from a variety of such groups. Examples of the acid labile group are groups of the general formulae (L1) to (L4), tertiary alkyl groups of 4 to 20 carbon atoms, preferably 4 to 15 carbon atoms, trialkylsilyl groups in which each alkyl moiety has 1 to 6 carbon atoms, and oxoalkyl groups of 4 to 20 carbon atoms. Examples are the same as illustrated for the acid labile groups $R^3$, $R^5$ and $R^6$ in formula (1) to (3).

In formula (R2), $R^{016}$ and $R^{018}$ are hydrogen or methyl. $R^{017}$ is a straight, branched or cyclic $C_1$-$C_8$ alkyl.

In formula (R1), the subscripts a1', a2', a3', b1', b2', b3', c1', c2', c3', d1', d2', d3' and e' are numbers from 0 to less than 1, satisfying a1'+a2'+a3'+b1'+b2'+b3'+c1'+c2'+c3'+d1'+d2'+d3'+e'=1. In formula (R2), f', g', h', i', j', k', l' and m' are numbers from 0 to less than 1, satisfying f'+g'+h'+i'+j'+k'+l'+m'=1; x', y' and z' are each an integer of 0 to 3, satisfying 1≦x'+y'+z'≦5 and 1≦y'+z'≦3.

Additionally, any of indene, norbornadiene, acenaphthylene, and vinyl ether monomers may be copolymerized.

Examples of the repeat units incorporated at compositional ratio a1' in formula (R1) are shown below, though not limited thereto.

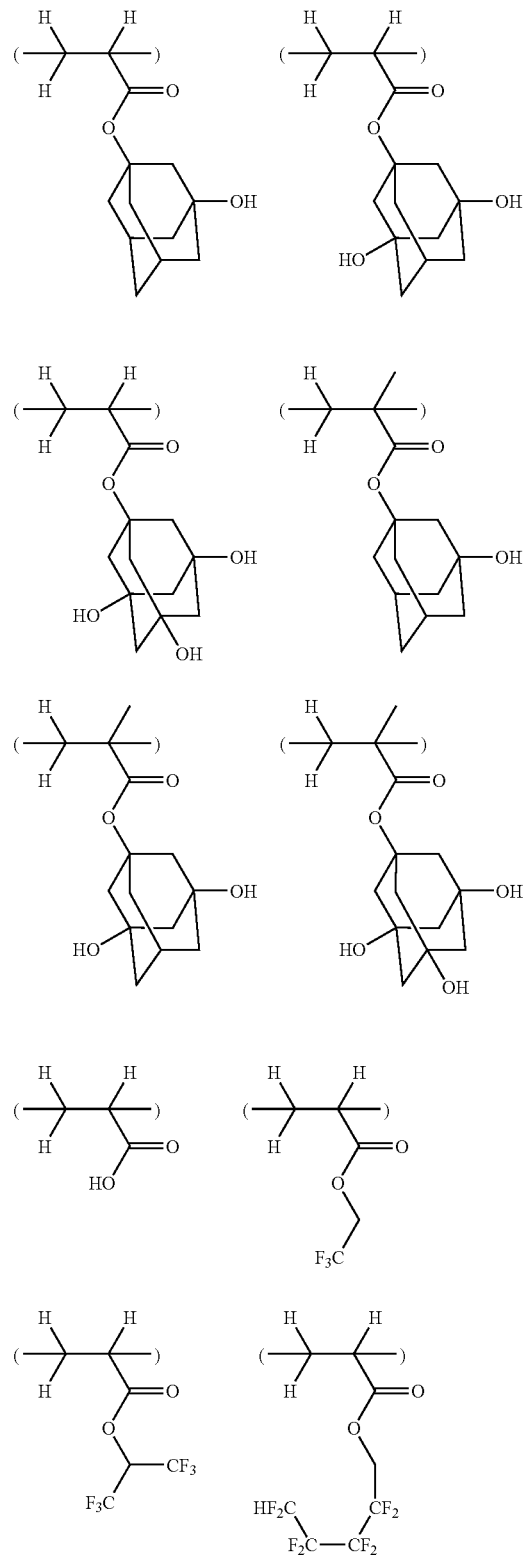

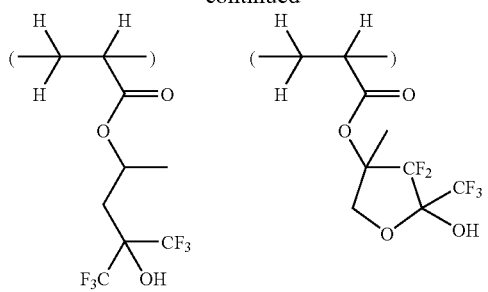
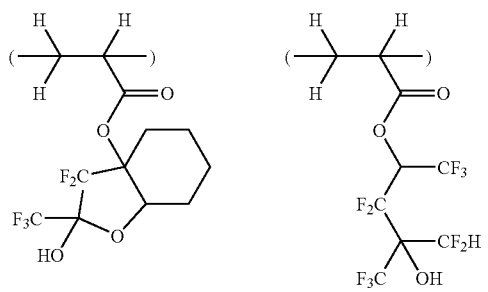
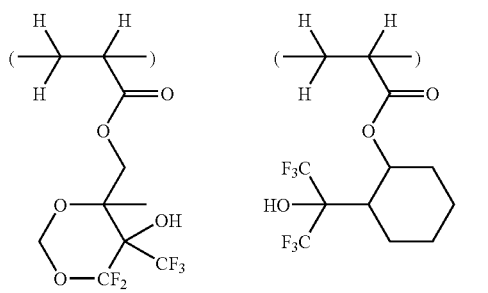
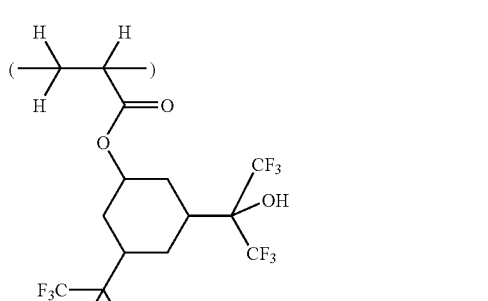
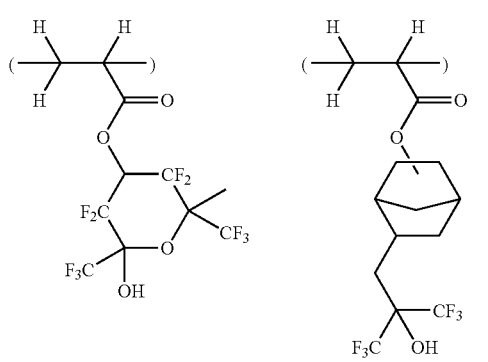
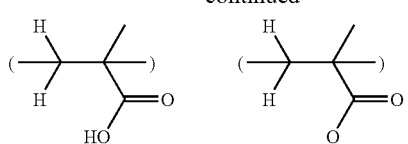
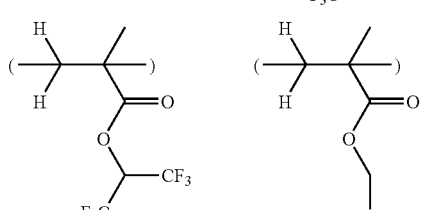
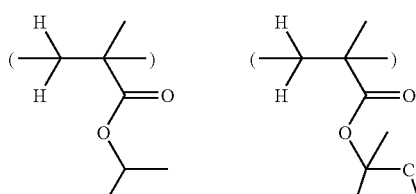
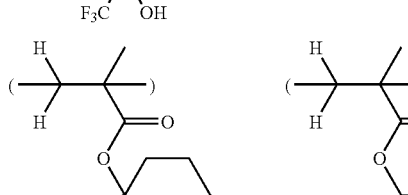
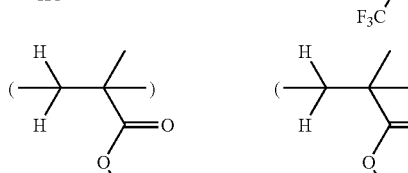
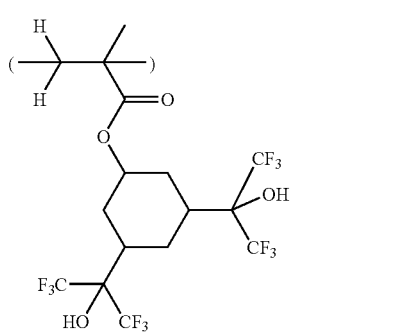

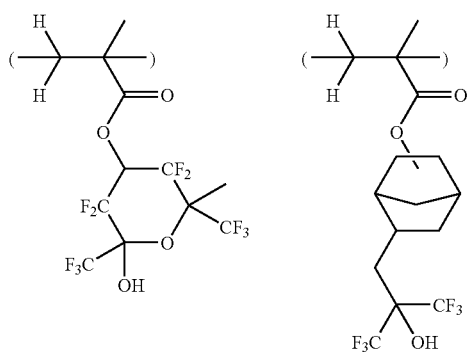
Examples of the repeat units incorporated at compositional ratio b1' in formula (R1) are shown below, though not limited thereto.
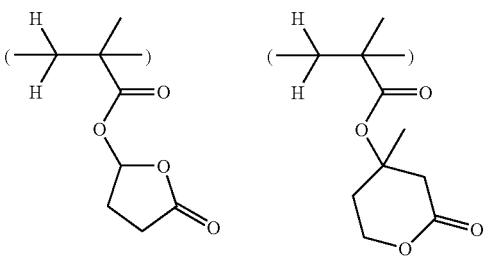
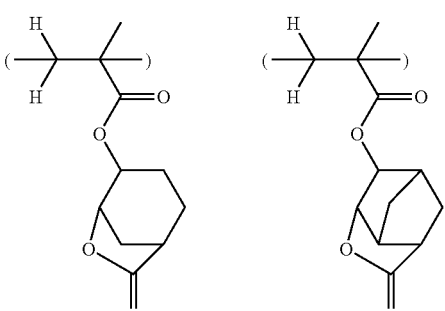
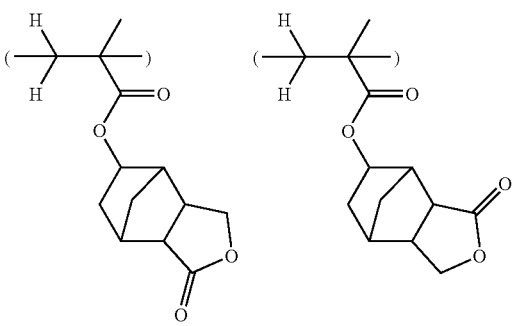
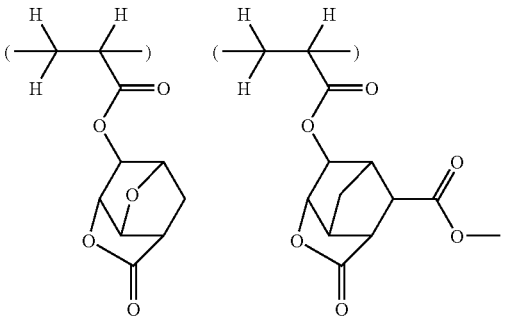
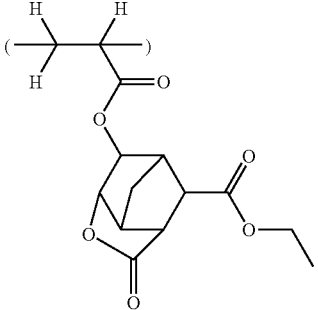

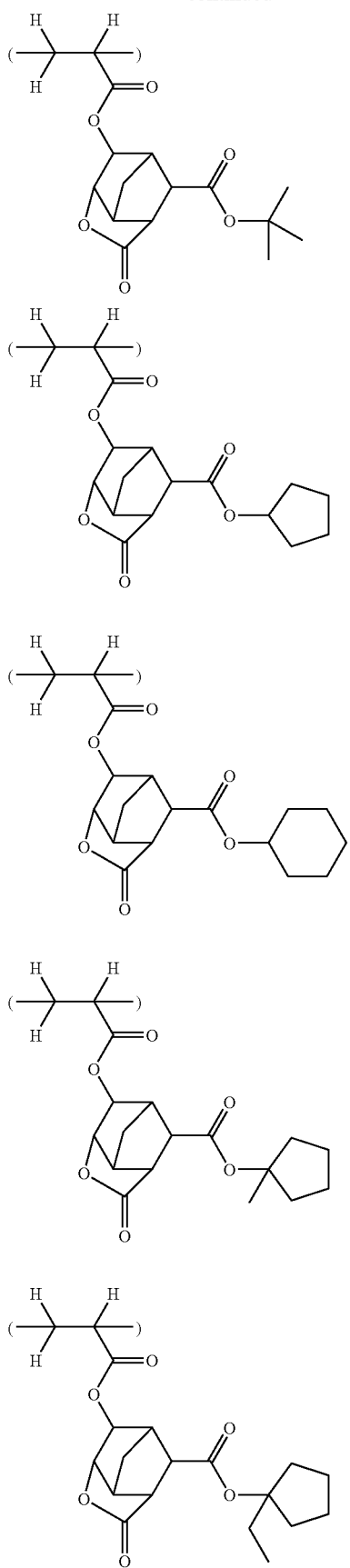
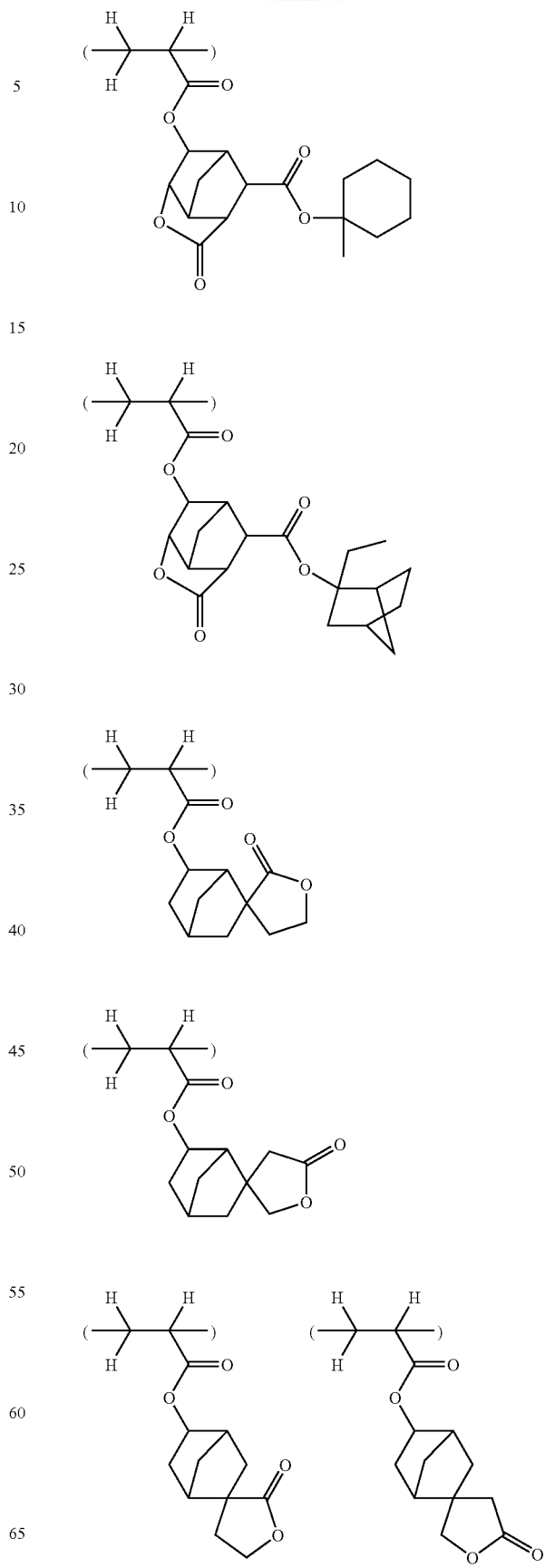

67
-continued
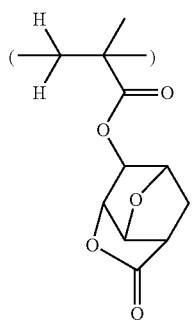
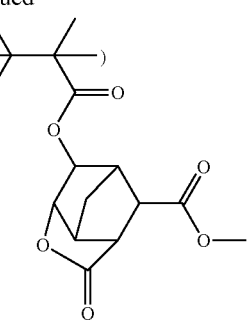
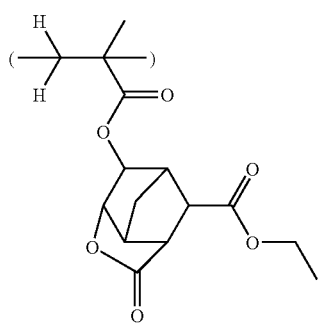
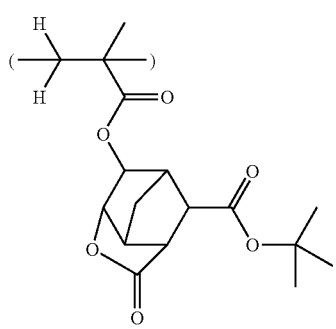
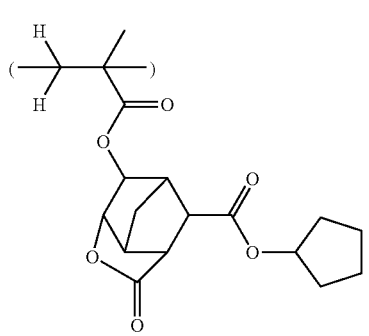
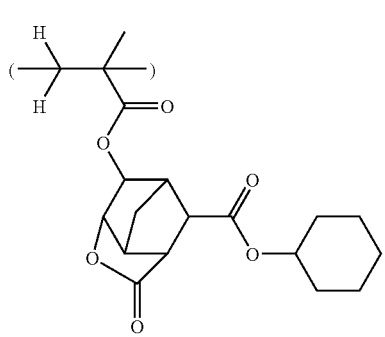
68
-continued
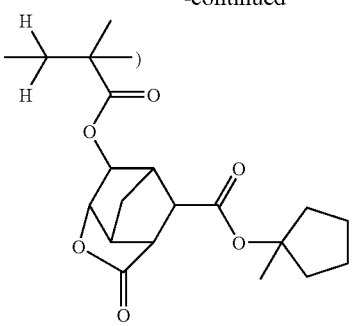
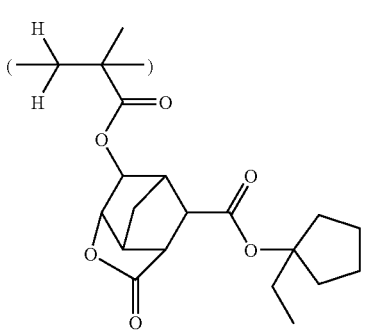
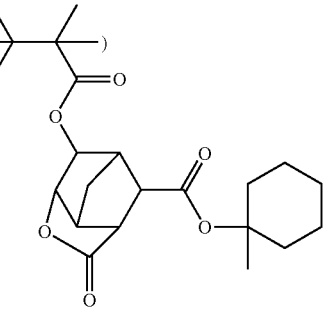
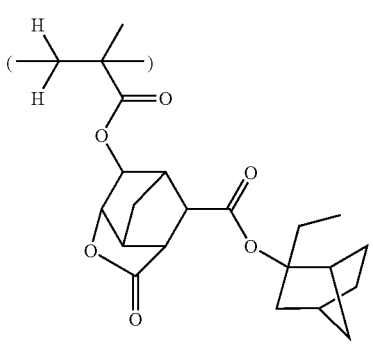
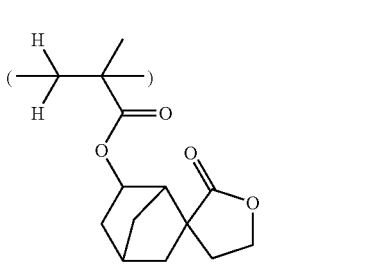

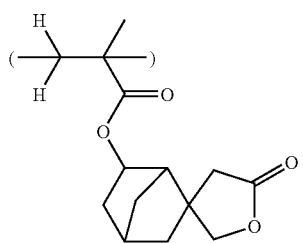
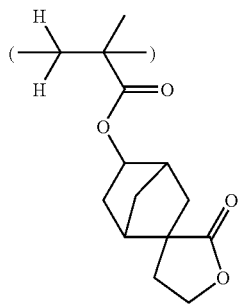
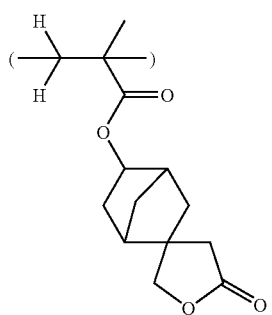
Examples of the repeat units incorporated at compositional ratio d1' in formula (R1) are shown below, though not limited thereto.
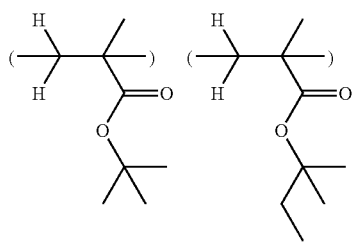
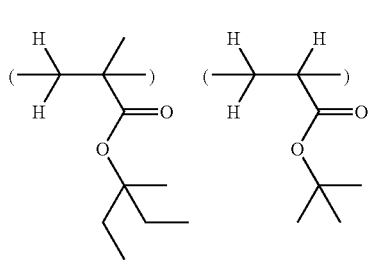
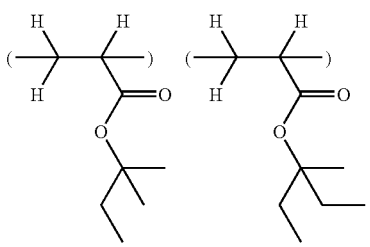
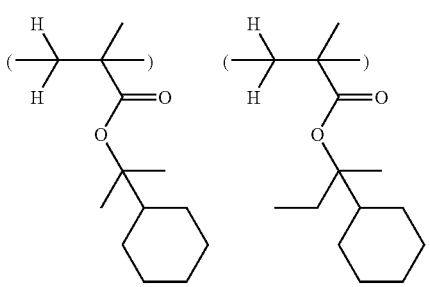
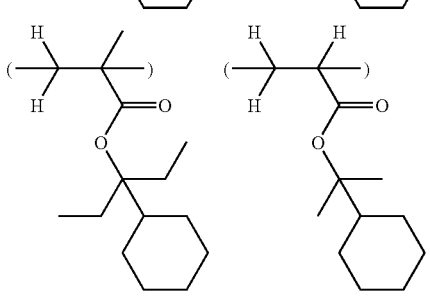
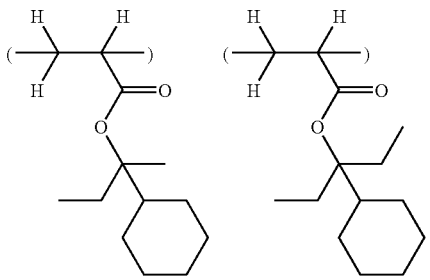
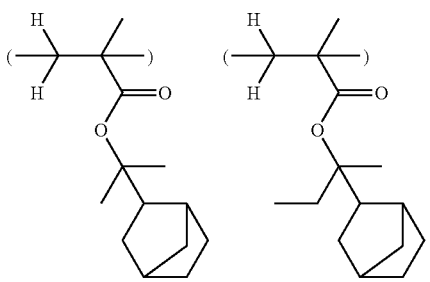
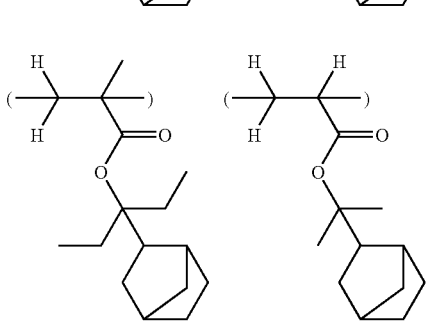

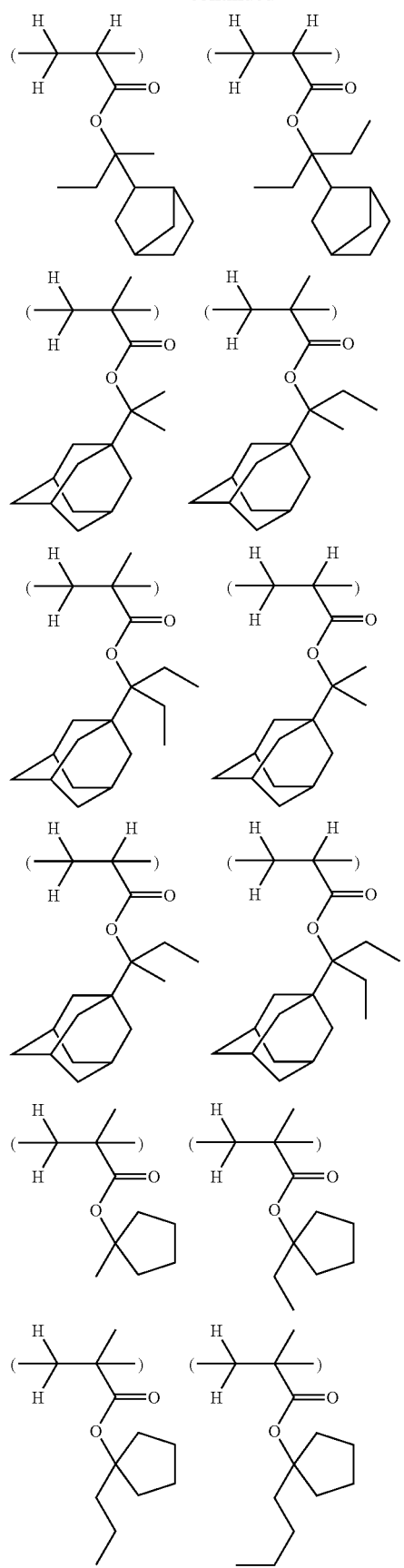
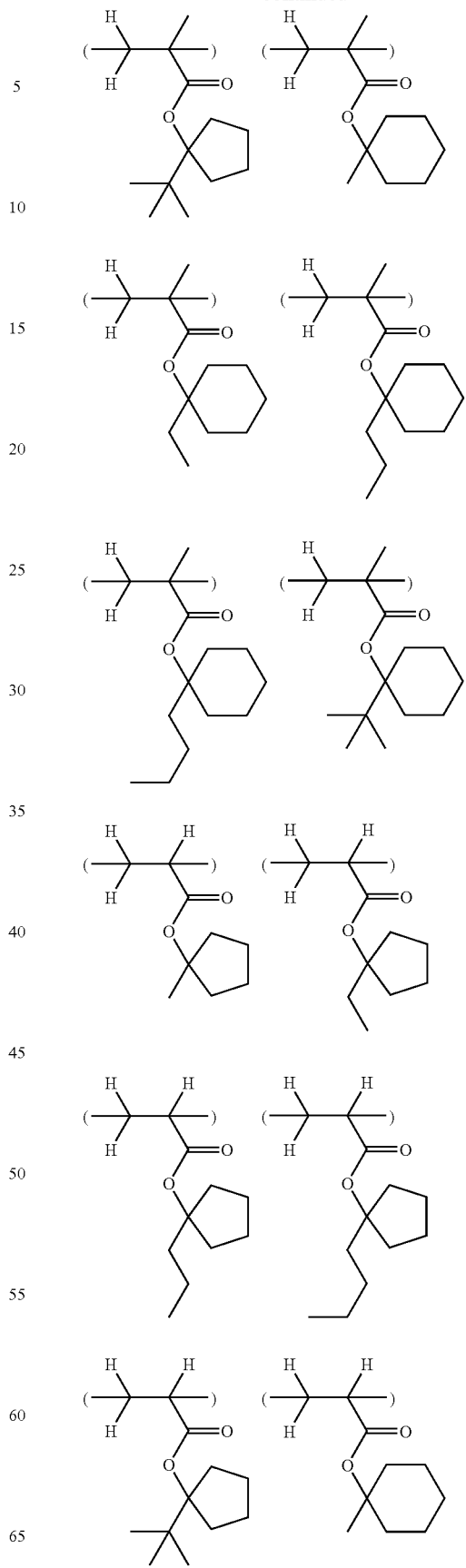

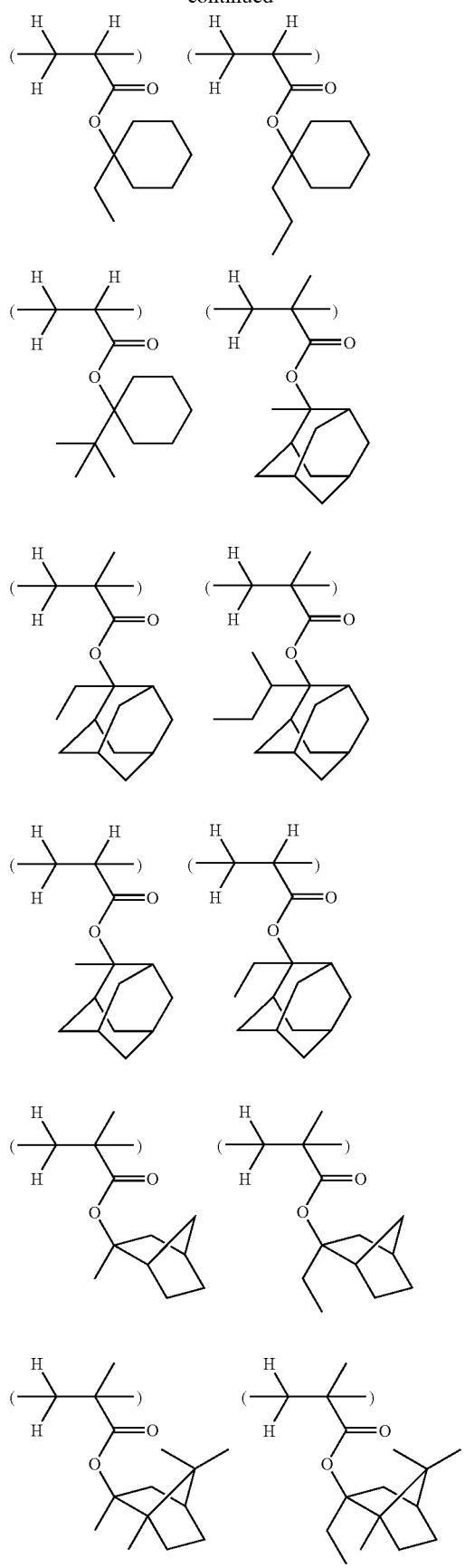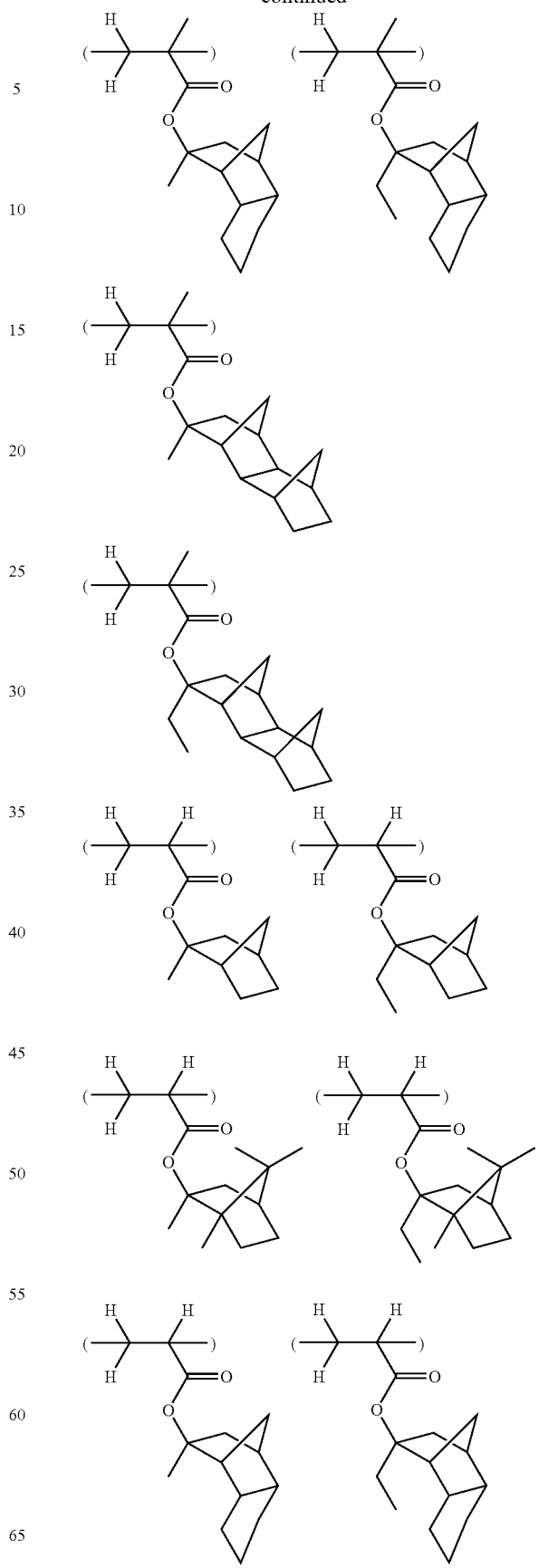

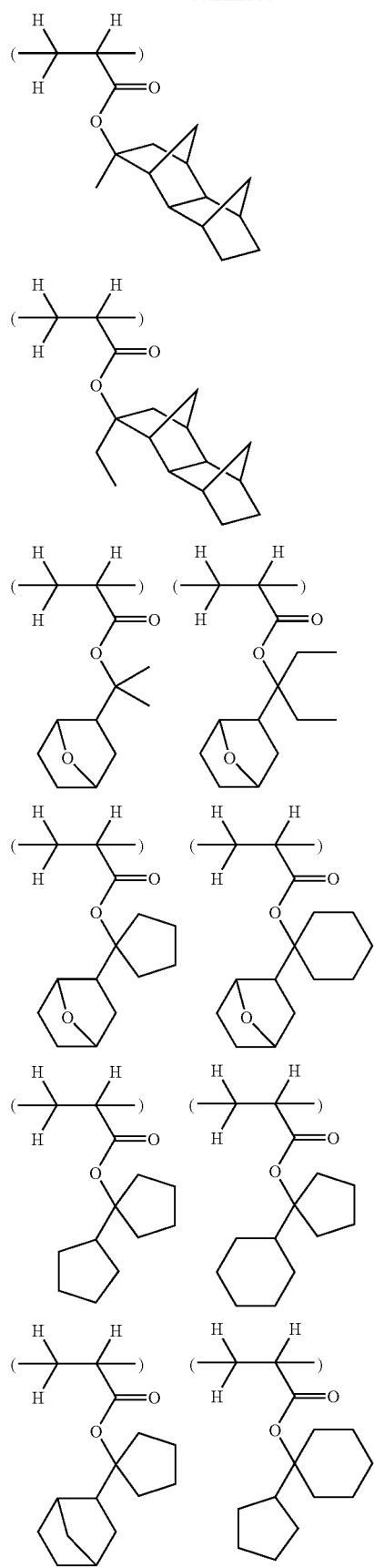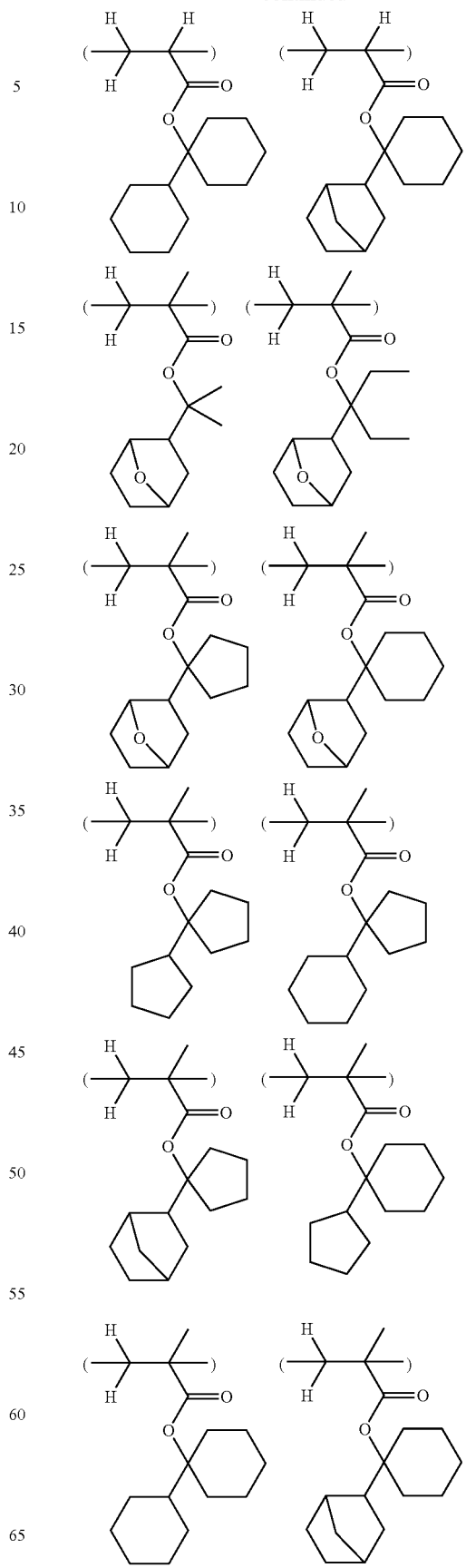

77
-continued
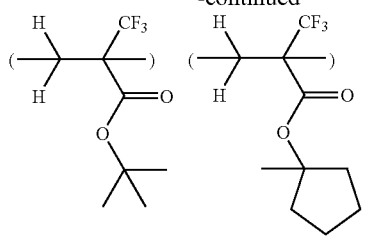
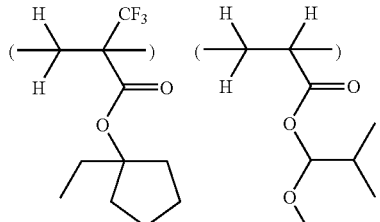
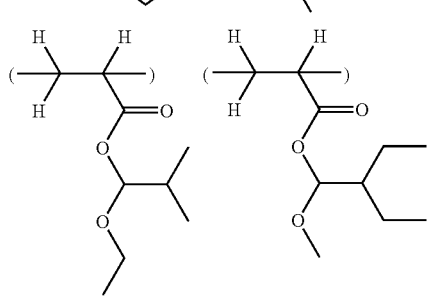
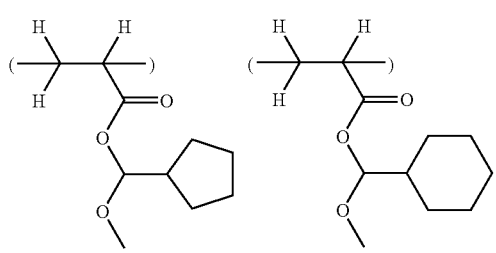
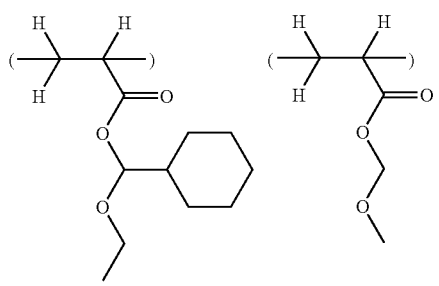
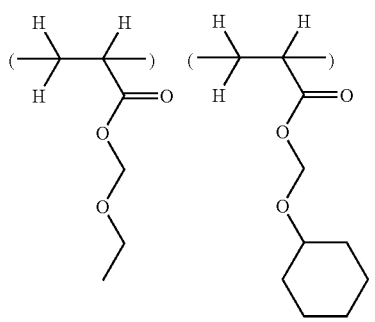
78
-continued
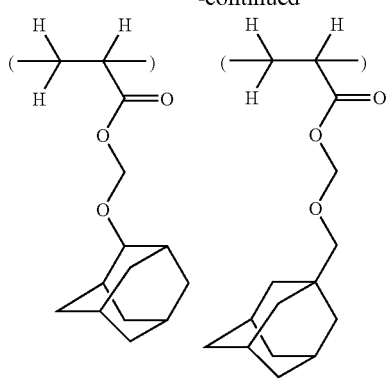
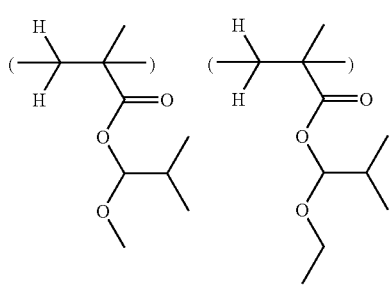
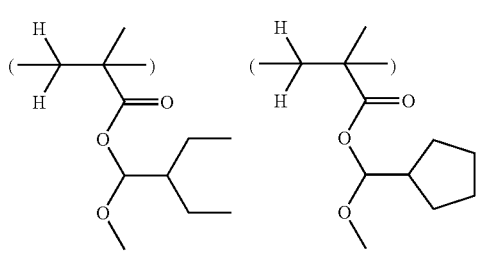
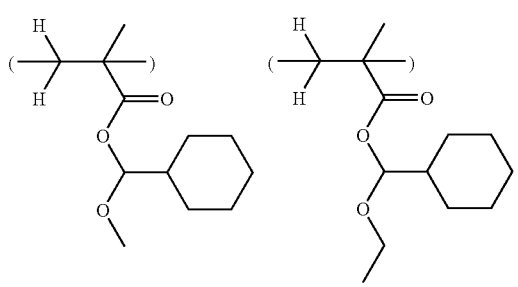
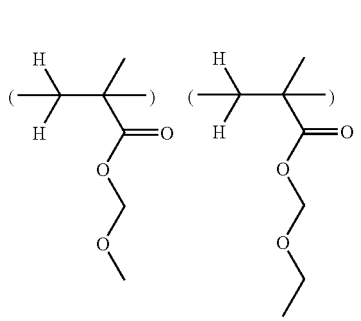

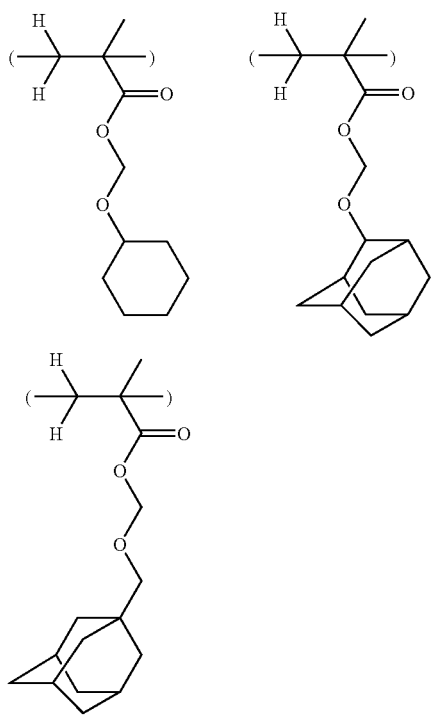
Examples of the repeat units incorporated at compositional ratio a3', b3', c3' and d3' in formula (R1) are shown below, though not limited thereto.
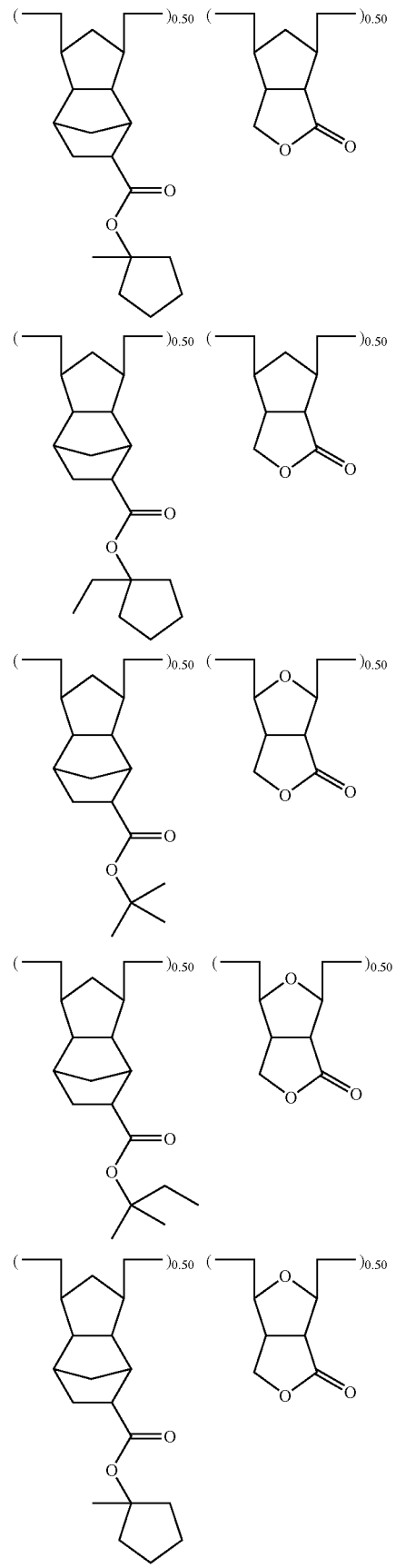

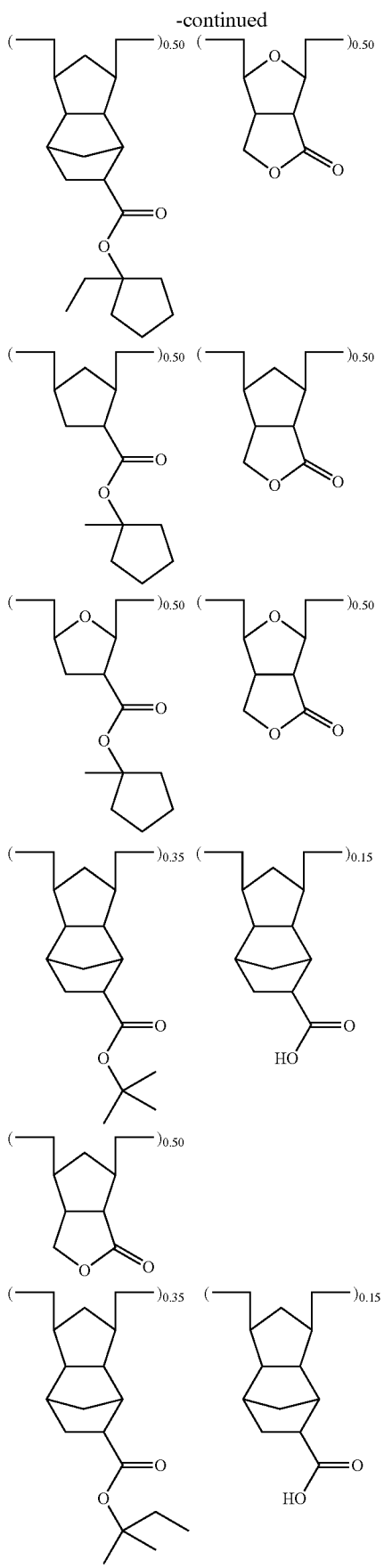
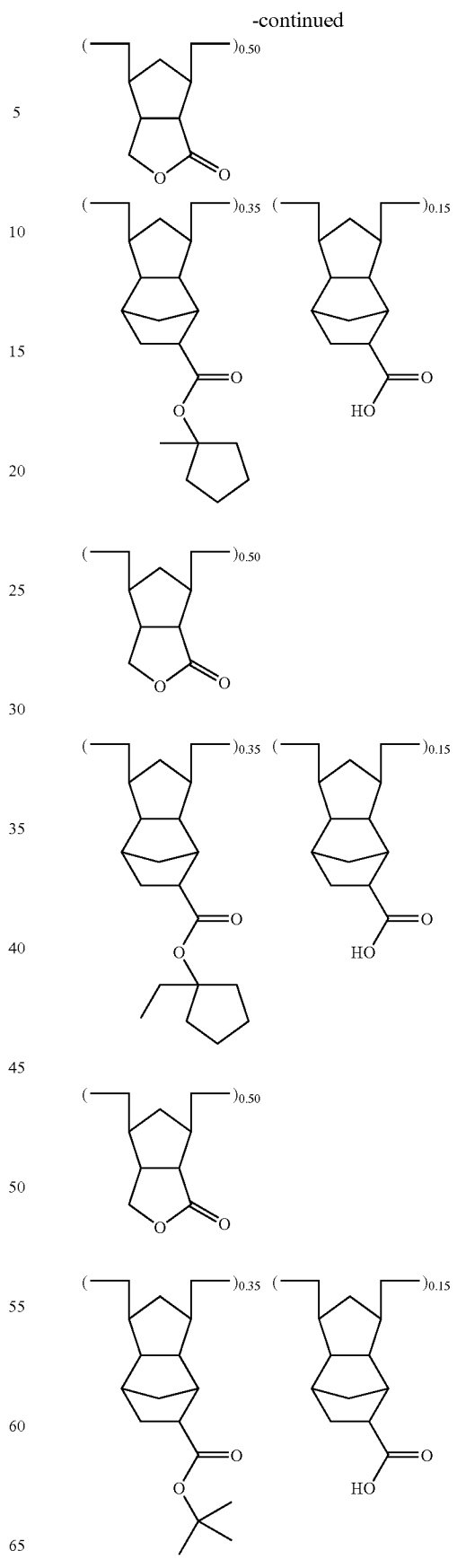

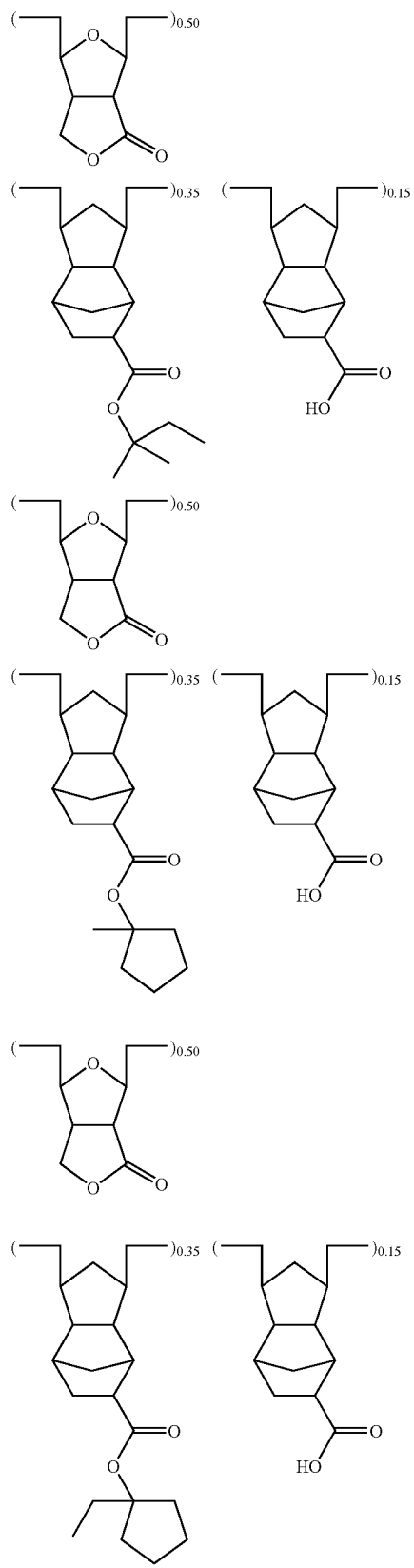
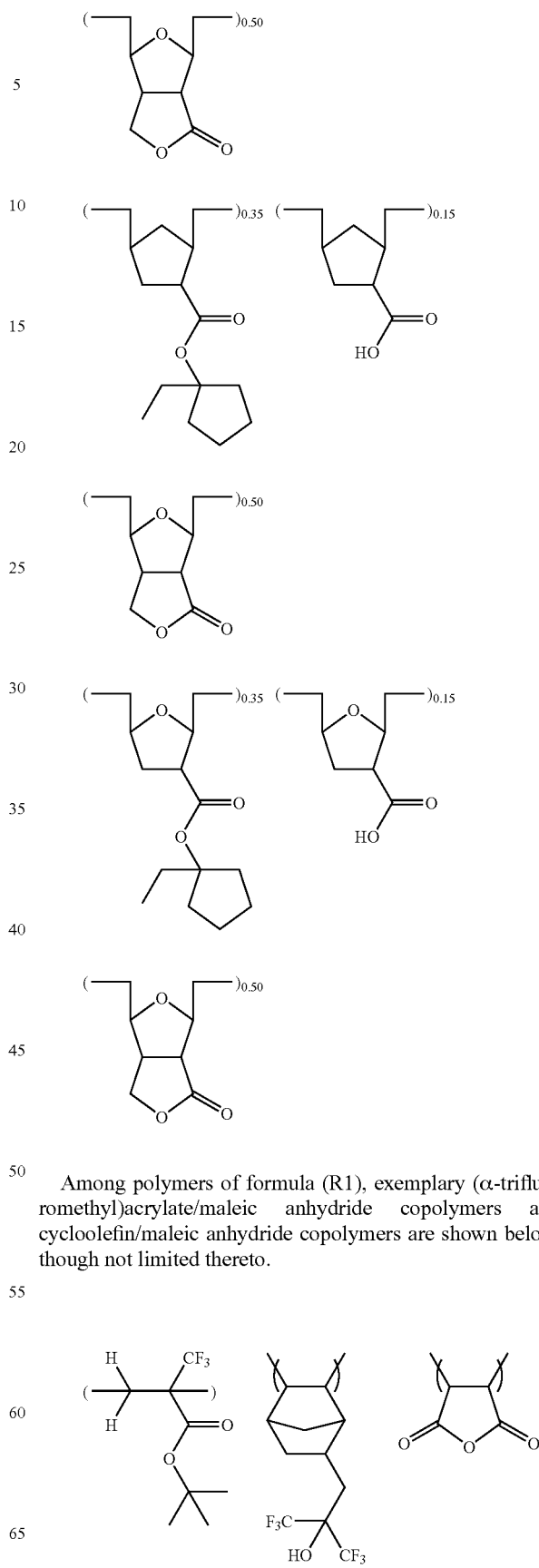
Among polymers of formula (R1), exemplary (α-trifluoromethyl)acrylate/maleic anhydride copolymers and cycloolefin/maleic anhydride copolymers are shown below, though not limited thereto.

-continued

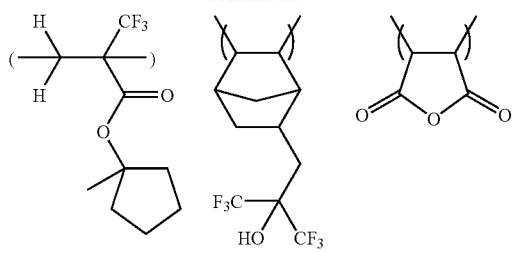
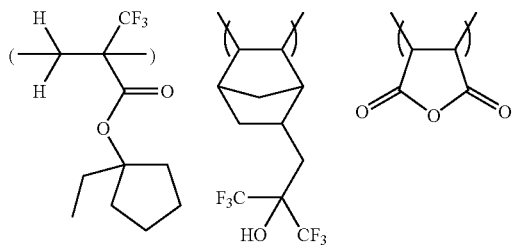
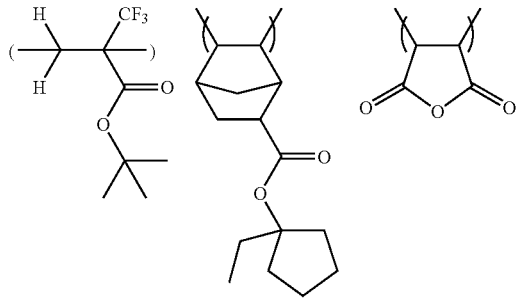
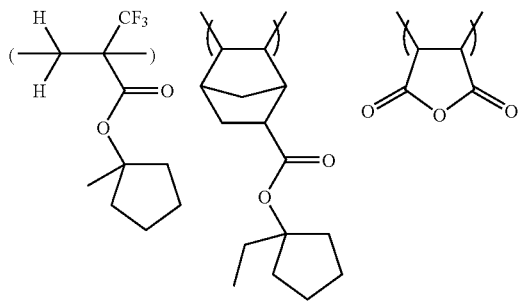
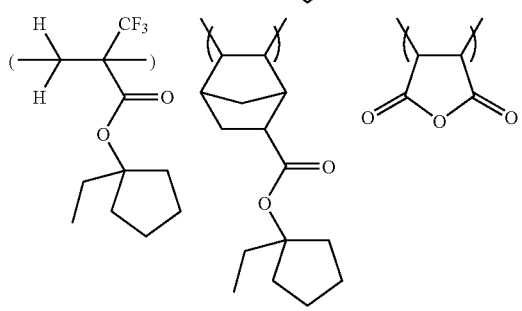
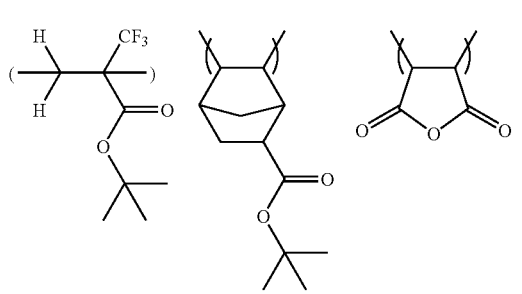

-continued

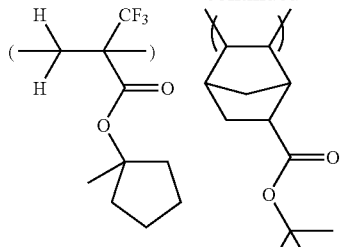
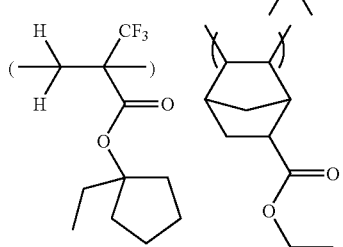
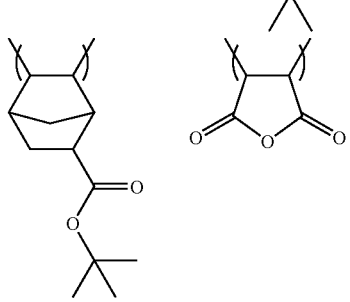
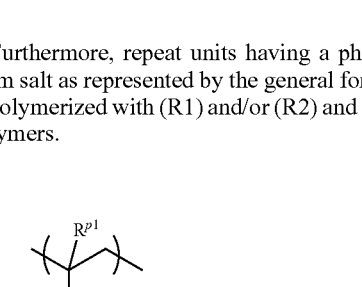
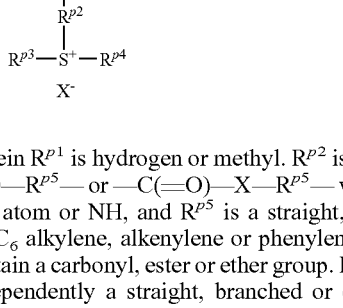

Furthermore, repeat units having a photosensitive sulfonium salt as represented by the general formula (PA) may be copolymerized with (R1) and/or (R2) and incorporated in the polymers.

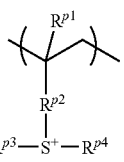

(PA)

$$R^{p3}-S^+-R^{p4}$$
$$X^-$$

Herein $R^{p1}$ is hydrogen or methyl. $R^{p2}$ is a phenylene group, —O—$R^{p5}$— or —C(=O)—X—$R^{p5}$— wherein X is an oxygen atom or NH, and $R^{p5}$ is a straight, branched or cyclic $C_1$-$C_6$ alkylene, alkenylene or phenylene group which may contain a carbonyl, ester or ether group. $R^{p3}$ and $R^{p4}$ are each independently a straight, branched or cyclic $C_1$-$C_{12}$ alkyl group which may contain a carbonyl, ester or ether group, or a $C_6$-$C_{12}$ aryl group, $C_7$-$C_{20}$ aralkyl group or thiophenyl group. $X^-$ is a non-nucleophilic counter ion.

The polymer used as the base resin (B) is not limited to one type and a mixture of two or more polymers may be added. The use of plural polymers allows for easy adjustment of resist properties.

Acid Generator

In the resist composition of the invention, an acid generator, specifically a compound capable of generating an acid in response to high-energy radiation may be included in order that the resist composition function as a chemically amplified positive resist composition. The acid generator may be any compound capable of generating an acid upon exposure of high-energy radiation, which is generally referred to as "photoacid generator" or PAG. Suitable photoacid generators include sulfonium salts, iodonium salts, sulfonyldiazomethane, N-sulfonyloxyimide, and oxime-O-sulfonate acid generators. Exemplary acid generators are given below while they may be used alone or in admixture of two or more.

Sulfonium salts are salts of sulfonium cations with sulfonates, bis(substituted alkylsulfonyl)imides and tris(substituted alkylsulfonyl)methides. Exemplary sulfonium cations include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl-2-naphthylsulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, tribenzylsulfonium, diphenylmethylsulfonium, dimethylphenylsulfonium, 2-oxo-2-phenylethylthiacyclopentanium, 4-n-butoxynaphthyl-1-thiacyclopentanium, and 2-n-butoxynaphthyl-1-thiacyclopentanium.

Exemplary sulfonates include trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, 4-(4'-toluenesulfonyloxy)benzenesulfonate, naphthalenesulfonate, camphorsulfonate, octanesulfonate, dodecylbenzenesulfonate, buthanesulfonate, methanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthyloxy-1,1,3,3,3-pentafluoropropanesulfonate, 2-(4-tert-butylbenzoyloxy)-1,1,3,3,3-pentafluoropropanesulfonate, 2-adamantanecarbonyloxy-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-naphthylethanesulfonate, 1,1,2,2-tetrafluoro-2-(norbornane-2-yl)ethanesulfonate, and 1,1,2,2-tetrafluoro-2-(tetracyclo[4.4.0.1$^{2,5}$.1$^{7,10}$]dodec-3-en-8-yl)ethanesulfonate.

Exemplary bis(substituted alkylsulfonyl)imides include bistrifluoromethylsulfonylimide, bispentafluoroethylsulfonylimide, bisheptafluoropropylsulfonylimide, and 1,3-propylenebissulfonylimide. A typical tris(substituted alkylsulfonyl)methide is tristrifluoromethylsulfonylmethide. Sulfonium salts based on combination of the foregoing examples are included.

Iodonium salts are salts of iodonium cations with sulfonates, bis(substituted alkylsulfonyl)imides and tris(substituted alkylsulfonyl)methides.

Exemplary iodonium cations are aryliodonium cations including diphenyliodonium, bis(4-tert-butylphenyl)iodonium, 4-tert-butoxyphenylphenyliodonium, and 4-methoxyphenylphenyliodonium. Exemplary sulfonates include trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, 4-(4-toluenesulfonyloxy)benzenesulfonate, naphthalenesulfonate, camphorsulfonate, octanesulfonate, dodecylbenzenesulfonate, buthanesulfonate, methanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthyloxy-1,1,3,3,3-pentafluoropropanesulfonate, 2-(4-tert-butylbenzoyloxy)-1,1,3,3,3-pentafluoropropanesulfonate, 2-adamantanecarbonyloxy-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-naphthylethanesulfonate, 1,1,2,2-tetrafluoro-2-(norbornane-2-yl)ethanesulfonate, and 1,1,2,2-tetrafluoro-2-(tetracyclo[4.4.0.1$^{2,5}$.1$^{7,10}$]dodec-3-en-8-yl)ethanesulfonate.

Exemplary bis(substituted alkylsulfonyl)imides include bistrifluoromethylsulfonylimide, bispentafluoroethylsulfonylimide, bisheptafluoropropylsulfonylimide, and 1,3-propylenebissulfonylimide. A typical tris(substituted alkylsulfonyl)methide is tristrifluoromethylsulfonylmethide. Iodonium salts based on combination of the foregoing examples are included.

Exemplary sulfonyldiazomethane compounds include bissulfonyldiazomethane compounds and sulfonyl-carbonyldiazomethane compounds such as bis(ethylsulfonyl)diazomethane, bis(1-methylpropylsulfonyl)diazomethane, bis(2-methylpropylsulfonyl)diazomethane, bis(1,1-dimethylethylsulfonyl)diazomethane, bis(cyclohexylsulfonyl)diazomethane, bis(perfluoroisopropylsulfonyl)diazomethane, bis(phenylsulfonyl)diazomethane, bis(4-methylphenylsulfonyl)diazomethane, bis(2,4-dimethylphenylsulfonyl)diazomethane, bis(2-naphthylsulfonyl)diazomethane, bis(4-acetyloxyphenylsulfonyl)diazomethane, bis(4-methanesulfonyloxyphenylsulfonyl)diazomethane, bis(4-(4-toluenesulfonyloxy)phenylsulfonyl)diazomethane, bis(4-(n-hexyloxy)phenylsulfonyl)diazomethane, bis(2-methyl-4-(n-hexyloxy)phenylsulfonyl)diazomethane, bis(2,5-dimethyl-4-(n-hexyloxy)phenylsulfonyl)diazomethane, bis(3,5-dimethyl-4-(n-hexyloxy)phenylsulfonyl)diazomethane, bis(2-methyl-5-isopropyl-4-(n-hexyloxy)phenylsulfonyl)diazomethane, 4-methylphenylsulfonylbenzoyldiazomethane, tert-butylcarbonyl-4-methylphenylsulfonyldiazomethane, 2-naphthylsulfonylbenzoyldiazomethane, 4-methylphenylsulfonyl-2-naphthoyldiazomethane, methylsulfonylbenzoyldiazomethane, and tert-butoxycarbonyl-4-methylphenylsulfonyldiazomethane.

N-sulfonyloxyimide photoacid generators include combinations of imide skeletons with sulfonates. Exemplary imide skeletons are succinimide, naphthalene dicarboxylic acid imide, phthalimide, cyclohexyldicarboxylic acid imide, 5-norbornene-2,3-dicarboxylic acid imide, and 7-oxabicyclo [2.2.1]-5-heptene-2,3-dicarboxylic acid imide. Exemplary sulfonates include trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, naphthalenesulfonate, camphorsulfonate, octanesulfonate, dodecylbenzenesulfonate, buthanesulfonate, methanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,3,3,3-pentafluoropropanesulfonate, 1,1,3,3,3-pentafluoro-2-furoyloxypropanesulfonate, 2-naphthyloxy-1,1,3,3,3-pentafluoropropanesulfonate, 2-(4-tert-butylbenzoyloxy)-1,1,3,3,3-pentafluoropropanesulfonate, 2-adamantanecarbonyloxy-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-naphthylethanesulfonate, 1,1,2,2-tetrafluoro-2-(norbornane-2-yl)ethanesulfonate, and 1,1,2,2-tetrafluoro-2-(tetracyclo [4.4.0.1$^{2,5}$.1$^{7,10}$]dodec-3-en-8-yl)ethanesulfonate.

Benzoinsulfonate photoacid generators include benzoin tosylate, benzoin mesylate, and benzoin buthanesulfonate.

Pyrogallol trisulfonate photoacid generators include pyrogallol, phloroglucinol, catechol, resorcinol, and hydroquinone, in which all the hydroxyl groups are substituted by trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, buthanesulfonate, methanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,3,3,3-pentafluoropropanesulfonate, 1,1,3,3,3-pentafluoro-2-furoyloxypropanesulfonate, 2-naphthyloxy-1,1,3,3,3-pentafluoropropanesulfonate, 2-(4-tert-butylbenzoyloxy)-1,1,3,3,3-pentafluoropropanesulfonate, 2-adamantanecarbonyloxy-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-naphthylethanesulfonate, 1,1,2,2-tetrafluoro-2-(norbornane-2-yl)ethanesulfonate, and 1,1,2,2-tetrafluoro-2-(tetracyclo [4.4.0.1$^{2,5}$.1$^{7,10}$]dodec-3-en-8-yl)ethanesulfonate.

Nitrobenzyl sulfonate photoacid generators include 2,4-dinitrobenzyl sulfonate, 2-nitrobenzyl sulfonate, and 2,6-dinitrobenzyl sulfonate, with exemplary sulfonates including trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, buthanesulfonate, methanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthyloxy-1,1,3,3,3-pentafluoropropanesulfonate, 2-(4-tert-butylbenzoyloxy)-1,1,3,3,3-pentafluoropropanesulfonate, 2-adamantanecarbonyloxy-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-naphthylethanesulfonate, 1,1,2,2-tetrafluoro-2-(norbornane-2-yl)ethanesulfonate, and 1,1,2,2-tetrafluoro-2-(tetracyclo [4.4.0.1$^{2,5}$.1$^{7,10}$]dodec-3-en-8-yl)ethanesulfonate. Also useful are analogous nitrobenzyl sulfonate compounds in which the nitro group on the benzyl side is substituted by a trifluoromethyl group.

Sulfone photoacid generators include bis(phenylsulfonyl)methane, bis(4-methylphenylsulfonyl)methane, bis(2-naphthylsulfonyl)methane, 2,2-bis(phenylsulfonyl)propane, 2,2-bis(4-methylphenylsulfonyl)propane, 2,2-bis(2-naphthylsulfonyl)propane, 2-methyl-2-(p-toluenesulfonyl)propiophenone, 2-cyclohexylcarbonyl-2-(p-toluenesulfonyl)propane, and 2,4-dimethyl-2-(p-toluenesulfonyl)pentane-3-one.

Photoacid generators in the form of glyoxime derivatives are described in Japanese Patent No. 2,906,999 and JP-A 9-301948 and include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(methanesulfonyl)-α-dimethylglyoxime, bis-O-(trifluoromethanesulfonyl)-α-dimethylglyoxime, bis-O-(2,2,2-trifluoroethanesulfonyl)-α-dimethylglyoxime, bis-O-(10-camphorsulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-trifluoromethylbenzenesulfonyl)-α-dimethylglyoxime, bis-O-(xylenesulfonyl)-α-dimethylglyoxime, bis-O-(trifluoromethanesulfonyl)-nioxime, bis-O-(2,2,2-trifluoroethanesulfonyl)-nioxime, bis-O-(10-camphorsulfonyl)-nioxime, bis-O-(benzenesulfonyl)-nioxime, bis-O-(p-fluorobenzenesulfonyl)-nioxime, bis-O-(p-trifluoromethylbenzenesulfonyl)-nioxime, and bis-O-(xylenesulfonyl)-nioxime.

Also included are the oxime sulfonates described in U.S. Pat. No. 6,004,724, for example, (5-(4-toluenesulfonyl)oxyimino-5H-thiophen-2-ylidene)phenylacetonitrile, (5-(10-camphorsulfonyl)oxyimino-5H-thiophen-2-ylidene)phenylacetonitrile, (5-n-octanesulfonyloxyimino-5H-thiophen-2-ylidene)phenylacetonitrile, (5-(4-toluenesulfonyl)oxyimino-5H-thiophen-2-ylidene)(2-methylphenyl)acetonitrile, (5-(10-camphorsulfonyl)oxyimino-5H-thiophen-2-ylidene)(2-methylphenyl)acetonitrile, (5-n-octanesulfonyloxyimino-5H-thiophen-2-ylidene)(2-methylphenyl)acetonitrile, etc. Also included are the oxime sulfonates described in U.S. Pat. No. 6,916,591, for example, (5-(4-(4-toluenesulfonyloxy)benzenesulfonyl)oxyimino-5H-thiophen-2-ylidene)phenylacetonitrile and (5-(2,5-bis(4-toluenesulfonyloxy)benzenesulfonyl)oxyimino-5H-thiophen-2-ylidene)phenylacetonitrile.

Also included are the oxime sulfonates described in U.S. Pat. No. 6,261,738 and JP-A 2000-314956, for example, 2,2,2-trifluoro-1-phenyl-ethanone oxime-O-methylsulfonate; 2,2,2-trifluoro-1-phenyl-ethanone oxime-O-(10-camphorylsulfonate); 2,2,2-trifluoro-1-phenyl-ethanone oxime-O-(4-methoxyphenylsulfonate); 2,2,2-trifluoro-1-phenyl-ethanone oxime-O-(1-naphthylsulfonate); 2,2,2-trifluoro-1-phenyl-ethanone oxime-O-(2-naphthylsulfonate); 2,2,2-trifluoro-1-phenyl-ethanone oxime-O-(2,4,6-trimethylphenylsulfonate); 2,2,2-trifluoro-1-(4-methylphenyl)-ethanone oxime-O-(10-camphorylsulfonate); 2,2,2-trifluoro-1-(4-methylphenyl)-ethanone oxime-O-(methylsulfonate); 2,2,2-trifluoro-1-(2-methylphenyl)-ethanone oxime-O-(10-camphorylsulfonate); 2,2,2-trifluoro-1-(2,4-dimethylphenyl)-ethanone oxime-O-(10-camphorylsulfonate); 2,2,2-trifluoro-1-(2,4-dimethylphenyl)-ethanone oxime-O-(1-naphthylsulfonate); 2,2,2-trifluoro-1-(2,4-dimethylphenyl)-ethanone oxime-O-(2-naphthylsulfonate); 2,2,2-trifluoro-1-(2,4,6-trimethylphenyl)-ethanone oxime-O-(10-camphorylsulfonate); 2,2,2-trifluoro-1-(2,4,6-trimethylphenyl)-ethanone oxime-O-(1-naphthylsulfonate); 2,2,2-trifluoro-1-(2,4,6-trimethylphenyl)-ethanone oxime-O-(2-naphthylsulfonate); 2,2,2-trifluoro-1-(4-methoxyphenyl)-ethanone oxime-O-methylsulfonate; 2,2,2-trifluoro-1-(4-methylthiophenyl)-ethanone oxime-O-methylsulfonate; 2,2,2-trifluoro-1-(3,4-dimethoxyphenyl)-ethanone oxime-O-methylsulfonate; 2,2,3,3,4,4,4-heptafluoro-1-phenyl-butanone oxime-O-(10-camphorylsulfonate); 2,2,2-trifluoro-1-(phenyl)-ethanone oxime-O-methylsulfonate; 2,2,2-trifluoro-1-(phenyl)-ethanone oxime-O-10-camphorylsulfonate; 2,2,2-trifluoro-1-(phenyl)-ethanone oxime-O-(4-methoxyphenyl)sulfonate; 2,2,2-trifluoro-1-(phenyl)-ethanone oxime-O-(1-naphthyl)sulfonate; 2,2,2-trifluoro-1-(phenyl)-ethanone oxime-O-(2-naphthyl)sulfonate; 2,2,2-trifluoro-1-(phenyl)-ethanone oxime-O-(2,4,6-trimethylphenyl)sulfonate; 2,2,2-trifluoro-1-(4-methylphenyl)-ethanone oxime-O-(10-camphoryl)sulfonate; 2,2,2-trifluoro-1-(4-methylphenyl)-ethanone oxime-O-methylsulfonate; 2,2,2-trifluoro-1-(2-methylphenyl)-ethanone oxime-O-(10-camphoryl)sulfonate; 2,2,2-trifluoro-1-(2,4-dimethylphenyl)-ethanone oxime-O-(1-naphthyl)sulfonate; 2,2,2-trifluoro-1-(2,4-dimethylphenyl)-ethanone oxime-O-(2-naphthyl)sulfonate; 2,2,2-trifluoro-1-(2,4,6-trimethylphenyl)-ethanone oxime-O-(10-camphoryl)sulfonate; 2,2,2-trifluoro-1-(2,4,6-trimethylphenyl)-ethanone oxime-O-(1-naphthyl)sulfonate; 2,2,2-trifluoro-1-(2,4,6-trimethylphenyl)-ethanone oxime-O-(2-naphthyl)sulfonate; 2,2,2-trifluoro-1-(4-methoxyphenyl)-ethanone oxime-O-methylsulfonate; 2,2,2-trifluoro-1-(4-thiomethylphenyl)-ethanone oxime-O-methylsulfonate; 2,2,2-trifluoro-1-(3,4-dimethoxyphenyl)-ethanone oxime-O-methylsulfonate; 2,2,2-trifluoro-1-(4-methoxyphenyl)-ethanone oxime-O-(4-methylphenyl)sulfonate; 2,2,2-trifluoro-1-(4-methoxyphenyl)-ethanone oxime-O-(4-methoxyphenyl)sulfonate; 2,2,2-trifluoro-1-(4-methoxyphenyl)-ethanone oxime-O-(4-dodecylphenyl)-sulfonate; 2,2,2-trifluoro-1-(4-methoxyphenyl)-ethanone oxime-O-octylsulfonate; 2,2,2-trifluoro-1-(4-thiomethylphenyl)-ethanone oxime-O-(4-methoxyphenyl)sulfonate; 2,2,2-trifluoro-1-(4-thiomethylphenyl)-ethanone oxime-O-(4-dodecylphenyl)sulfonate; 2,2,2-trifluoro-1-(4-thiomethylphenyl)-ethanone oxime-O-octylsulfonate; 2,2,2-trifluoro-1-(4-thiomethylphenyl)-ethanone oxime-O-(2-naphthyl)sulfonate; 2,2,2-trifluoro-1-(2-methylphenyl)-ethanone oxime-O-methylsulfonate; 2,2,2-trifluoro-1-(4-methylphenyl)ethanone oxime-O-phenylsulfonate; 2,2,2-trifluoro-1-(4-chlorophenyl)-ethanone oxime-O-phenylsulfonate; 2,2,3,3,4,4,4-heptafluoro-1-(phenyl)-butanone oxime-O-(10-camphoryl)sulfonate; 2,2,2-trifluoro-1-naphthyl-ethanone oxime-O-methylsulfonate; 2,2,2-trifluoro-2-naphthyl-ethanone oxime-O-methylsulfonate; 2,2,2-trifluoro-1-[4-benzylphenyl]-ethanone oxime-O-methylsulfonate; 2,2,2-trifluoro-1-[4-(phenyl-1,4-dioxa-but-1-yl)phenyl]-ethanone oxime-O-methylsulfonate; 2,2,2-trifluoro-1-naphthyl-ethanone oxime-O-propylsulfonate; 2,2,2-trifluoro-2-naphthyl-ethanone oxime-O-propylsulfonate; 2,2,2-trifluoro-1-[4-benzylphenyl]-ethanone oxime-O-propylsulfonate; 2,2,2-trifluoro-1-[4-methylsulfonylphenyl]-ethanone oxime-O-propylsulfonate; 1,3-bis[1-(4-phenoxyphenyl)-2,2,2-trifluoroethanone oxime-O-sulfonyl]phenyl; 2,2,2-trifluoro-1-[4-methylsulfonyloxyphenyl]-ethanone oxime-O-propylsulfonate; 2,2,2-trifluoro-1-[4-methylcarbonyloxyphenyl]-ethanone oxime-O-propylsulfonate; 2,2,2-trifluoro-1-[6H,7H-5,8-dioxonaphth-2-yl]-ethanone oxime-O-propylsulfonate; 2,2,2-trifluoro-1-[4-methoxycarbonylmethoxyphenyl]-ethanone oxime-O-propylsulfonate; 2,2,2-trifluoro-1-[4-(methoxycarbonyl)-(4-amino-1-oxa-pent-1-yl)-phenyl]-ethanone oxime-O-propylsulfonate; 2,2,2-trifluoro-1-[3,5-dimethyl-4-ethoxyphenyl]-ethanone oxime-O-propylsulfonate; 2,2,2-trifluoro-1-[4-benzyloxyphenyl]-ethanone oxime-O-propylsulfonate; 2,2,2-trifluoro-1-[2-thiophenyl]-ethanone oxime-O-propylsulfonate; 2,2,2-trifluoro-1-[1-dioxathiophen-2-yl)]-ethanone oxime-O-propylsulfonate; 2,2,2-trifluoro-1-(4-(3-(4-(2,2,2-trifluoro-1-(trifluoromethanesulfonyloxyimino)-ethyl)-phenoxy)-propoxy)-phenyl)ethanone oxime(trifluoromethanesulfonate); 2,2,2-trifluoro-1-(4-(3-(4-(2,2,2-trifluoro-1-(1-propanesulfonyloxyimino)-ethyl)-phenoxy)-propoxy)-phenyl)ethanone oxime(1-propanesulfonate); and 2,2,2-trifluoro-1-(4-(3-(4-(2,2,2-trifluoro-1-(1-butanesulfonyloxyimino)-ethyl)-phenoxy)-propoxy)-phenyl)ethanone oxime(1-butanesulfonate). Also included are the oxime sulfonates described in U.S. Pat. No. 6,916,591, for example, 2,2,2-trifluoro-1-(4-(3-(4-(2,2,2-trifluoro-1-(4-(4-methylphenylsulfonyloxy)phenylsulfonyloxyimino)-ethyl)-phenoxy)-propoxy)-phenyl)ethanone oxime(4-(4-methylphenylsulfonyloxy)phenylsulfonate) and 2,2,2-trifluoro-1-(4-(3-(4-(2,2,2-trifluoro-1-(2,5-bis(4-methylphenylsulfonyloxy)benzenesulfonyloxy)phenylsulfonyloxyimino)-ethyl)-phenoxy)-propoxy)-phenyl)ethanone oxime(2,5-bis(4-methylphenylsulfonyloxy)benzenesulfonyloxy)phenylsulfonate).

Also included are the oxime sulfonates described in JP-A 9-95479 and JP-A 9-230588 and the references cited therein, for example, α-(p-toluenesulfonyloxyimino)-phenylacetonitrile, α-(p-chlorobenzenesulfonyloxyimino)-phenylacetonitrile, α-(4-nitrobenzenesulfonyloxyimino)-phenylacetonitrile, α-(4-nitro-2-trifluoromethylbenzenesulfonyloxyimino)-phenylacetonitrile, α-(benzenesulfonyloxyimino)-4-chlorophenylacetonitrile, α-(benzenesulfonyloxyimino)-2,4-dichlorophenylacetonitrile, α-(benzenesulfonyloxyimino)-2,6-dichlorophenylacetonitrile, α-(benzenesulfonyloxyimino)-4-methoxyphenylacetonitrile, α-(2-chlorobenzenesulfonyloxyimino)-4-methoxyphenylacetonitrile, α-(benzenesulfonyloxyimino)-2-thienylacetonitrile, α-(4-dodecylbenzenesulfonyloxyimino)phenylacetonitrile, α-[(4-toluenesulfonyloxyimino)-4-methoxyphenyl]acetonitrile, α-[(dodecylbenzenesulfonyloxyimino)-4-methoxyphenyl]acetonitrile, α-(tosyloxyimino)-3-thienylacetonitrile, α-(methylsulfonyloxyimino)-1-cyclopentenylacetonitrile, α-(ethylsulfonyloxyimino)-1-cyclopentenylacetonitrile, α-(isopropylsulfonyloxyimino)-1-cyclopentenylacetonitrile, α-(n-butylsulfonyloxyimino)-1-cyclopentenylacetonitrile, α-(ethylsulfonyloxyimino)-1-cyclohexenylacetonitrile, α-(isopropylsulfonyloxyimino)-1-cyclohexenylacetonitrile, and α-(n-butylsulfonyloxyimino)-1-cyclohexenylacetonitrile.

Also included are oxime sulfonates having the formula:

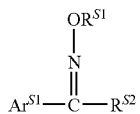

wherein $R^{s1}$ is a substituted or unsubstituted haloalkylsulfonyl or halobenzenesulfonyl group of 1 to 10 carbon atoms, $R^{s2}$ is a haloalkyl group of 1 to 11 carbon atoms, and $Ar^{s1}$ is substituted or unsubstituted aromatic or hetero-aromatic group, as described in WO 2004/074242. Examples include 2-[2,2,3,3,4,4,5,5-octafluoro-1-(nonafluorobutylsulfonyloxyimino)-pentyl]-fluorene, 2-[2,2,3,3,4,4-pentafluoro-1-(nonafluorobutylsulfonyloxyimino)-butyl]-fluorene, 2-[2,2,3,3,4,4,5,5,6,6-decafluoro-1-(nonafluorobutylsulfonyloxyimino)-hexyl]-fluorene, 2-[2,2,3,3,4,4,5,5-octafluoro-1-(nonafluorobutylsulfonyloxyimino)-pentyl]-4-biphenyl, 2-[2,2,3,3,4,4-pentafluoro-1-(nonafluorobutylsulfonyloxyimino)-butyl]-4-biphenyl, and 2-[2,2,3,3,4,4,5,5,6,6-decafluoro-1-(nonafluorobutylsulfonyloxyimino)-hexyl]-4-biphenyl.

Suitable bisoxime sulfonates include those described in JP-A 9-208554, for example, bis(α-(4-toluenesulfonyloxy)imino)-p-phenylenediacetonitrile, bis(α-(benzenesulfonyloxy)imino)-p-phenylenediacetonitrile, bis(α-(methanesulfonyloxy)imino)-p-phenylenediacetonitrile, bis(α-(butanesulfonyloxy)imino)-p-phenylenediacetonitrile, bis(α-(10-camphorsulfonyloxy)imino)-p-phenylenediacetonitrile, bis(α-(4-toluenesulfonyloxy)imino)-p-phenylenediacetonitrile, bis(α-(trifluoromethanesulfonyloxy)imino)-p-phenylenediacetonitrile, bis(α-(4-methoxybenzenesulfonyloxy)imino)-p-phenylenediacetonitrile, bis(α-(4-toluenesulfonyloxy)imino)-m-phenylenediacetonitrile, bis(α-(benzenesulfonyloxy)imino)-m-phenylenediacetonitrile, bis(α-(methanesulfonyloxy)imino)-m-phenylenediacetonitrile, bis(α-(butanesulfonyloxy)imino)-m-phenylenediacetonitrile, bis(α-(10-camphorsulfonyloxy)imino)-m-phenylenediacetonitrile, bis(α-(4-toluenesulfonyloxy)imino)-m-phenylenediacetonitrile, bis(α-(trifluoromethanesulfonyloxy)imino)-m-phenylenediacetonitrile, bis(α-(4-methoxybenzenesulfonyloxy)imino)-m-phenylenediacetonitrile, etc.

Of these, preferred photoacid generators are sulfonium salts, bissulfonyldiazomethanes, N-sulfonyloxyimides, oxime-O-sulfonates and glyoxime derivatives.
More preferred photoacid generators are sulfonium salts, bissulfonyldiazomethanes, N-sulfonyloxyimides, and oxime-O-sulfonates. Typical examples include triphenylsulfonium p-toluenesulfonate, triphenylsulfonium camphorsulfonate, triphenylsulfonium pentafluorobenzenesulfonate, triphenylsulfonium nonafluorobutanesulfonate, triphenylsulfonium 4-(4'-toluenesulfonyloxy)benzenesulfonate, triphenylsulfonium 2,4,6-triisopropylbenzenesulfonate, 4-tert-butoxyphenyldiphenylsulfonium p-toluenesulfonate, 4-tert-butoxyphenyldiphenylsulfonium camphorsulfonate, 4-tert-butoxyphenyldiphenylsulfonium 4-(4'-toluenesulfonyloxy)benzenesulfonate, tris(4-methylphenyl)sulfonium camphorsulfonate, tris(4-tert-butylphenyl)sulfonium camphorsulfonate, 4-tert-butylphenyldiphenylsulfonium camphorsulfonate, 4-tert-butylphenyldiphenylsulfonium nonafluoro-1-buthanesulfonate, 4-tert-butylphenyldiphenylsulfonium pentafluoroethylperfluorocyclohexanesulfonate, 4-tert-butylphenyldiphenylsulfonium perfluoro-1-octanesulfonate, triphenylsulfonium 1,1-difluoro-2-naphthyl-ethanesulfonate, triphenylsulfonium 1,1,2,2-tetrafluoro-2-(norbornane-2-yl)-ethanesulfonate, bis(tert-butylsulfonyl)diazomethane, bis(cyclohexylsulfonyl)diazomethane, bis(2,4-dimethylphenylsulfonyl)diazomethane, bis(4-(n-hexyloxy)phenylsulfonyl)diazomethane, bis(2-methyl-4-(n-hexyloxy)phenylsulfonyl)diazomethane, bis(2,5-dimethyl-4-(n-hexyloxy)phenylsulfonyl)diazomethane, bis(3,5-dimethyl-4-(n-hexyloxy)phenylsulfonyl)diazomethane, bis(2-methyl-5-isopropyl-4-(n-hexyloxy)phenylsulfonyl)-diazomethane, bis(4-tert-butylphenylsulfonyl)diazomethane, N-camphorsulfonyloxy-5-norbornene-2,3-dicarboxylic acid imide, N-p-toluenesulfonyloxy-5-norbornene-2,3-dicarboxylic acid imide, 2-[2,2,3,3,4,4,5,5-octafluoro-1-(nonafluorobutylsulfonyloxyimino)-pentyl]-fluorene, 2-[2,2,3,3,4,4-pentafluoro-1-(nonafluorobutylsulfonyloxyimino)-butyl]-fluorene, and 2-[2,2,3,3,4,4,5,5,6,6-decafluoro-1-(nonafluorobutylsulfonyloxyimino)-hexyl]-fluorene.

In the chemically amplified resist composition, an appropriate amount of the photoacid generator is, but not limited to, 0.1 to 20 parts, and especially 0.1 to 10 parts by weight per 100 parts by weight of the base resin (B). If the amount of the PAG is up to 20 phr, the resulting photoresist film has a sufficiently high transmittance to minimize a risk of degrading resolution. The PAG may be used alone or in admixture of two or more. The transmittance of the resist film can be controlled by using a PAG having a low transmittance at the exposure wavelength and adjusting the amount of the PAG added.

In the resist composition, there may be added a compound which is decomposed with an acid to generate another acid, that is, acid-amplifier compound. For these compounds, reference should be made to J. Photopolym. Sci. and Tech., 8, 43-44, 45-46 (1995), and ibid., 9, 29-30 (1996).

Examples of the acid-amplifier compound include tert-butyl-2-methyl-2-tosyloxymethyl acetoacetate and 2-phenyl-2-(2-tosyloxyethyl)-1,3-dioxolane, but are not limited thereto. Of well-known photoacid generators, many of those compounds having poor stability, especially poor thermal stability exhibit an acid amplifier-like behavior.

In the resist composition, an appropriate amount of the acid-amplifier compound is up to 2 parts, and preferably up to 1 part by weight per 100 parts by weight of the base resin (B). Up to 2 phr of the acid-amplifier compound allows for diffusion control, minimizing a risk of degrading resolution and pattern profile.

In addition to (A) or (A1) additive polymer, (B) base resin (or polymer) and (C) photoacid generator, the resist composition of the invention may further comprise (D) an organic solvent, (E) a basic compound, and (F) a dissolution inhibitor.

Solvent

The organic solvent used herein may be any organic solvent in which the additive polymer, base resin, acid generator, and other components are soluble. Illustrative, non-limiting, examples of the organic solvent include ketones such as cyclohexanone and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in combinations of two or more thereof. Of the above organic solvents, it is recommended to use diethylene glycol dimethyl ether, 1-ethoxy-2-propanol, propylene glycol monomethyl ether acetate, and mixtures thereof because the acid generator is most soluble therein.

An appropriate amount of the organic solvent used is 200 to 3,000 parts, especially 400 to 2,500 parts by weight per 100 parts by weight of the base resin (B).

Basic Compound

In the resist composition, an organic nitrogen-containing compound or compounds may be compounded as the basic compound. The organic nitrogen-containing compound used herein is preferably a compound capable of suppressing the rate of diffusion when the acid generated by the acid generator diffuses within the resist film. The inclusion of organic nitrogen-containing compound holds down the rate of acid diffusion within the resist film, resulting in better resolution. In addition, it suppresses changes in sensitivity following exposure and reduces substrate and environment dependence, as well as improving the exposure latitude and the pattern profile.

Suitable organic nitrogen-containing compounds include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, imide derivatives, and carbamate derivatives.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isoxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 4-pyrrolidinopyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen-containing compounds having sulfonyl group include 3-pyridinesulfonic acid and pyridinium p-toluenesulfonate. Examples of suitable nitrogen-containing compounds having hydroxyl group, nitrogen-containing compounds having hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N- dimethylacetamide, propionamide, benzamide, and 1-cyclohexylpyrrolidone. Suitable imide derivatives include phthalimide, succinimide, and maleimide. Suitable carbamate derivatives include N-t-butoxycarbonyl-N,N-dicyclohexylamine, N-t-butoxycarbonylbenzimidazole and oxazolidinone.

In addition, organic nitrogen-containing compounds of the following general formula (B)-1 may also be included alone or in admixture.

$$N(X)_n(Y)_{3-n} \quad (B)\text{-}1$$

In the formula, n is equal to 1, 2 or 3; side chain Y is independently hydrogen or a straight, branched or cyclic $C_1$-$C_{20}$ alkyl group which may contain an ether or hydroxyl group; and side chain X is independently selected from groups of the following general formulas (X1) to (X3), and two or three X's may bond together to form a ring.

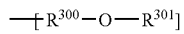  (X1)

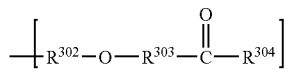  (X2)

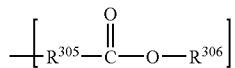  (X3)

In the formulas, $R^{300}$, $R^{302}$ and $R^{305}$ are independently straight or branched $C_1$-$C_4$ alkylene groups; $R^{301}$ and $R^{304}$ are independently hydrogen or a straight, branched or cyclic $C_1$-$C_{20}$ alkyl group which may contain at least one hydroxyl, ether, ester group or lactone ring; $R^{303}$ is a single bond or a straight or branched $C_1$-$C_4$ alkylene group; and $R^{306}$ is a straight, branched or cyclic $C_1$-$C_{20}$ alkyl group which may contain at least one hydroxyl, ether, ester group or lactone ring.

Illustrative examples of the compounds of formula (B)-1 include tris(2-methoxymethoxyethyl)amine, tris(2-(2-methoxyethoxy)ethyl)amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosene, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl) ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]-ethylamine, N,N-bis(2-acetoxyethyl)-2-[(methoxycarbonyl)methoxycarbonyl]-ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)-ethylamine, N,N-bis(2-acetoxyethyl)-2-(tetrahydrofurfuryloxycarbonyl)-ethylamine, N,N-bis(2-hydroxyethyl)-2-[(2-oxotetrahydrofuran-3-yl)oxycarbonyl]ethylamine, N,N-bis(2-acetoxyethyl)-2-[(2-oxotetrahydrofuran-3-yl)oxycarbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)-ethylamine, N,N-bis(2-formyloxyethyl)-2-(2-formyloxyethoxycarbonyl)-ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis(methoxycarbonylmethyl)amine, and β-(diethylamino)-δ-valerolactone.

Also useful are one or more organic nitrogen-containing compounds having cyclic structure represented by the following general formula (B)-2.

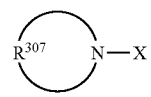  (B)-2

Herein X is as defined above, and $R^{307}$ is a straight or branched $C_2$-$C_{20}$ alkylene group which may contain one or more carbonyl, ether, ester or sulfide groups.

Illustrative examples of the organic nitrogen-containing compounds having formula (B)-2 include 1-[2-(methoxymethoxy)ethyl]pyrrolidine, 1-[2-(methoxymethoxy)ethyl]piperidine, 4-[2-(methoxymethoxy)ethyl]morpholine, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy)methoxy]ethyl]morpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]morpholine, methyl 3-(1-pyrrolidinyl)propionate, methyl 3-piperidinopropionate, methyl 3-morpholinopropionate, methyl 3-(thiomorpholino)propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl)propionate, 2-acetoxyethyl 3-morpholinopropionate, 2-oxotetrahydrofuran-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl)methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate, 2-methoxyethyl morpholinoacetate, 2-morpholinoethyl 2-methoxyacetate, 2-morpholinoethyl 2-(2-methoxyethoxy)acetate, 2-morpholinoethyl 2-[2-(2-methoxyethoxy)ethoxy]acetate, 2-morpholinoethyl hexanoate, 2-morpholinoethyl octanoate, 2-morpholinoethyl decanoate, 2-morpholinoethyl laurate, 2-morpholinoethyl myristate, 2-morpholinoethyl palmitate, and 2-morpholinoethyl stearate.

Also, one or more organic nitrogen-containing compounds having cyano group represented by the following general formulae (B)-3 to (B)-6 may be blended.

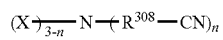
(B)-3

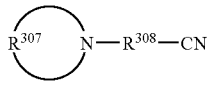
(B)-4

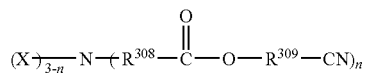
(B)-5

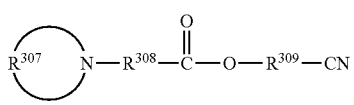
(B)-6

Herein, X, $R^{307}$ and n are as defined above, and $R^{308}$ and $R^{309}$ are each independently a straight or branched $C_1$-$C_4$ alkylene group.

Illustrative examples of the organic nitrogen-containing compounds having cyano represented by formulae (B)-3 to (B)-6 include 3-(diethylamino)propiononitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropiononitrile, N,N-bis(2-methoxyethyl)-3-aminopropiononitrile, N,N-bis[2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiononitrile, N-(2-cyanoethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropiononitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl)aminoacetonitrile, N,N-bis(2-acetoxyethyl)aminoacetonitrile, N,N-bis(2-formyloxyethyl)aminoacetonitrile, N,N-bis(2-methoxyethyl)aminoacetonitrile, N,N-bis[2-(methoxymethoxy)ethyl]aminoacetonitrile, methyl N-cyanomethyl-N-(2-methoxyethyl)-3-aminopropionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl]aminoacetonitrile, N-cyanomethyl-N-(3-hydroxy-1-propyl)aminoacetonitrile, N-(3-acetoxy-1-propyl)-N-(cyanomethyl)aminoacetonitrile, N-cyanomethyl-N-(3-formyloxy-1-propyl)aminoacetonitrile, N,N-bis(cyanomethyl)aminoacetonitrile, 1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile, cyanomethyl 3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis(2-methoxyethyl)-3-aminopropionate, cyanomethyl N,N-bis[2-(methoxymethoxy)ethyl]-3-aminopropionate, 2-cyanoethyl 3-diethylaminopropionate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N-bis(2-formyloxyethyl)-3-aminopropionate, 2-cyanoethyl N,N-bis(2-methoxyethyl)-3-aminopropionate, 2-cyanoethyl N,N-bis[2-(methoxymethoxy)ethyl]-3-aminopropionate, cyanomethyl 1-pyrrolidinepropionate, cyanomethyl 1-piperidinepropionate, cyanomethyl 4-morpholinepropionate, 2-cyanoethyl 1-pyrrolidinepropionate, 2-cyanoethyl 1-piperidinepropionate, and 2-cyanoethyl 4-morpholinepropionate.

Also included are organic nitrogen-containing compounds having an imidazole structure and a polar functional group, represented by the general formula (B)-7.

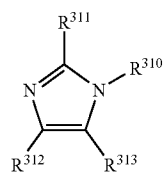
(B)-7

Herein, $R^{310}$ is a straight, branched or cyclic alkyl group of 2 to 20 carbon atoms bearing at least one polar functional group selected from among hydroxyl, carbonyl, ester, ether, sulfide, carbonate, cyano and acetal groups; $R^{311}$, $R^{312}$ and $R^{313}$ are each independently a hydrogen atom, a straight, branched or cyclic alkyl group, aryl group or aralkyl group having 1 to 10 carbon atoms.

Also included are organic nitrogen-containing compounds having a benzimidazole structure and a polar functional group, represented by the general formula (B)-8.

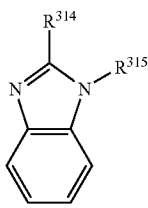

(B)-8

Herein, $R^{314}$ is a hydrogen atom, a straight, branched or cyclic alkyl group, aryl group or aralkyl group having 1 to 10 carbon atoms. $R^{315}$ is a polar functional group-bearing, straight, branched or cyclic $C_1$-$C_{20}$ alkyl group, and the alkyl group contains as the polar functional group at least one group selected from among ester, acetal and cyano groups, and may additionally contain at least one group selected from among hydroxyl, carbonyl, ether, sulfide and carbonate groups.

Further included are heterocyclic nitrogen-containing compounds having a polar functional group, represented by the general formulae (B)-9 and (B)-10.

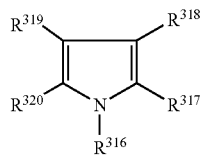

(B)-9

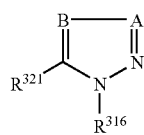

(B)-10

Herein, A is a nitrogen atom or =C—$R^{322}$, B is a nitrogen atom or =C—$R^{323}$, $R^{316}$ is a straight, branched or cyclic alkyl group of 2 to 20 carbon atoms bearing at least one polar functional group selected from among hydroxyl, carbonyl, ester, ether, sulfide, carbonate, cyano and acetal groups; $R^{317}$, $R^{318}$, $R^{319}$ and $R^{320}$ are each independently a hydrogen atom, a straight, branched or cyclic alkyl group or aryl group having 1 to 10 carbon atoms, or a pair of $R^{317}$ and $R^{318}$ and a pair of $R^{319}$ and $R^{320}$, taken together, may form a benzene, naphthalene or pyridine ring with the carbon atoms to which they are attached; $R^{321}$ is a hydrogen atom, a straight, branched or cyclic alkyl group or aryl group having 1 to 10 carbon atoms; $R^{322}$ and $R^{323}$ each are a hydrogen atom, a straight, branched or cyclic alkyl group or aryl group having 1 to 10 carbon atoms, or a pair of $R^{321}$ and $R^{32}$, taken together, may form a benzene or naphthalene ring with the carbon atoms to which they are attached.

Also included are organic nitrogen-containing compounds of aromatic carboxylic ester structure having the general formulae (B)-11 to (B)-14.

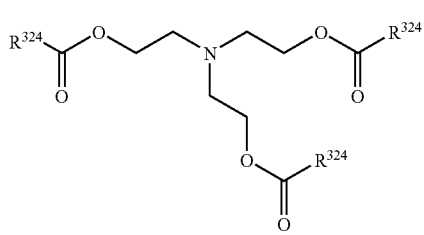

(B)-11

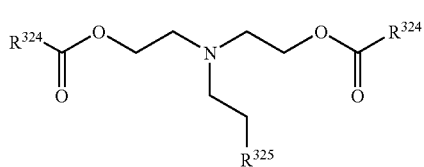

(B)-12

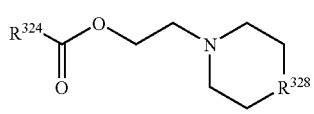

(B)-13

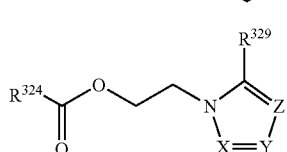

(B)-14

Herein $R^{324}$ is a $C_6$-$C_{20}$ aryl group or $C_4$-$C_{20}$ hetero-aromatic group, in which some or all hydrogen atoms may be replaced by halogen atoms, straight, branched or cyclic $C_1$-$C_{20}$ alkyl groups, $C_6$-$C_{20}$ aryl groups, $C_7$-$C_{20}$ aralkyl groups, $C_1$-$C_1$ alkoxy groups, $C_1$-$C_{10}$ acyloxy groups or $C_1$-$C_{10}$ alkylthio groups. $R^{325}$ is $CO_2R^{326}$, $OR^{327}$ or cyano group. $R^{326}$ is a $C_1$-$C_{10}$ alkyl group, in which some methylene groups may be replaced by oxygen atoms. $R^{327}$ is a $C_1$-$C_{10}$ alkyl or acyl group, in which some methylene groups may be replaced by oxygen atoms. $R^{328}$ is a single bond, methylene, ethylene, sulfur atom or —O(CH$_2$CH$_2$O)$_n$— group wherein n is 0, 1, 2, 3 or 4. $R^{329}$ is hydrogen, methyl, ethyl or phenyl. X is a nitrogen atom or CR$^{330}$. Y is a nitrogen atom or CR$^{331}$. Z is a nitrogen atom or CR$^{332}$. $R^{330}$, $R^{331}$ and $R^{332}$ are each independently hydrogen, methyl or phenyl. Alternatively, a pair of $R^{330}$ and $R^{331}$ or a pair of $R^{331}$ and $R^{332}$ may bond together to form a $C_6$-$C_{20}$ aromatic ring or $C_2$-$C_{20}$ hetero-aromatic ring with the carbon atoms to which they are attached.

Further included are organic nitrogen-containing compounds of 7-oxanorbornane-2-carboxylic ester structure having the general formula (B)-15.

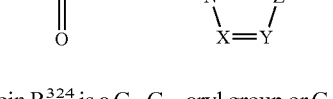

(B)-15

Herein $R^{333}$ is hydrogen or a straight, branched or cyclic $C_1$-$C_{10}$ alkyl group. $R^{334}$ and $R^{335}$ are each independently a $C_1$-$C_{20}$ alkyl group, $C_6$-$C_{20}$ aryl group or $C_7$-$C_{20}$ aralkyl group, which may contain one or more polar functional groups selected from among ether, carbonyl, ester, alcohol, sulfide, nitrile, amine, imine, and amide and in which some hydrogen atoms may be replaced by halogen atoms. $R^{334}$ and $R^{335}$, taken together, may form a heterocyclic or hetero-aromatic ring of 2 to 20 carbon atoms with the nitrogen atom to which they are attached.

The organic nitrogen-containing compounds may be used alone or in admixture of two or more. The organic nitrogen-containing compound is preferably formulated in an amount of 0.001 to 2 parts, and especially 0.01 to 1 part by weight, per 100 parts by weight of the base resin (B). At least 0.001 phr of the nitrogen-containing compound achieves a desired addition effect whereas up to 2 phr minimizes a risk of lowering sensitivity.

Dissolution Inhibitor

The dissolution inhibitor which can be added to the resist composition is a compound having on the molecule at least two phenolic hydroxyl groups, in which an average of from 0 to 100 mol % of all the hydrogen atoms on the phenolic hydroxyl groups are replaced by acid labile groups or a compound having on the molecule at least one carboxyl group, in which an average of 50 to 100 mol % of all the hydrogen atoms on the carboxyl groups are replaced by acid labile groups, both the compounds having a weight average molecular weight within a range of 100 to 1,000, and preferably 150 to 800.

The degree of substitution of the hydrogen atoms on the phenolic hydroxyl groups with acid labile groups is on average at least 0 mol %, and preferably at least 30 mol %, of all the phenolic hydroxyl groups. The upper limit is 100 mol %, and preferably 80 mol %. The degree of substitution of the hydrogen atoms on the carboxyl groups with acid labile groups is on average at least 50 mol %, and preferably at least 70 mol %, of all the carboxyl groups, with the upper limit being 100 mol %.

Preferable examples of such compounds having two or more phenolic hydroxyl groups or compounds having a carboxyl group include those of formulas (D1) to (D14) below.

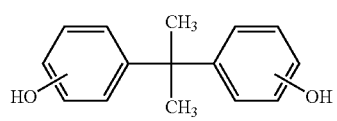
(D1)

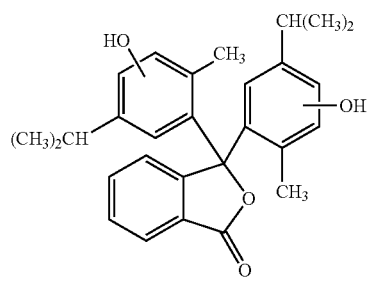
(D2)

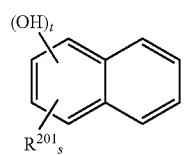
(D3)

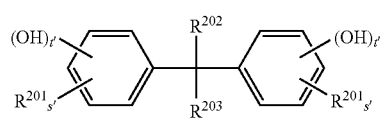
(D4)

-continued

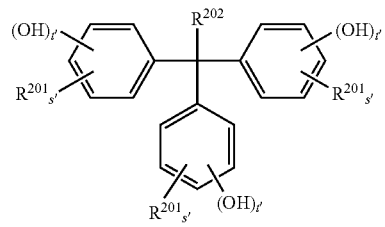
(D5)

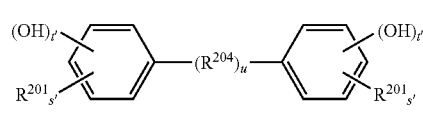
(D6)

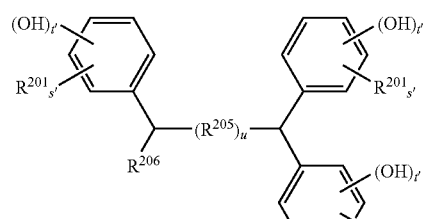
(D7)

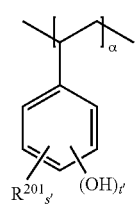
(D8)

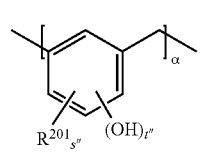
(D9)

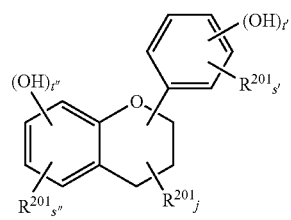
(D10)

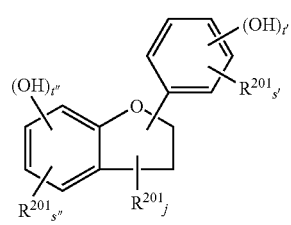
(D11)

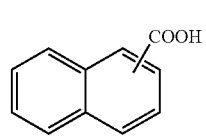
(D12)

-continued

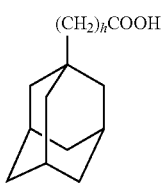
(D13)

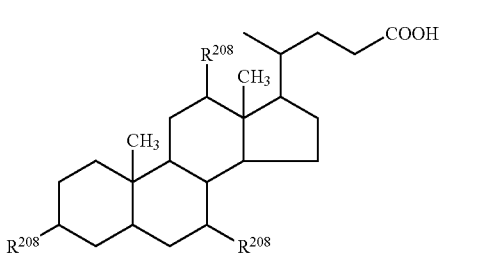
(D14)

In these formulas, $R^{201}$ and $R^{202}$ are each hydrogen or a straight or branched $C_1$-$C_8$ alkyl or alkenyl group, for example, hydrogen, methyl, ethyl, butyl, propyl, ethynyl and cyclohexyl.

$R^{203}$ is hydrogen, a straight or branched $C_1$-$C_8$ alkyl or alkenyl group, or —$(R^{207})_h$—COOH wherein $R^{207}$ is a straight or branched $C_1$-$C_{10}$ alkylene, for example, those exemplified for $R^{201}$ and $R^{202}$ and —COOH and —$CH_2COOH$.

$R^{204}$ is —$(CH_2)_i$— wherein $i=2$ to 10, $C_6$-$C_{10}$ arylene, carbonyl, sulfonyl, an oxygen atom, or a sulfur atom, for example, ethylene, phenylene, carbonyl, sulfonyl, oxygen atom or sulfur atom.

$R^{205}$ is a $C_1$-$C_{10}$ alkylene, a $C_6$-$C_{10}$ arylene, carbonyl, sulfonyl, an oxygen atom, or a sulfur atom, for example, methylene and those exemplified for $R^{204}$.

$R^{206}$ is hydrogen, a straight or branched $C_1$-$C_8$ alkyl or alkenyl, or a phenyl or naphthyl group in which at least one hydrogen atom is substituted by a hydroxyl group, for example, hydrogen, methyl, ethyl, butyl, propyl, ethynyl, cyclohexyl, hydroxyl-substituted phenyl, and hydroxyl-substituted naphthyl.

$R^{208}$ is hydrogen or hydroxyl.

The letter j is an integer from 0 to 5; u and h are each 0 or 1; s, t, s', t', s'', and t'' are each numbers which satisfy $s+t=8$, $s'+t'=5$, and $s''+t''=4$, and are such that each phenyl structure has at least one hydroxyl group; and a is a number such that the compounds of formula (D8) or (D9) have a weight average molecular weight of from 100 to 1,000.

Exemplary acid labile groups on the dissolution inhibitor include a variety of such groups, typically groups of the general formulae (L1) to (L4), tertiary $C_4$-$C_{20}$ alkyl groups, trialkylsilyl groups in which each of the alkyls has 1 to 6 carbon atoms, and $C_4$-$C_{20}$ oxoalkyl groups. Examples of the respective groups are as previously described.

The dissolution inhibitor may be formulated in an amount of 0 to 50 parts, preferably 0 to 40 parts, and more preferably 0 to 30 parts by weight, per 100 parts by weight of the base resin (B), and may be used singly or as a mixture of two or more thereof. Up to 50 parts of the dissolution inhibitor may minimize a risk of slimming the patterned film to invite a decline in resolution.

The dissolution inhibitor can be synthesized by introducing acid labile groups into a compound having phenolic hydroxyl or carboxyl groups in accordance with an organic chemical formulation.

If desired, the resist composition of the invention may further comprise a carboxylic acid compound, acetylene alcohol derivative or other optional ingredients. Optional ingredients may be added in conventional amounts so long as this does not compromise the objects of the invention.

The carboxylic acid compound used herein may be one or more compounds selected from Groups I and II below, but is not limited thereto. Including this compound improves the post-exposure delay (PED) stability of the resist and ameliorates edge roughness on nitride film substrates.

Group I:

Compounds of general formulas (A1) to (A10) below in which some or all of the hydrogen atoms on the phenolic hydroxyl groups are replaced by —$R^{401}$—COOH (wherein $R^{401}$ is a straight or branched $C_1$-$C_{10}$ alkylene group), and in which the molar ratio $C/(C+D)$ of phenolic hydroxyl groups (C) to ≡C—COOH groups (D) in the molecule is from 0.1 to 1.0.

Group II:

Compounds of general formulas (A11) to (A15) below.

(A1)

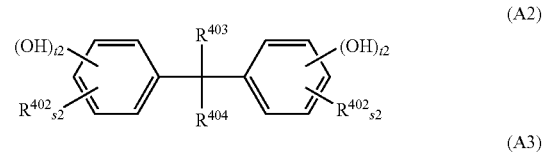
(A2)

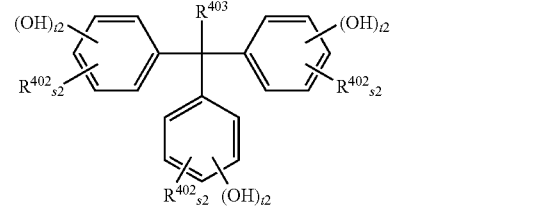
(A3)

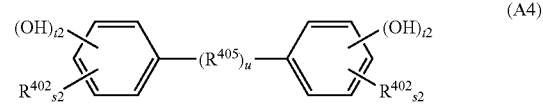
(A4)

(A5)

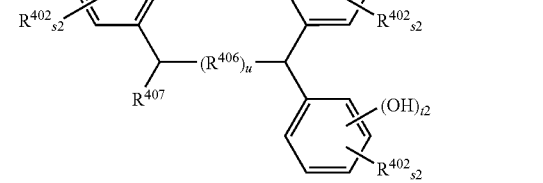
(A6)

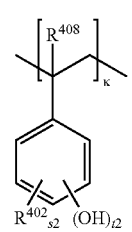

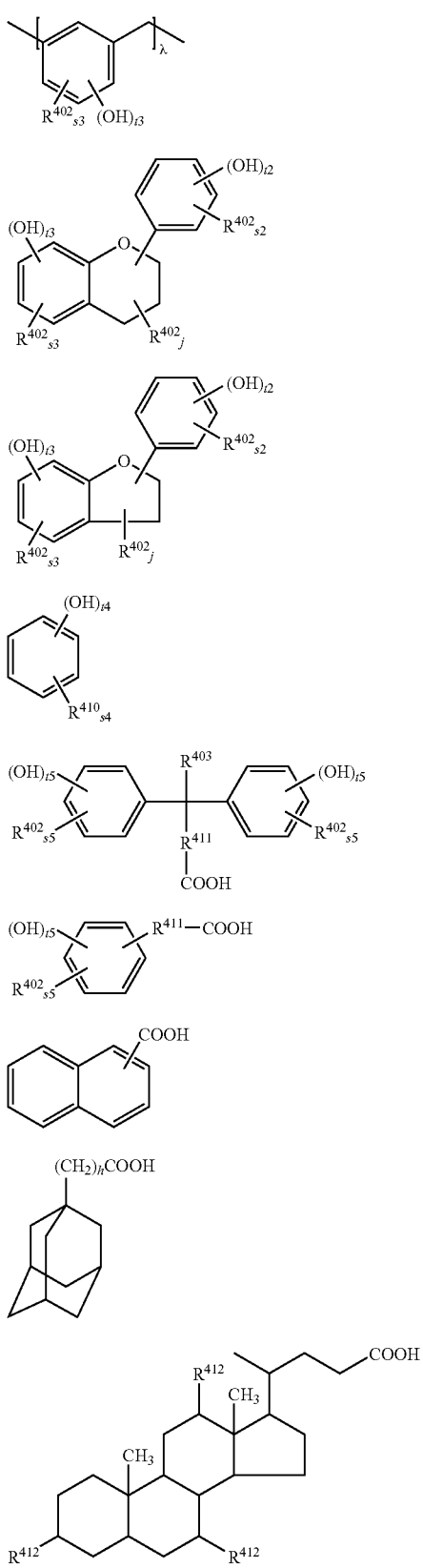

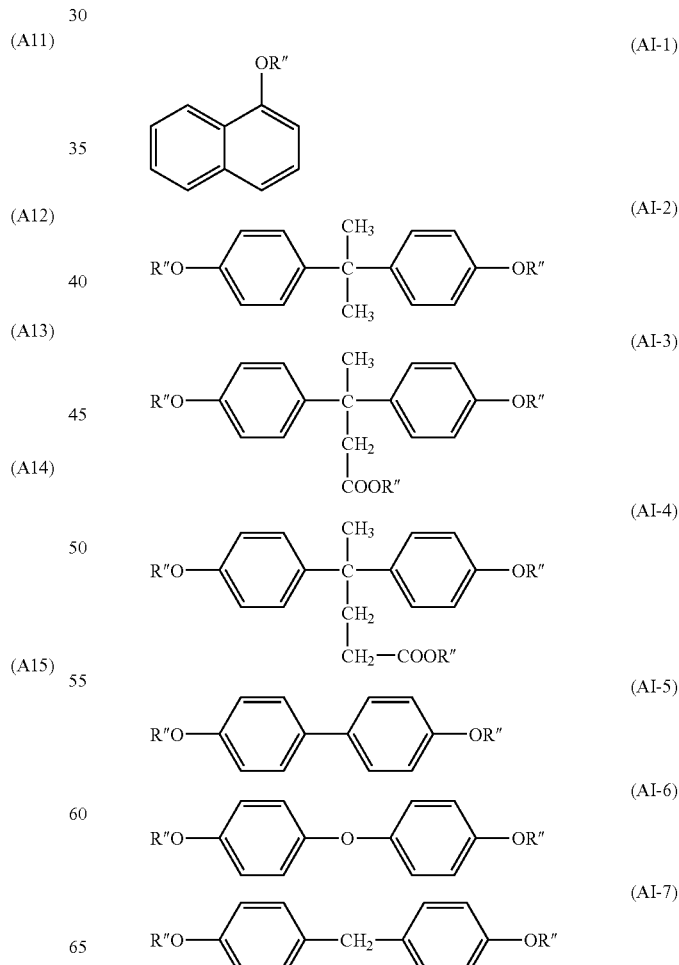

In these formulas, $R^{402}$ and $R^{403}$ are each hydrogen or a straight or branched $C_1$-$C_8$ alkyl or alkenyl. $R^{404}$ is hydrogen, a straight or branched $C_1$-$C_8$ alkyl or alkenyl, or a —$(R^{409})_{h1}$—COOR' group wherein R' is hydrogen or —$R^{409}$—COOH.

$R^{405}$ is —$(CH_2)_i$— (wherein i is 2 to 10), a $C_6$-$C_{10}$ arylene, carbonyl, sulfonyl, an oxygen atom, or a sulfur atom. $R^{406}$ is a $C_1$-$C_{10}$ alkylene, a $C_6$-$C_{10}$ arylene, carbonyl, sulfonyl, an oxygen atom, or a sulfur atom. $R^{407}$ is hydrogen, a straight or branched $C_1$-$C_8$ alkyl or alkenyl, or a hydroxyl-substituted phenyl or naphthyl. $R^{408}$ is hydrogen or methyl. $R^{409}$ is a straight or branched $C_1$-$C_{10}$ alkylene. $R^{410}$ is hydrogen, a straight or branched $C_1$-$C_8$ alkyl or alkenyl, or a —$R^{411}$—COOH group wherein $R^{411}$ is a straight or branched $C_1$-$C_{10}$ alkylene. $R^{412}$ is hydrogen or hydroxyl.

The letter j is a number from 0 to 3; s1, t1, s2, t2, s3, t3, s4, and t4 are each numbers which satisfy s1+t1=8, s2+t2=5, s3+t3=4, and s4+t4=6, and are such that each phenyl structure has at least one hydroxyl group; s5 and t5 are numbers which satisfy s5≧0, t5≧0, and s5+t5=5; u is a number from 1 to 4; h is a number from 0 to 4; κ is a number such that the compound of formula (A6) may have a weight average molecular weight of 1,000 to 5,000; and λ is a number such that the compound of formula (A7) may have a weight average molecular weight of 1,000 to 10,000.

Illustrative, non-limiting examples of the compound having a carboxyl group include compounds of the general formulas AI-1 to AI-14 and AII-1 to AII-10 below.

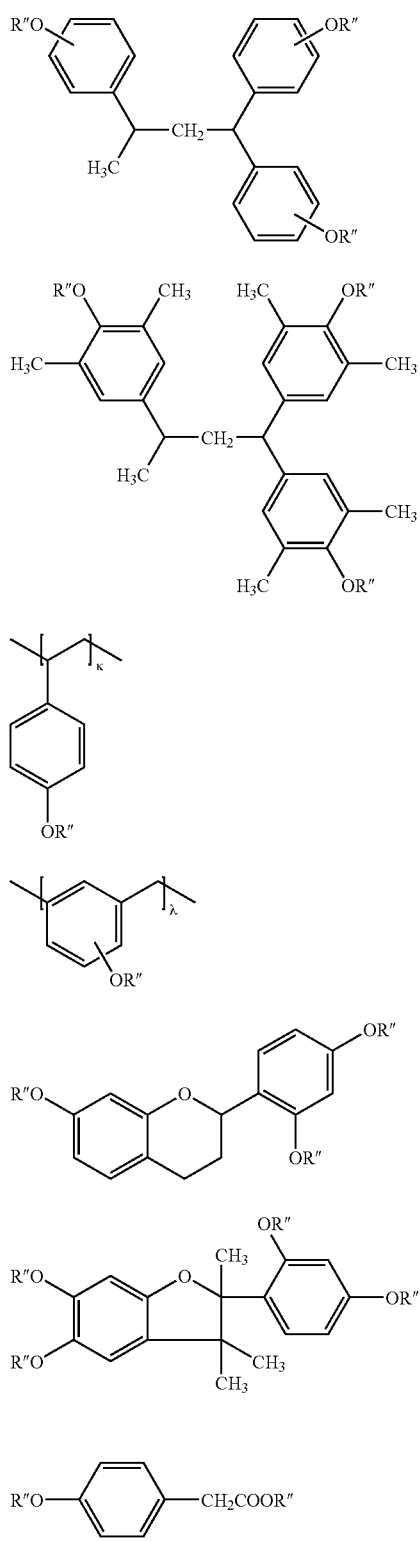
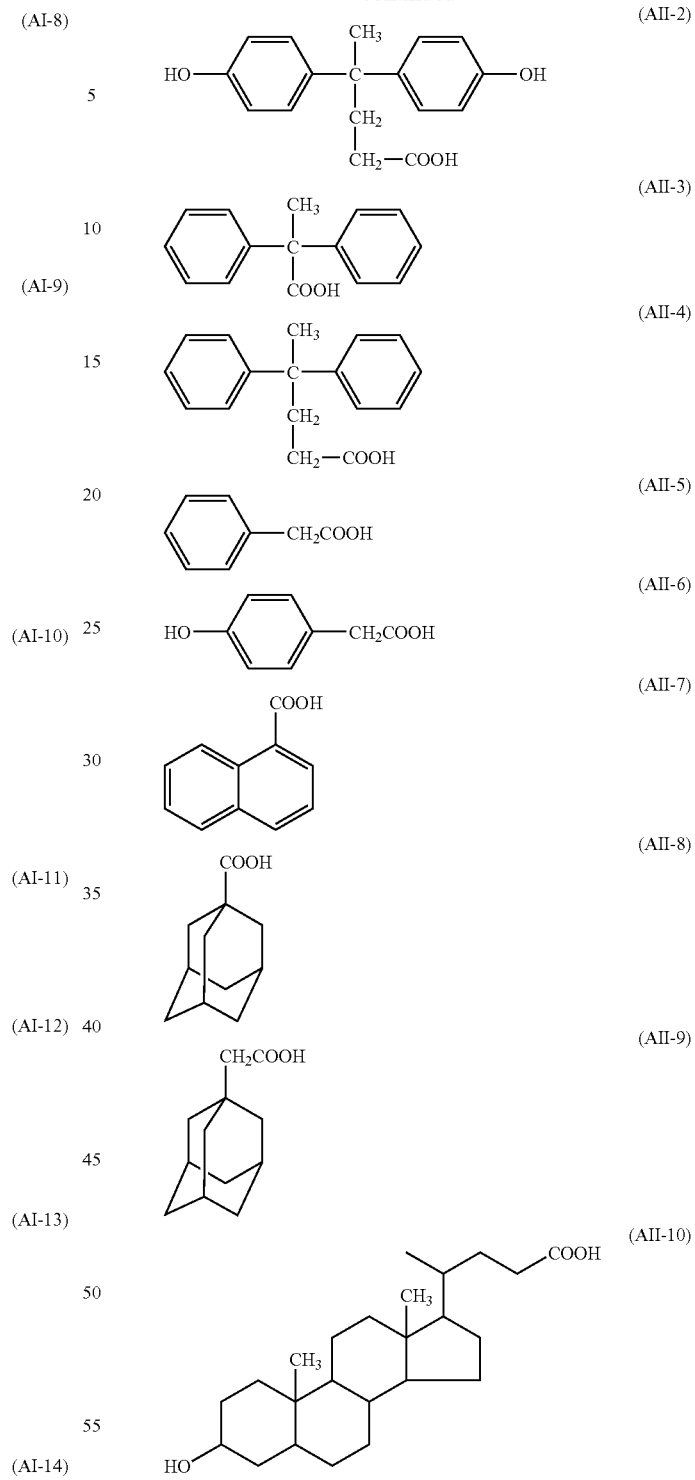

In the above formulas, R" is hydrogen or a —CH$_2$COOH group such that the —CH$_2$COOH group accounts for 10 to 100 mol % of R" in each compound, κ and λ are as defined above.

The compound having a ≡C—COOH group may be used singly or as combinations of two or more thereof. The compound having a ≡C—COOH group is added in an amount ranging from 0 to 5 parts, preferably 0.1 to 5 parts, more preferably 0.1 to 3 parts, further preferably 0.1 to 2 parts by weight, per 100 parts by weight of the base polymer (B). Up to 5 phr of the compound may have a minimal risk of reducing the resolution of the resist composition.

Preferred examples of the acetylene alcohol derivative which can be added to the resist composition include those having the general formula (S1) or (S2) below.

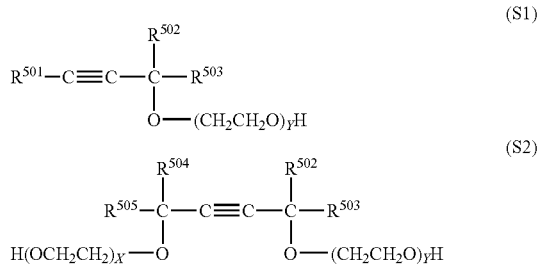

In the formulas, $R^{501}$, $R^{502}$, $R^{503}$, $R^{504}$, and $R^{505}$ are each hydrogen or a straight, branched or cyclic $C_1$-$C_8$ alkyl; and X and Y are each 0 or a positive number, satisfying $0 \leq X \leq 30$, $0 \leq Y \leq 30$, and $0 \leq X+Y \leq 40$.

Preferable examples of the acetylene alcohol derivative include Surfynol 61, Surfynol 82, Surfynol 104, Surfynol 104E, Surfynol 104H, Surfynol 104A, Surfynol TG, Surfynol PC, Surfynol 440, Surfynol 465, and Surfynol 485 from Air Products and Chemicals Inc., and Surfynol E1004 from Nisshin Chemical Industries Ltd.

The acetylene alcohol derivative is preferably added in an amount of 0.01 to 2%, and more preferably 0.02 to 1% by weight based on the resist composition. At least 0.01 wt % of the acetylene alcohol derivative is effective for improving the coating characteristics and shelf stability whereas up to 2 wt % may have little impact on the resolution of the resist composition.

The resist composition of the invention may include optional ingredients, for example, a surfactant which is commonly used for improving the coating characteristics. Optional ingredients may be added in conventional amounts so long as this does not compromise the objects of the invention.

Nonionic surfactants are preferred, examples of which include perfluoroalkylpolyoxyethylene ethanols, fluorinated alkyl esters, perfluoroalkylamine oxides, perfluoroalkyl EO-addition products, and fluorinated organosiloxane compounds. Useful surfactants are commercially available under the trade names Fluorad FC-430 and FC-431 from Sumitomo 3M, Ltd., Surflon S-141, S-145, KH-10, KH-20, KH-30 and KH-40 from Asahi Glass Co., Ltd., Unidyne DS-401, DS-403 and DS-451 from Daikin Industry Co., Ltd., Megaface F-8151 from Dai-Nippon Ink & Chemicals, Inc., and X-70-092 and X-70-093 from Shin-Etsu Chemical Co., Ltd. Preferred surfactants are Fluorad FC-430 from Sumitomo 3M, Ltd., KH-20 and KH-30 from Asahi Glass Co., Ltd., and X-70-093 from Shin-Etsu Chemical Co., Ltd.

Process

It is now described how to form patterns using the resist composition of the invention.

In forming a pattern from the resist composition of the invention, any well-known lithography may be employed. For example, the composition is applied onto a substrate, typically a silicon wafer by a suitable coating technique such as spin coating. The coating is prebaked on a hot plate at a temperature of 60 to 150° C. for 1 to 10 minutes, preferably 80 to 140° C. for 1 to 5 minutes, to form a resist film of 0.1 to 2.0 µm thick. In conjunction with spin coating, means for reducing the amount of the resist composition dispensed is proposed in JP-A 9-246173 wherein the substrate is wetted with the resist solvent or a solution miscible with the resist solvent before it is coated with the resist composition.

A patterning mask having the desired pattern is then placed over the resist film, and the film exposed through the mask to an electron beam or to high-energy radiation such as deep-UV, excimer laser or x-ray in a dose of 1 to 200 mJ/cm$^2$, and preferably 10 to 100 mJ/cm$^2$. The high-energy radiation used herein preferably has a wavelength in the range of 180 to 250 nm.

Light exposure may be done by conventional lithography or immersion lithography of providing a liquid, typically water between the photoresist film and the projection lens.

The immersion lithography involves prebaking a resist film and exposing the resist film to light through a projection lens, with deionized water or similar liquid interposed between the resist film and the projection lens. Since this allows projection lenses to be designed to a NA of 1.0 or higher, formation of finer patterns is possible. The immersion lithography is important for the ArF lithography to survive to the 45-nm node. The liquid used herein may be a liquid with a refractive index of at least 1 which is highly transparent at the exposure wavelength, typically deionized water or alkane.

The photoresist film formed from the resist composition of the invention has such barrier properties to water that it may inhibit resist components from being leached out in water and as a consequence, eliminate a need for a protective coating in immersion lithography and reduce the cost associated with protective coating formation or the like. The photoresist film has so high a receding contact angle with water that few liquid droplets may be left on the surface of the photoresist film after immersion lithography scanning, minimizing pattern formation failures induced by liquid droplets left on the film surface.

In another version of immersion lithography, a protective coating may be formed on top of the resist film. The resist protective coatings generally include solvent-strippable type and developer-soluble type coatings. A protective coating of the developer-soluble type is advantageous for process simplification in that it can be stripped during development of the photoresist film.

The resist protective coating used in the immersion lithography may be formed from a coating solution, for example, a solution of a polymer having 1,1,1,3,3,3-hexafluoro-2-propanol residues or carboxyl groups which is insoluble in water and soluble in an alkaline developer liquid, in a solvent selected from alcohols of at least 4 carbon atoms, ethers of 8 to 12 carbon atoms, and mixtures thereof.

The resist protective coating may be formed by spin coating a topcoat solution onto a prebaked photoresist film, and prebaking on a hot plate at 50 to 150° C. for 1 to 10 minutes, preferably at 70 to 140° C. for 1 to 5 minutes. Preferably the protective coating has a thickness in the range of 10 to 500 nm. As in the case of resist compositions, the amount of the protective coating composition dispensed in forming a protective coating by spin coating may be reduced by previously wetting the resist film surface with a suitable solvent and applying the protective coating composition thereto. The means of wetting the resist surface may be spin coating, vapor priming or the like, with the spin coating being often employed. The solvent used herein may be selected from the aforementioned higher alcohols, ether solvents and fluorochemical solvents in which the resist film is not dissolvable.

After exposure to high-energy radiation through a photomask, the resist film is post-exposure baked (PEB) on a hot plate at 60 to 150° C. for 1 to 5 minutes, and preferably at 80 to 140° C. for 1 to 3 minutes.

Where a resist protective coating is used, sometimes water is left on the protective coating prior to PEB. If PEB is performed in the presence of residual water, water can penetrate through the protective coating to suck up the acid in the resist during PEB, impeding pattern formation. To fully remove the water on the protective coating prior to PEB, the water on the protective coating should be dried or recovered by suitable means, for example, spin drying, purging the protective coating surface with dry air or nitrogen, or optimizing the shape of a water recovery nozzle on the relevant stage or a water recovery process. The use of a material having water repellency and water slip as the protective coating is also useful in water removal.

After exposure, development is carried out using as the developer an aqueous alkaline solution, such as a 0.1 to 5 wt %, preferably 2 to 3 wt %, aqueous solution of tetramethylammonium hydroxide (TMAH), this being done by a conventional method such as dip, puddle, or spray development for a period of 10 to 300 seconds, and preferably 0.5 to 2 minutes. A typical developer is a 2.38 wt % TMAH aqueous solution. These steps result in the formation of the desired pattern on the substrate. Where the resist protective coating composition used has alkaline solubility, the protective coating can be stripped at the same time as development.

Where the resist composition is used with mask blanks, novolac resins and hydroxystyrene are often used as the base resin. Those resins in which alkali soluble hydroxyl groups are substituted by acid labile groups are used for positive resists while these resins in combination with crosslinking agents are used for negative resists. Base polymers which can be used herein include copolymers of hydroxystyrene with one or more of a (meth)acrylic derivative, styrene, vinyl naphthalene, vinyl anthracene, vinyl pyrene, hydroxyvinyl naphthalene, hydroxyvinyl anthracene, indene, hydroxyindene, acenaphthylene, and norbornadiene.

Where polymer (A) or (A1) is used as an additive to a resist material for use with mask blanks, a resist solution is prepared by adding polymer (A) or (A1) to any one of the aforementioned base resins. The resist solution is coated on a mask blank substrate of $SiO_2$, Cr, CrO, CrN, MoSi or the like. By further forming a SOG film and an organic undercoat film between the photoresist and the blank substrate, there is provided a three-layer structure which is also acceptable herein. Once the resist coating is formed, the structure is exposed to EB in vacuum using an EB image-writing system. The exposure is followed by post-exposure baking (PEB) and development in an alkaline developer for 10 to 300 seconds.

Example

Examples of the invention are given below by way of illustration and not by way of limitation. The abbreviations used herein are GPC for gel permeation chromatography, NMR for nuclear magnetic resonance, Mw for weight average molecular weight, Mn for number average molecular weight, and Mw/Mn for molecular weight dispersity. Mw and Mn are determined by GPC versus polystyrene standards.

Polymer Synthesis Example

Monomers 1 to 12 used in Polymer Synthesis Examples are identified below by their structural formula.

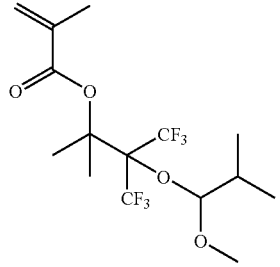

Monomer 1

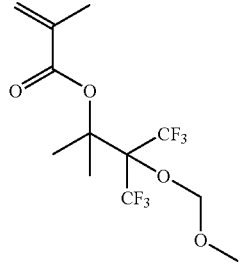

Monomer 2

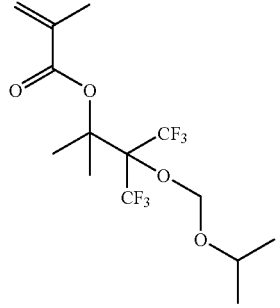

Monomer 3

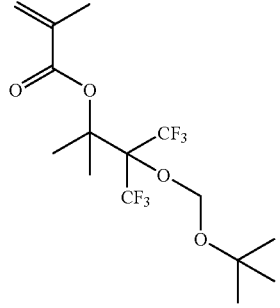

Monomer 4

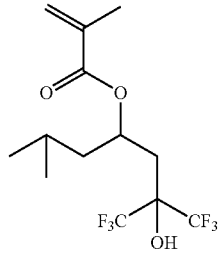

Monomer 5

Monomer 6

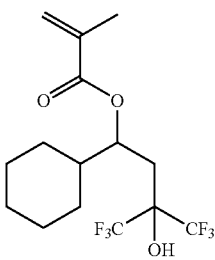

Monomer 7

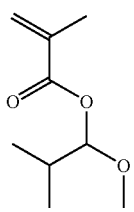

Monomer 8

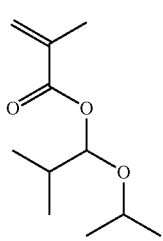

Monomer 9

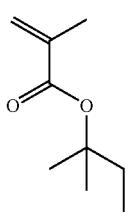

Monomer 10

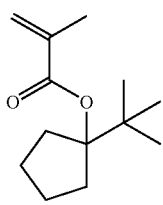

Monomer 11

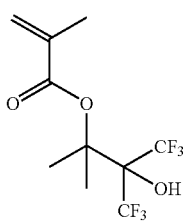

Monomer 12

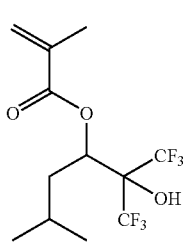

Polymer Synthesis Example 1

Copolymerization of Monomers 1 and 5 (50/50)

To a flask in a nitrogen blanket, 53.06 g of Monomer 1, 46.94 g of Monomer 5, 3.21 g of dimethyl 2.2'-azobis-(isobutyrate), and 100.0 g of methyl ethyl ketone were fed to form a monomer solution, which was kept at a temperature of 20-25° C. To another flask in a nitrogen blanket, 50.0 g of methyl ethyl ketone was fed. With stirring, it was heated to 80° C., to which the monomer solution was added dropwise over 4 hours. After the completion of dropwise addition, the polymerization solution was continuously stirred for a further 2 hours while keeping the temperature at 80° C. After the maturing, the solution was cooled to room temperature. Using an evaporator, the solvent was evaporated from the polymerization solution. The remaining white solids were dried in vacuum at 50° C. for 20 hours, obtaining 98.3 g of the target polymer, Polymer 1. The resin was analyzed for composition by $^1$H-NMR, finding that the copolymer consisted of Monomers 1 and 5 in a ratio of 50/50 mol %. The copolymer was also analyzed for molecular weight by GPC, finding Mw of 9,300 and Mw/Mn of 1.4.

Polymer Synthesis Examples 2 to 14

Like Polymer 1, Polymers 2 to 14 were synthesized in accordance with the formulation shown in Table 1 and analyzed by GPC. The results are shown in Table 1.

TABLE 1

| | | Copolymerization ratio (mol %) | | | | | | | | | | Molecular weight | |
|---|---|---|---|---|---|---|---|---|---|---|---|---|---|
| | | Monomer | | | | | | | | | | | Mw/ |
| | | 1 | 2 | 3 | 4 | 5 | 6 | 7 | 8 | 9 | 10 | Mw | Mn |
| Polymer | 1 | 50 | | | | 50 | | | | | | 9,300 | 1.4 |
| | 2 | | 50 | | | 50 | | | | | | 9,200 | 1.4 |
| | 3 | | | 50 | | 50 | | | | | | 9,000 | 1.4 |
| | 4 | | | | 50 | 50 | | | | | | 9,300 | 1.4 |
| | 5 | 50 | | | | | 50 | | | | | 9,100 | 1.4 |
| | 6 | 50 | | | | | | 50 | | | | 9,200 | 1.4 |
| | 7 | 50 | | | | | | | 50 | | | 9,200 | 1.4 |
| | 8 | 70 | | | | | | | | | 30 | 9,500 | 1.4 |
| | 9 | 70 | | | | | | | | | 30 | 9,100 | 1.4 |
| | 10 | | | | | 50 | 50 | | | | | 9,300 | 1.4 |
| | 11 | 50 | | | | 20 | 30 | | | | | 9,100 | 1.4 |
| | 12 | 50 | | | | 20 | | | 30 | | | 9,200 | 1.4 |
| | 13 | 50 | | | | 20 | | | | 30 | | 9,400 | 1.4 |
| | 14 | 50 | | | | 20 | | | | | 30 | 9,000 | 1.4 |

Polymer Synthesis Example 15

Copolymerization of Monomers 5 and 11 (50/50) and Post-Protection Reaction

To a flask in a nitrogen blanket, 53.44 g of Monomer 5, 46.66 g of Monomer 11, 3.65 g of dimethyl 2,2'-azobis-(isobutyrate), and 100.0 g of isopropyl alcohol were fed to form a monomer solution, which was kept at a temperature of 20-25° C. To another flask in a nitrogen blanket, 50.0 g of isopropyl alcohol was fed. With stirring, it was heated to 80° C., to which the monomer solution was added dropwise over 4 hours. After the completion of dropwise addition, the polymerization solution was continuously stirred for a further 3 hours while keeping the temperature at 80° C. After the maturing, the solution was cooled to room temperature. The polymerization solution was added dropwise to 2,000 g of water, after which the precipitated copolymer was filtered. The copolymer was washed four times with 600 g of a 9/1 mixture of hexane and isopropyl ether whereupon white solids were separated. The white solids were dried in vacuum at 50° C. for 20 hours, obtaining 90.8 g of a polymer consisting of Monomers 5 and 11 in a ratio of 50/50 mol %.

In a nitrogen atmosphere, 50 g of the polymer thus obtained was dissolved in 200 g of tetrahydrofuran. With the flask in an ice bath, 16.85 g of triethylamine and 20.42 g of 1-chloro-1-methoxy-2-methylpropane were added to the solution, and stirring continued for 10 hours at room temperature. 100 g of diisopropyl ether and 150 g of water were added to the solution. After stirring, the water layer was separated. The organic layer was concentrated and dried in vacuum, obtaining 48.1 g of the target polymer, Polymer 15. A percent protection of hydroxyl groups was analyzed by $^1$H-NMR, finding that 91% of the overall hydroxyl groups were substituted with 1-methoxy-2-methylpropyl groups. The copolymer was also analyzed for molecular weight by GPC, finding Mw of 9,000 and Mw/Mn of 1.5.

Comparative Polymer Synthesis Example 1

Copolymerization of Monomers 11 and 12 (20/80)

To a flask in a nitrogen blanket, 18.58 g of Monomer 11, 81.42 g of Monomer 12, 5.82 g of dimethyl 2,2'-azobis-(isobutyrate), and 100.0 g of isopropyl alcohol were fed to form a monomer solution, which was kept at a temperature of 20-25° C. To another flask in a nitrogen blanket, 50.0 g of isopropyl alcohol was fed. With stirring, it was heated to 80° C., to which the monomer solution was added dropwise over 4 hours. After the completion of dropwise addition, the polymerization solution was continuously stirred for a further 3 hours while keeping the temperature at 80° C. After the maturing, the solution was cooled to room temperature. The polymerization solution thus obtained was added dropwise to 2,000 g of water, after which the precipitated copolymer was filtered. The copolymer was washed four times with 600 g of a 9/1 solvent mixture of hexane and isopropyl ether whereupon white solids were isolated. The white solids were vacuum dried at 50° C. for 20 hours, obtaining 92.8 g of the target polymer, Comparative Polymer 1. The resin was analyzed for composition by $^1$H-NMR, finding that the copolymer consisted of Monomers 11 and 12 in a ratio of 22/78 mol %. The copolymer was also analyzed by GPC, finding Mw of 7,300 and Mw/Mn of 1.6.

Comparative Polymer Synthesis Example 2

Synthesis of Homopolymer of Monomer 11

A homopolymer of Monomer 11 (Comparative Polymer 2) was synthesized in accordance with the procedure of Comparative Polymer Synthesis Example 1. The copolymer was also analyzed by GPC, finding Mw of 7,900 and Mw/Mn of 1.6.

Evaluation of Resist Coating

Resist solutions were prepared by selecting a base polymer from Resist Polymers A, B and C and an additive polymer from Polymers 1 to 15 and Comparative Polymers 1 and 2, dissolving 5 g of the base polymer (see Table 2), 0.5 g of the additive polymer, 0.25 g of PAG1, and 0.05 g of Quencher 1 in 75 g of propylene glycol monomethyl ether acetate (PG-MEA), and filtering through a polypropylene filter having a pore size of 0.2 µm. Comparative resist solutions were prepared by dissolving 5 g of the base polymer, 0.25 g of PAG1, and 0.05 g of Quencher 1 in 75 g of PGMEA.

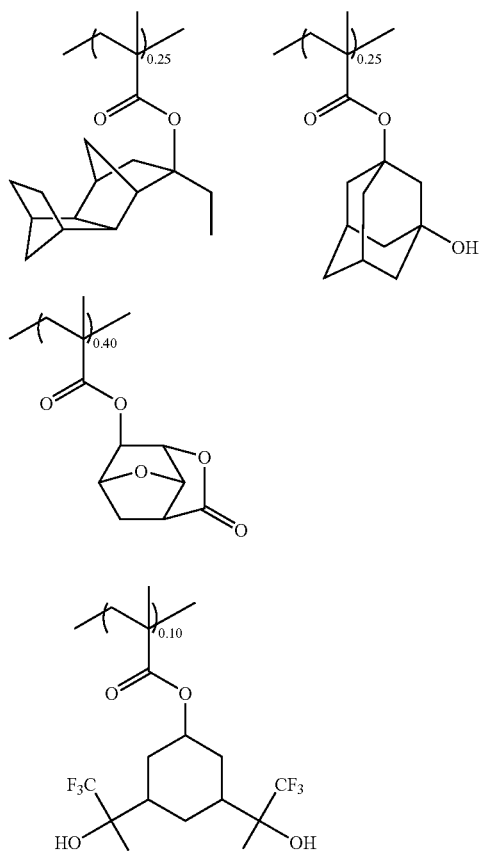

Resist Polymer A: Mw = 7,600; Mw/Mn = 1.8.

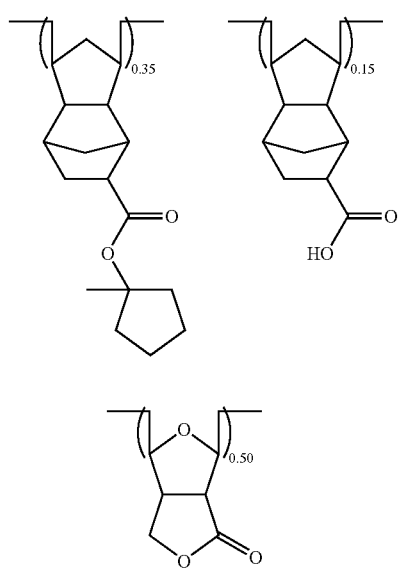

Resist Polymer B: Mw = 7,600; Mw/Mn = 1.8.

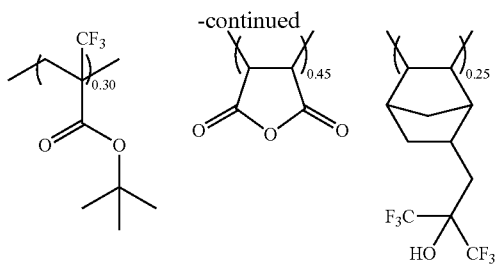

Resist Polymer C: Mw = 5,500; Mw/Mn = 1.6.

PAG 1

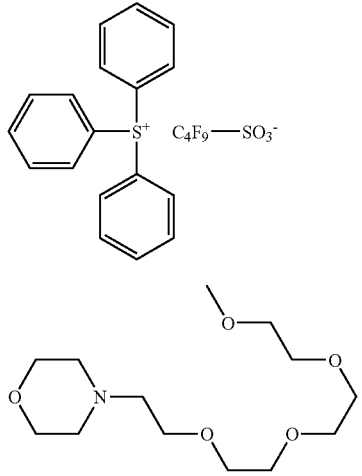

Quencher 1

An antireflective coating ARC-29A (Nissan Chemical Co., Ltd.) of 87 nm thick was formed on a silicon substrate, after which each resist solution was applied onto the ARC and baked at 120° C. for 60 seconds to form a resist film of 150 nm thick.

A contact angle with water of the resist film was measured, using an inclination contact angle meter prop Master 500 by Kyowa Interface Science Co., Ltd. Specifically, the wafer covered with the resist film was kept horizontal, and 50 µL of deionized water was dropped on the resist film to form a droplet. While the wafer was gradually inclined, the angle (sliding angle) at which the droplet started sliding down was determined as well as receding contact angle. The results are shown in Table 2.

TABLE 2

| Resist polymer (g) | | | Additive polymer | Sliding angle (°) | Receding contact angle (°) |
|---|---|---|---|---|---|
| A | B | C | | | |
| 5 | 0 | 0 | Polymer 1 | 6 | 91 |
| 5 | 0 | 0 | Polymer 2 | 12 | 84 |
| 5 | 0 | 0 | Polymer 3 | 7 | 90 |
| 5 | 0 | 0 | Polymer 4 | 5 | 92 |
| 5 | 0 | 0 | Polymer 5 | 8 | 88 |
| 5 | 0 | 0 | Polymer 6 | 5 | 95 |
| 5 | 0 | 0 | Polymer 7 | 4 | 90 |
| 5 | 0 | 0 | Polymer 8 | 6 | 93 |
| 5 | 0 | 0 | Polymer 9 | 9 | 90 |
| 5 | 0 | 0 | Polymer 10 | 10 | 86 |
| 5 | 0 | 0 | Polymer 11 | 8 | 88 |
| 5 | 0 | 0 | Polymer 12 | 10 | 88 |
| 5 | 0 | 0 | Polymer 13 | 12 | 82 |
| 5 | 0 | 0 | Polymer 14 | 13 | 81 |
| 5 | 0 | 0 | Polymer 15 | 7 | 90 |
| 2.5 | 2.5 | 0 | Polymer 1 | 7 | 90 |
| 2.5 | 2.5 | 0 | Polymer 2 | 12 | 85 |
| 2.5 | 2.5 | 0 | Polymer 3 | 8 | 91 |
| 2.5 | 2.5 | 0 | Polymer 4 | 7 | 93 |
| 2.5 | 2.5 | 0 | Polymer 5 | 8 | 88 |
| 2.5 | 2.5 | 0 | Polymer 6 | 6 | 94 |
| 2.5 | 2.5 | 0 | Polymer 7 | 6 | 91 |
| 2.5 | 2.5 | 0 | Polymer 8 | 6 | 93 |
| 2.5 | 2.5 | 0 | Polymer 9 | 9 | 90 |
| 2.5 | 2.5 | 0 | Polymer 10 | 10 | 87 |
| 2.5 | 2.5 | 0 | Polymer 11 | 9 | 88 |
| 2.5 | 2.5 | 0 | Polymer 12 | 10 | 88 |
| 2.5 | 2.5 | 0 | Polymer 13 | 12 | 83 |
| 2.5 | 2.5 | 0 | Polymer 14 | 13 | 82 |
| 2.5 | 2.5 | 0 | Polymer 15 | 8 | 91 |
| 0 | 0 | 5 | Polymer 1 | 7 | 88 |
| 0 | 0 | 5 | Polymer 2 | 12 | 81 |
| 0 | 0 | 5 | Polymer 3 | 9 | 87 |
| 0 | 0 | 5 | Polymer 4 | 7 | 89 |
| 0 | 0 | 5 | Polymer 5 | 9 | 85 |
| 0 | 0 | 5 | Polymer 6 | 6 | 90 |
| 0 | 0 | 5 | Polymer 7 | 6 | 87 |
| 0 | 0 | 5 | Polymer 8 | 7 | 90 |
| 0 | 0 | 5 | Polymer 9 | 10 | 87 |
| 0 | 0 | 5 | Polymer 10 | 11 | 83 |
| 0 | 0 | 5 | Polymer 11 | 10 | 85 |
| 0 | 0 | 5 | Polymer 12 | 12 | 85 |
| 0 | 0 | 5 | Polymer 13 | 13 | 80 |
| 0 | 0 | 5 | Polymer 14 | 14 | 79 |
| 0 | 0 | 5 | Polymer 15 | 8 | 87 |
| 5 | 0 | 0 | Comparative Polymer 1 | 20 | 75 |
| 5 | 0 | 0 | Comparative Polymer 2 | 21 | 65 |
| 5 | 0 | 0 | not added | 28 | 40 |
| 2.5 | 2.5 | 0 | not added | 26 | 53 |

A smaller sliding angle indicates an easier flow of water on the resist film. A larger receding contact angle indicates that fewer liquid droplets are left during high-speed scan exposure. It is demonstrated that the inclusion of the additive polymer of the invention in a resist solution achieves a drastic improvement in the receding contact angle of photoresist film without adversely affecting the sliding angle, as compared with those photoresist films free of the additive polymer.

Also, the resist film-bearing wafer (prepared above) was irradiated through an open frame at an energy dose of 50 mJ/cm$^2$ using an ArF scanner S305B (Nikon Corp.). Then a true circle ring of Teflon® having an inner diameter of 10 cm was placed on the resist film, 10 mL of deionized water was carefully injected inside the ring, and the resist film was kept in contact with water at room temperature for 60 seconds. Thereafter, the water was recovered, and a concentration of photoacid generator (PAG1) anion in the water was measured by an LC-MS analyzer (Agilent). The anion concentration measured indicates an amount of anions leached out for 60 seconds. The results are shown in Table 3.

TABLE 3

| Resist polymer (g) | | | Additive polymer | Anion leach-out (ppb) |
|---|---|---|---|---|
| A | B | C | | |
| 5 | 0 | 0 | Polymer 1 | 7 |
| 5 | 0 | 0 | Polymer 2 | 5 |
| 5 | 0 | 0 | Polymer 3 | 7 |
| 5 | 0 | 0 | Polymer 4 | 7 |
| 5 | 0 | 0 | Polymer 5 | 6 |
| 5 | 0 | 0 | Polymer 6 | 7 |
| 5 | 0 | 0 | Polymer 7 | 7 |

TABLE 3-continued

| Resist polymer (g) | | | Additive polymer | Anion leach-out (ppb) |
|---|---|---|---|---|
| A | B | C | | |
| 5 | 0 | 0 | Polymer 8 | 7 |
| 5 | 0 | 0 | Polymer 9 | 7 |
| 5 | 0 | 0 | Polymer 10 | 6 |
| 5 | 0 | 0 | Polymer 11 | 6 |
| 5 | 0 | 0 | Polymer 12 | 6 |
| 5 | 0 | 0 | Polymer 13 | 5 |
| 5 | 0 | 0 | Polymer 14 | 5 |
| 5 | 0 | 0 | Polymer 15 | 7 |
| 2.5 | 2.5 | 0 | Polymer 1 | 7 |
| 2.5 | 2.5 | 0 | Polymer 2 | 6 |
| 2.5 | 2.5 | 0 | Polymer 3 | 7 |
| 2.5 | 2.5 | 0 | Polymer 4 | 7 |
| 2.5 | 2.5 | 0 | Polymer 5 | 7 |
| 2.5 | 2.5 | 0 | Polymer 6 | 7 |
| 2.5 | 2.5 | 0 | Polymer 7 | 7 |
| 2.5 | 2.5 | 0 | Polymer 8 | 7 |
| 2.5 | 2.5 | 0 | Polymer 9 | 7 |
| 2.5 | 2.5 | 0 | Polymer 10 | 6 |
| 2.5 | 2.5 | 0 | Polymer 11 | 6 |
| 2.5 | 2.5 | 0 | Polymer 12 | 6 |
| 2.5 | 2.5 | 0 | Polymer 13 | 6 |
| 2.5 | 2.5 | 0 | Polymer 14 | 6 |
| 2.5 | 2.5 | 0 | Polymer 15 | 7 |
| 0 | 0 | 5 | Polymer 1 | 8 |
| 0 | 0 | 5 | Polymer 2 | 6 |
| 0 | 0 | 5 | Polymer 3 | 8 |
| 0 | 0 | 5 | Polymer 4 | 8 |
| 0 | 0 | 5 | Polymer 5 | 7 |
| 0 | 0 | 5 | Polymer 6 | 8 |
| 0 | 0 | 5 | Polymer 7 | 8 |
| 0 | 0 | 5 | Polymer 8 | 8 |
| 0 | 0 | 5 | Polymer 9 | 8 |
| 0 | 0 | 5 | Polymer 10 | 8 |
| 0 | 0 | 5 | Polymer 11 | 8 |
| 0 | 0 | 5 | Polymer 12 | 7 |
| 0 | 0 | 5 | Polymer 13 | 7 |
| 0 | 0 | 5 | Polymer 14 | 7 |
| 0 | 0 | 5 | Polymer 15 | 8 |
| 5 | 0 | 0 | Comparative Polymer 1 | 5 |
| 5 | 0 | 0 | Comparative Polymer 2 | 5 |
| 5 | 0 | 0 | not added | 60 |
| 2.5 | 2.5 | 0 | not added | 60 |

As is evident from Table 3, the photoresist films formed from the resist solutions having the additive polymers of the invention compounded therein are effective for preventing the PAG component from being leached out in water.

Further, the resist film-bearing wafer (prepared above) was exposed by means of an ArF scanner model S307E (Nikon Corp., NA 0.85, σ 0.93, 4/5 annular illumination, 6% halftone phase shift mask), rinsed for 5 minutes while splashing deionized water, post-exposure baked (PEB) at 110° C. for 60 seconds, and developed with a 2.38 wt % TMAH aqueous solution for 60 seconds, forming a 75-nm line-and-space pattern. The wafer was sectioned, and the profile and sensitivity of the 75-nm line-and-space pattern were evaluated. The results are shown in Table 4.

TABLE 4

| Resist polymer (g) | | | Additive polymer | Sensitivity (mJ/cm$^2$) | 75-nm pattern profile |
|---|---|---|---|---|---|
| A | B | C | | | |
| 5 | 0 | 0 | Polymer 1 | 34 | rectangular |
| 5 | 0 | 0 | Polymer 2 | 35 | rectangular |
| 5 | 0 | 0 | Polymer 3 | 33 | rectangular |
| 5 | 0 | 0 | Polymer 4 | 37 | rectangular |
| 5 | 0 | 0 | Polymer 5 | 32 | rectangular |
| 5 | 0 | 0 | Polymer 6 | 38 | rectangular |
| 5 | 0 | 0 | Polymer 7 | 39 | rectangular |
| 5 | 0 | 0 | Polymer 8 | 34 | rectangular |
| 5 | 0 | 0 | Polymer 9 | 33 | rectangular |
| 5 | 0 | 0 | Polymer 10 | 35 | rectangular |
| 5 | 0 | 0 | Polymer 11 | 38 | rectangular |
| 5 | 0 | 0 | Polymer 12 | 35 | rectangular |
| 5 | 0 | 0 | Polymer 13 | 34 | rectangular |
| 5 | 0 | 0 | Polymer 14 | 33 | rectangular |
| 5 | 0 | 0 | Polymer 15 | 36 | rectangular |
| 2.5 | 2.5 | 0 | Polymer 1 | 32 | rectangular |
| 2.5 | 2.5 | 0 | Polymer 2 | 32 | rectangular |
| 2.5 | 2.5 | 0 | Polymer 3 | 30 | rectangular |
| 2.5 | 2.5 | 0 | Polymer 4 | 34 | rectangular |
| 2.5 | 2.5 | 0 | Polymer 5 | 30 | rectangular |
| 2.5 | 2.5 | 0 | Polymer 6 | 35 | rectangular |
| 2.5 | 2.5 | 0 | Polymer 7 | 37 | rectangular |
| 2.5 | 2.5 | 0 | Polymer 8 | 32 | rectangular |
| 2.5 | 2.5 | 0 | Polymer 9 | 31 | rectangular |
| 2.5 | 2.5 | 0 | Polymer 10 | 32 | rectangular |
| 2.5 | 2.5 | 0 | Polymer 11 | 35 | rectangular |
| 2.5 | 2.5 | 0 | Polymer 12 | 32 | rectangular |
| 2.5 | 2.5 | 0 | Polymer 13 | 31 | rectangular |
| 2.5 | 2.5 | 0 | Polymer 14 | 31 | rectangular |
| 2.5 | 2.5 | 0 | Polymer 15 | 33 | rectangular |
| 0 | 0 | 5 | Polymer 1 | 32 | rectangular |
| 0 | 0 | 5 | Polymer 2 | 32 | rectangular |
| 0 | 0 | 5 | Polymer 3 | 30 | rectangular |
| 0 | 0 | 5 | Polymer 4 | 34 | rectangular |
| 0 | 0 | 5 | Polymer 5 | 30 | rectangular |
| 0 | 0 | 5 | Polymer 6 | 35 | rectangular |
| 0 | 0 | 5 | Polymer 7 | 37 | rectangular |
| 0 | 0 | 5 | Polymer 8 | 32 | rectangular |
| 0 | 0 | 5 | Polymer 9 | 31 | rectangular |
| 0 | 0 | 5 | Polymer 10 | 32 | rectangular |
| 0 | 0 | 5 | Polymer 11 | 35 | rectangular |
| 0 | 0 | 5 | Polymer 12 | 32 | rectangular |
| 0 | 0 | 5 | Polymer 13 | 31 | rectangular |
| 0 | 0 | 5 | Polymer 14 | 31 | rectangular |
| 0 | 0 | 5 | Polymer 15 | 33 | rectangular |
| 5 | 0 | 0 | Comparative Polymer 1 | 32 | rectangular |
| 5 | 0 | 0 | Comparative Polymer 2 | 31 | rectangular |
| 5 | 0 | 0 | not added | 45 | T-top |
| 2.5 | 2.5 | 0 | not added | 45 | T-top |

As seen from Table 4, when exposure is followed by water rinsing, the resist film having the additive polymer of the invention formulated therein formed a pattern of rectangular profile, in stark contrast with the resist film free of the additive polymer of the invention forming a pattern of T-top profile.

Japanese Patent Application No. 2008-032921 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist composition comprising (A1) a polymer comprising repeat units of the general formulae (1a), (2) and (3), (B) a polymer having a lactone ring and/or maleic anhydride-derived structure which becomes soluble in an alkaline developer under the action of an acid, (C) a compound capable of generating an acid upon exposure to high-energy radiation, and (D) an organic solvent, wherein the amount of polymer (A1) is 0.5 to 10 parts by weight per 100 parts by weight of polymer (B), (A1)

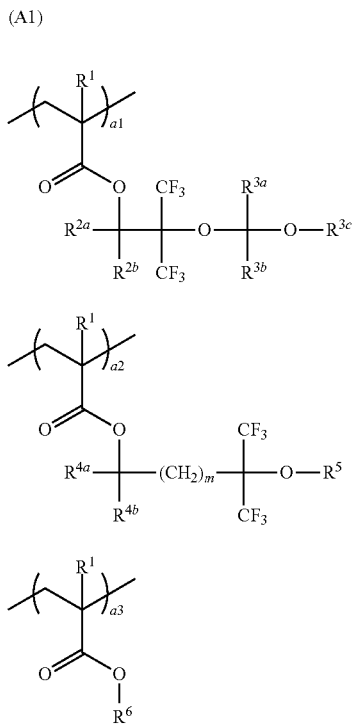

wherein $R^1$ is hydrogen, fluorine, or straight or branched $C_1$-$C_4$ alkyl or fluoroalkyl, $R^{2a}$ and $R^{2b}$ are hydrogen or straight, branched or cyclic $C_1$-$C_{10}$ alkyl, $R^{3a}$ and $R^{3b}$ are hydrogen or straight, branched or cyclic $C_1$-$C_6$ alkyl, $R^{3c}$ is straight, branched or cyclic $C_1$-$C_{10}$ alkyl, $R^{4a}$ and $R^{4b}$ are hydrogen or straight, branched or cyclic $C_1$-$C_{10}$ alkyl, $R^5$ is hydrogen, straight, branched or cyclic $C_1$-$C_{10}$ alkyl, or an acid labile group, $R^6$ is an acid labile group, $R^{2a}$ and $R^{2b}$, and $R^{4a}$ and $R^{4b}$ may bond together to form a non-aromatic ring of 1 to 20 carbon atoms with the carbon atom to which they are attached, m is an integer of 1 to 6, a1, a2 and a3 are numbers satisfying $0.4 \leq a1 \leq 0.9$, $0 \leq a2 \leq 0.6$, $0 \leq a3 \leq 0.6$, $0 < a2+a3 \leq 0.6$ and $0 < a1+a2+a3 \leq 1$.

2. The resist composition of claim 1, further comprising (E) a basic compound.

3. The resist composition of claim 1, further comprising (F) a dissolution inhibitor.

4. A pattern forming process comprising the steps of (1) applying the resist composition of claim 1 onto a substrate to form a resist coating, (2) heat treating the resist coating and exposing it to high-energy radiation through a photomask, and (3) developing the exposed coating with a developer.

5. The process of claim 4 wherein the high-energy radiation has a wavelength in the range of 180 to 250 nm.

6. A pattern forming process comprising the steps of (1) applying the resist composition of claim 1 onto a substrate to form a resist coating, (2) heat treating the resist coating and exposing it to high-energy radiation from a projection lens through a photomask while holding a liquid between the substrate and the projection lens, and (3) developing the exposed coating with a developer.

7. The process of claim 6 wherein the liquid is water.

8. A pattern forming process comprising the steps of (1) applying the resist composition of claim 1 onto a substrate to form a resist coating, (2) forming a protective coating onto the resist coating, (3) heat treating and exposing the coated substrate to high-energy radiation from a projection lens through a photomask while holding a liquid between the substrate and the projection lens, and (4) developing with a developer.

9. A pattern forming process comprising the steps of (1) applying the resist composition of claim 1 onto a mask blank to form a resist coating, (2) heat treating and exposing the resist coating in vacuum to electron beam, and (3) developing with a developer.

* * * * *